(12) United States Patent
Kurita

(10) Patent No.: US 8,263,484 B2
(45) Date of Patent: Sep. 11, 2012

(54) HIGH RESISTIVITY SILICON WAFER AND METHOD FOR MANUFACTURING THE SAME

(75) Inventor: Kazunari Kurita, Tokyo (JP)

(73) Assignee: Sumco Corporation, Tokyo (JP)

( * ) Notice: Subject to any disclaimer, the term of this patent is extended or adjusted under 35 U.S.C. 154(b) by 204 days.

(21) Appl. No.: 12/714,659

(22) Filed: Mar. 1, 2010

(65) Prior Publication Data

US 2010/0224968 A1    Sep. 9, 2010

(30) Foreign Application Priority Data

| Mar. 3, 2009 | (JP) | ................................. 2009-049908 |
| Jun. 19, 2009 | (JP) | ................................. 2009-146996 |
| Aug. 31, 2009 | (JP) | ................................. 2009-200420 |

(51) Int. Cl.
*H01L 21/425* (2006.01)
(52) U.S. Cl. ............... 438/530; 438/554; 257/E21.324
(58) Field of Classification Search .............. 438/141, 438/143, 249, 369, 511, 547, 548, 554, 914; 257/E21.147, E21.317, E21.466, E21.497
See application file for complete search history.

(56) References Cited

U.S. PATENT DOCUMENTS

| 2004/0005777 A1 | 1/2004 | Qu et al. |
| 2005/0127477 A1 | 6/2005 | Takase et al. |

FOREIGN PATENT DOCUMENTS

| EP | 1087041 | 3/2001 |
| JP | 2002-100631 | 4/2002 |
| JP | 3985768 | 5/2005 |
| WO | 00/55397 | 9/2000 |

*Primary Examiner* — Cheung Lee
(74) *Attorney, Agent, or Firm* — Greenblum & Bernstein, P.L.C.

(57) ABSTRACT

This method for manufacturing a high resistivity silicon wafer includes pulling a single crystal such that the single crystal has a p-type dopant concentration at which a wafer surface resistivity becomes in a range of 0.1 to 10 k Ωcm, an oxygen concentration Oi of $5.0 \times 10^{17}$ to $20 \times 10^{17}$ atoms/cm$^3$ (ASTM F-121, 1979), and a nitrogen concentration of $1.0 \times 10^{13}$ to $10 \times 10^{13}$ atoms/cm$^3$ (ASTM F-121, 1979) by using a Czochralski method, processing the single crystal into wafers by slicing the single crystal, and subjecting the wafer to an oxygen out-diffusion heat treatment process in a non-oxidizing atmosphere.

20 Claims, 19 Drawing Sheets

HIGH RESISTIVITY SILICON WAFER AND METHOD FOR MANUFACTURING THE SAME

BACKGROUND OF THE INVENTION

1. Field of the Invention

The present invention relates to a high resistivity silicon wafer used as a substrate for a high frequency integrated circuit device and the like, and a method for manufacturing the same.

This application claims priority on Japanese Patent Application No. 2009-049908 filed on Mar. 3, 2009, Japanese Patent Application No. 2009-146996 filed on Jun. 19, 2009, and Japanese Patent Application No. 2009-200420 filed on Aug. 31, 2009, the contents of which are incorporated herein by reference.

2. Description of the Related Art

With the widespread use or miniaturization of high-frequency devices and the increase in the number of signals for mobile communication, near-field wireless LAN and the like, there has been an increasing demand for high-frequency circuits. A high resistivity is required for high-frequency circuit substrates. For such applications, other than very expensive compound semiconductors such as GaAs, CMOSs (Complementary Metal Oxide Semiconductors) using substrates made of single crystals of silicon obtained by the normal Czochralski method (CZ method) have been adopted. Further, the Floating Zone method (FZ method) has difficulties in manufacturing large-diameter single crystals and has problems relating to stability of quality and cost, resulting in drawbacks of not allowing a sufficient response to demand.

The CMOSs using the CZ substrates have been considered inappropriate due to large power consumption and a high possibility of substrate noise generation. However, as an improvement of the miniaturization technique, designing and the like has been promoted, the use of silicon wafers with high resistivity has allowed the problems above to be overcome.

In accordance with the CZ method, single crystals of silicon are manufactured by melting a raw material using a quartz crucible and being pulled directly from the melt. The resistivity of high-purity silicon is found to be $2.3 \times 10^5$ Ωcm, and is controlled to the desired resistivity by adding a slight amount of dopant such as boron (B: p-type) or phosphorus (P: n-type) to the silicon. Single crystals of silicon obtained by the CZ method usually contain about 20 ppma ($16 \times 10^{18}$ atoms/cm³ [ASTM F-121, 1979]) of oxygen eluted from the quartz crucible.

Oxygen of a relatively high concentration contained in silicon causes defects in the silicon wafer resulting in faulty characteristics of devices; while oxygen performs desired functions in the device fabrication process, such as preventing of slip extension, increasing of wafer strength, preventing of deformation, and forming of minute defects in the wafer which serves as gettering sites for trapping incorporated heavy metal ions that cause faulty operations in the devices.

As is well known, the resistivity of silicon wafers can be increased by reducing the amount of dopant. However, in the use of single crystals of silicon obtained by the CZ method, inevitably incorporated oxygen may change the resistivity significantly. Oxygen atoms are usually electrically neutral in silicon, and therefore, oxygen atoms have no impact on the electrical resistance thereof directly.

When a heat treatment process is conducted at a low temperature of 300 to 500° C. for a long time of about one hour or more, compounds are formed that fail to be transformed into stable $SiO_2$ precipitates, and these compounds emit electrons showing characteristics similar to those of the donors. Therefore, the compounds are referred to as oxygen donors or thermal donors.

FIG. 1 is a view schematically illustrating the relationship between the number of thermal donors generated and the resistivity of wafers. In the case of low resistivity wafers with a normal resistivity of about 10 Ωcm, the amount of dopant is large enough in comparison with the number of thermal donors generated, whereby even if thermal donors are generated, the thermal donors have a minor impact on the resistivity. However, in the case of high resistivity wafers, the amount of dopant is small, whereby the resistivity is affected significantly by thermal donors. Particularly, in the case of p-type wafers, the conductivity caused by positive holes as acceptors lowers due to electron supply from donors; and thereby, the resistivity increases significantly and approaches infinity. Further, if the number of donors is increased and oxygen donor concentration exceeds acceptor concentration, conversion to n-type semiconductors occurs due to p/n type conversion, resulting in a reduction in resistivity. A heating process in the temperature range where thermal donors can be easily generated is necessarily performed as a heat treatment for an interconnection formation in the last stage of the device fabrication process.

The number of thermal donors generated is reduced in silicon wafers of which the oxygen concentration is lowered. Hence, there are proposed methods for manufacturing single crystals with low oxygen to reduce the oxygen content, such as applying the magnetic field applied Czochralski method (MCZ method) wherein single crystals are pulled from molten silicon liquid while applying a magnetic field thereto to control the flow, and the method wherein a quartz crucible is used, the inner surface of which is coated with SiC.

However, with regard to these methods for reducing oxygen content, there are technical limitations in oxygen reduction, causing an increase in cost. Furthermore, there is a problem in that the oxygen reduction causes a reduction in wafer strength, whereby defective products due to deformation may be easily produced in the device fabrication process.

An invention relating to a high resistivity wafer using a single crystal of silicon obtained by the CZ method and eliminating the influence of thermal donors and a method for manufacturing the same is disclosed in the brochure of International Patent Publication No. WO 00/55397. The invention is characterized in that a single crystal with a resistivity of 100 Ωcm or more, an initial interstitial oxygen (solid-solubilized oxygen) concentration of 10 to 25 ppma ($7.9 \times 10^{17}$ to $19.8 \times 10^{17}$ atoms/cm³ [ASTM F-121, 1979]), that is, normal oxygen content obtained by the CZ method is processed into wafers, and then an oxygen precipitate treatment is applied to the wafer to reduce the residual interstitial oxygen concentration to 8 ppma or less ($6.4 \times 10^{17}$ atoms/cm³ [ASTM F-121, 1979]).

However, it is described that the conditions of the heat treatment method for reducing the residual interstitial oxygen concentration to 8 ppma or less should not be restricted particularly because oxygen precipitates have only to be formed as a result and the residual interstitial oxygen concentration has only to be reduced to 8 ppma or less. In examples, there is only small extent of explanation demonstrating a two-step heat treatment including a heating at 800° C. for 4 hours in an oxygen or nitrogen atmosphere and a heating at 1000° C. for 16 hours in an oxygen atmosphere, and a three-step heat treatment including a heating at 650° C. for 2 hours in an oxygen atmosphere, a heating at 800° C. for 4 hours in the same atmosphere, and a heating at 1000° C. for 16 hours in an oxygen atmosphere. The ranges of the heat treatment conditions and the like are not clearly defined.

The DZ-IG (Denuded Zone-Intrinsic Gettering) treatment is generally employed as a method for controlling the state of being of oxygen in the wafer thickness direction on which devices are to be formed. This is a heat treatment adapted for preparing a region at or in the vicinity of the wafer surface where devices are to be formed, that is, an active region, as a Denuded Zone (DZ), and forming defects due to oxygen precipitates having a function of trapping heavy metal ions and the like, which are incorporated impurities, in the interior of the wafer.

Generally, a three-step heat treatment is to be performed, including (1) an oxygen out-diffusion heat treatment at the high temperature for forming a DZ in the surface region, (2) a low-temperature heat treatment for forming precipitate nuclei (heat treatment for forming oxygen precipitate nuclei), and (3) a middle or high-temperature heat treatment for forming defects due to oxygen precipitates serving as gettering sites in the interior of the wafer (heat treatment for growing oxygen precipitates).

Japanese Patent Application, Publication No. 2002-100631 discloses an invention relating to wafer processing conditions, in which the DZ-IG treatment is applied to a high resistivity wafer with a resistivity of 100 Ωcm or more. This invention is characterized, as with the invention described in the brochure of International Patent Publication No. WO 00/55397, in that obtaining a wafer where an interstitial oxygen concentration at any portion of the wafer is 8 ppm or less, a DZ layer is included at or in the vicinity of the surface and an oxygen precipitate layer is included in a bulk portion, and the width of the transition region between the DZ layer and the oxygen precipitate layer is 5 μm or less.

In a method for manufacturing a wafer according to the invention described in Japanese Patent Application, Publication No. 2002-100631, a wafer is used which is processed from a single crystal with an initial interstitial oxygen concentration of 10 to 25 ppma obtained by the CZ method, the wafer is subjected to a four-step heat treatment including (a) a first heat treatment at 950 to 1050° C. for 2 to 5 hours, (b) a second heat treatment at 450 to 550° C. for 4 to 5 hours, (c) a third heat treatment at 750 to 850° C. for 2 to 8 hours, and (d) a fourth heat treatment at 950 to 1100° C., so that the interstitial oxygen concentration is reduced to 8 ppm or less as described above.

In such a case, it would appear that the first heat treatment indicated by (a) is an oxygen out-diffusion treatment for forming the DZ layer and the fourth heat treatment indicated by (d) is an oxygen precipitate treatment for forming gettering sites. However, the heat treatments indicated by (b) and (c) are for performing treatments for forming precipitate nuclei sufficiently to reduce the interstitial oxygen concentration to 8 ppm or less without fault.

However, it is not necessarily easy to reduce the solid-solubilized oxygen concentration to 8 ppm or less across all portions in the wafer thickness direction by the heat treatments, and many steps of heat treatments are required, resulting in an increase in fabrication costs. In addition, reducing the solid-solubilized oxygen concentration results in a great reduction of wafer strength, whereby wafer deformation or slip dislocation may easily occur in a high-temperature heat treatment performed in the device fabrication process even if the number of oxygen donors may be reduced.

In Japanese Patent No. 3985768, the above problems are solved by doping carbon to increase the depth of a p/n type conversion region to about 8 μm from the wafer surface. However, in the carbon doping, if a carbon concentration is high, a Dislocation Free (DF) ratio is reduced due to the occurrence of polycrystallization, so that a single crystal may not be pulled. In this regard, a constant upper limit exists in the carbon concentration, and a wafer doped with carbon with a high concentration of the upper limit or more cannot be manufactured.

In addition, in a carbon-doped wafer, the depth range of an n-type region generated by the p/n type conversion is increased to only about 10 μm at a maximum from the wafer surface as disclosed in Japanese Patent No. 3985768 due to the upper limit of a carbon concentration range required for pulling a single crystal.

From the demand for an increase of range of application frequencies referred to as high frequency, corresponding to recent device design conditions, the demand for the reduction of power consumption, and the demand for the miniaturization as a design rule, there are demands for increasing the depth range of an n-type region generated by the p/n type conversion to 20 μm to 60 μm, expanding the range in which the p/n type conversion does not occur, and precisely performing position control at such a deep depth.

Further, in a voltage controlled oscillator and the like which is used for a transmission circuit and the like of a cell phone, as illustrated in FIG. 23, an eddy current VCO-E flows due to a magnetic field VCO-B generated when a current flows through a coil VCO-C of a digital area VCO-D. The eddy current VCO-E becomes a loss current VCO-d to an analog area VCO-A, resulting in reduction of efficiency η.

In light of such circumstances, it is an object of the present invention to provide a high resistivity p-type wafer using a single crystal obtained by a CZ method and having superior characteristics of preventing a CMOS formed on a surface active region from suffering from a faulty operation, n-well separation and the like. In addition, the present invention achieves the following purposes.

1. To enable the forming of a p/n type conversion region in a depth range exceeding 10 μm while maintaining a single crystal. Particularly, to enable the forming of the p/n type conversion region in a deeper depth range as compared with a conventional carbon-doped wafer; and thereby, reducing current loss.

2. To enable the controlling of a boundary depth in which p/n type conversion occurs.

3. In detail, to enable the controlling of the boundary depth at least in a range of 10 μm to 70 μm from the wafer surface.

4. To provide a wafer and a method for manufacturing the same, which can maintain a p type throughout the depth, that is, prevent the occurrence of p/n type conversion, in a high resistivity wafer.

SUMMARY OF THE INVENTION

After a CMOS is fabricated on high resistivity p type CZ wafers through a device fabrication process, the characteristics of the CMOS have been examined. As a result of the examination, there are some CMOS devices which do not have desired characteristics and CMOS devices which have degraded device characteristics due to insufficient separation of adjacent n-wells. As a result of various examinations for the high resistivity wafers having suffered from the problem, the followings have been revealed.

First, in wafers before devices are formed on the surface thereof, a DZ layer in a surface layer or oxygen precipitates which are referred to as internal BMD (Bulk Micro Defect) are distributed normally without any problems. However, when examining the wafers after CMOS devices are formed, there are some wafers of which the portion near the surface is p-type semiconductors and of which the inner portion has been converted to n-type semiconductors. Particularly, in the case in which a p/n type conversion region exists at or in the vicinity of the surface, there are some wafers having CMOS characteristics not reaching desired values or suffering from insufficient n-well separation.

It is presumed that internal conversion from p-type to n-type in wafers (p/n type conversion in the interior of the wafers) is caused by thermal donors generated by a heat treatment in the fabrication process for forming devices as illustrated in FIG. 1. However, in the case where the solid-solubilized oxygen concentration is decreased across all portions in the wafer depth direction so as to suppress the generation of thermal donors, it is necessary to conduct a heat treatment for a long time and a fabrication time is increased resulting in the degradation of productivity. In addition, there is a problem that the wafer strength may be reduced.

Moreover, such p/n type conversion phenomenon occasionally appears in a high resistivity wafer. However, even if the p/n type conversion occurs, if a p/n type conversion region is located at a sufficiently deep position, CMOS characteristics and n-well separation are not much affected. Therefore, if position control is performed such that the p/n type conversion region is formed at a deeper position and a region located at a shallow position as compared with the p/n type conversion region maintains a p-type, device characteristics are not affected. That is, if thermal donors are generated at a depth by which the operation of a CMOS formed in the surface is not affected, the wafer characteristics become satisfactory.

In other words, when n-wells are formed on a p-type wafer, a depletion layer is formed between the n-wells and a wafer substrate. Therefore, it is preferred to control the occurrence of the p/n type conversion such that the p/n type conversion region is sufficiently separated from the depletion layer. When a wafer has a high resistivity, a depletion layer region is large as compared with the case of a normal wafer having a low resistivity. In this regard, in the case of a high resistivity wafer applied to devices compatible with a high frequency band, it is necessary to sufficiently increase a depth of the generated p/n type conversion region from the surface.

FIG. 2 shows sectional views illustrating the relationship between the configuration of a CMOS formed on the above-described p-type wafer and a p/n conversion region. The CMOS shown in the figures has a twin-well structure in which p-wells and n-wells complement each other. The p-wells, the n-wells and the depletion layers 1 are formed in the substrate depth direction from the surface of a p-type wafer 3, which is converted to an n-type wafer 4 due to the generation of the p/n conversion region 2. In FIG. 2(a), since the p/n conversion region 2 is brought into contact with the depletion layer region, the n-wells are not separated sufficiently and predetermined characteristics cannot be obtained. Meanwhile, it is found that the CMOS characteristics and the n-well separation are less affected when the p/n conversion region 2 is generated at a sufficiently deep position as illustrated in FIG. 2(b).

Whether a conversion to n-type occurs or not is greatly affected by the amount of generated thermal donors and the amount of dopant into wafers. The amount of generated thermal donors can be estimated by the amount of oxygen, the heat treatment conditions for wafers, and the thermal history when forming devices. The amount of dopant is almost determined by the wafer resistivity, where a higher resistivity means a smaller amount of dopant.

Consequently, the possibility of occurrence of the conversion to n-type can be predicted when the above-described conditions are obtained. Therefore, it seems possible to prevent the occurrence of the conversion to n-type by selecting heat treatment conditions for wafers if the thermal history when forming devices is obtained. However, even if the conversion to n-type occurs, the conversion does not exert influence on the device performance as long as regions where devices are to be formed remain to be p-type and regions converted to n-type are located at a sufficiently deep position. Therefore, it is required to control the generation position (i.e., a depth from the surface) of the p/n conversion region rather than the occurrence of the conversion to n-type.

For the purpose of reducing defects in an active region of the surface, a high-temperature heat treatment is applied to wafers. When wafers are heated at a high temperature, out-diffusion of oxygen occurs, resulting in reduction of the oxygen concentration in the surface layer in many cases. Therefore, in the case of a treatment in the device fabrication process under conditions in which thermal donors are to be generated, even if inner portions of waters are converted to n-type, the region at or in the vicinity of the surface has a low oxygen concentration; and thereby, the region at or in the vicinity of the surface has small number of thermal donors and can remain p-type.

Thus, it is assumed that the reduction in oxygen concentration at or in the vicinity of the wafer surface determines the position of the p/n conversion region. Therefore, even if the p/n conversion occurs in wafers, the conversion region can be moved to a position where the operation of devices in the surface region is not affected by controlling the out-diffusion of oxygen due to the high-temperature heat treatment.

Hence, a high resistivity wafer was used and a heat treatment at 450° C. for one hour where thermal donors are most likely to be generated was selected from among conditions of a sintering process for the device fabrication. The high resistivity wafer was subjected to the heat treatment, and was examined through a spreading resistance measurement method to obtain a resistivity distribution in the depth direction. As a result, the depth position of the p/n conversion region by which the device characteristics are not affected is determined. Further, after applying various heat treatments such as an oxygen out-diffusion heat treatment to the wafer, the influence of the condition is examined.

Here, the boundary position of the p/n conversion region is defined as a depth position with a peak in the resistivity distribution in the depth direction based on actual measurement values. This is based on the following recognition. In the p/n conversion region, the electron supply from thermal donors does not exert influence on the p-type region which is a device region. That is, in the boundary of the p/n conversion region on the wafer surface side, the conductivity caused by positive holes due to acceptors in the p-type region disappears due to the supply of electrons from the donors. Logically, it is based on the recognition that a region where the resistivity is infinitely increased is in an n-type semiconductor state.

It is required that the boundary position of the p/n conversion region is located at a depth position so as not to be brought into contact with a region where devices in the surface region are to be formed and a depletion layer which is formed in contact with n-wells. When examining this depth position, it is preferred that the depth position is located at a depth of 10 μm or more from the surface, actually in a depth range of 20 μm to 50 μm.

However, in the case of a conventional wafer, the boundary position of the p/n conversion region cannot be located at a depth of about 10 μm or more. In addition, even if the initial oxygen concentration Oi, heat treatment conditions and the like are adjusted, the boundary position of the p/n conversion region cannot be located at a depth of 20 μm or more.

Further, in the case of a wafer doped with carbon of a high concentration, the carbon concentration cannot be increased to $5 \times 10^{17}$ atoms/cm$^3$ or more (ASTM F-123, 1981) since polycrystallization (DF breakage) occurs. Under such a carbon concentration, the p/n conversion region cannot be located at a depth of about 10 μm or more. In addition, even if the initial oxygen concentration Oi, heat treatment conditions and the like are adjusted, the boundary position of the p/n conversion region cannot be located at a depth of 20 μm or more.

However, the inventors has found that it is possible to solve the problems by doping a wafer with nitrogen or carbon in spite of a conventional knowledge that n-type conversion easily occurs due to the generation of donors referred to as new donors when doping a wafer with nitrogen or carbon.

That is, the boundary depth of the p/n conversion region can be set to a depth which cannot be realized in the related art, and a position (boundary depth) where the p/n conversion boundary is formed can be controlled by adjusting the concentration of nitrogen or carbon to be doped. Therefore, the p/n conversion region can be prevented from being formed at or in the vicinity of the surface which is shallower than the boundary depth.

In addition, a treatment is performed under the specific conditions to prevent the resistivity from being reduced in a deep position, which cannot be improved in the conventional CZ wafer. Consequently, it is possible to provide a high resistivity wafer in which the resistivity is uniformly distributed in the wafer depth direction or there exists no regions where the resistivity is reduced in the depth direction rather than the surface resistivity.

To achieve the above object, a first aspect of a method for manufacturing a high resistivity silicon wafer is provided where a depth range of a p/n type conversion occurrence region from a wafer surface can be adjusted, the method includes: pulling a single crystal such that the single crystal has a p-type dopant concentration at which the wafer surface resistivity becomes in a range of 0.1 to 10 k Ωcm, an oxygen concentration Oi of $5.0 \times 10^{17}$ to $20 \times 10^{17}$ atoms/cm$^3$ (ASTM F-121, 1979), and either one of a nitrogen concentration of $1.0 \times 10^{13}$ to $10 \times 10^{13}$ atoms/cm$^3$ (ASTM F-121, 1979) and a carbon concentration of $0.5 \times 10^{16}$ to $10 \times 10^{16}$ atoms/cm$^3$ (ASTM F-123, 1981) by using a Czochralski method; processing the single crystal into wafers by slicing the single crystal; and subjecting the wafer to an oxygen out-diffusion heat treatment process in a non-oxidizing atmosphere, wherein a peak position of a resistivity serving as the boundary between a p-type region of the wafer surface side and a p/n conversion region of an inner side of the thickness direction is adjusted by the nitrogen concentration or the carbon concentration such that the peak position is set to a boundary depth in a range of 10 to 70 μm from the wafer surface.

When the position of the p/n conversion region boundary represented by the peak position is controlled in the above-described depth range, the p/n conversion region boundary is almost uniformly formed over the in-plane direction in the wafer surface. Due to the same level of heat treatment time, high gettering ability can be obtained, and the wafer deformation and the occurrence of slip/crack can be prevented. In addition, as compared with a wafer having the same surface resistivity, it is possible to provide a wafer capable of being compatible with high-frequency devices.

Particularly, when nitrogen is doped with the above-described concentration, the position of the p/n conversion region boundary can be set to a depth position which cannot be realized in the conventional carbon-doped wafer. Therefore, due to the same level of heat treatment time, it is possible to realize superior characteristics such as achievement of high gettering ability and prevention of wafer deformation and slip/crack, as compared with the carbon-doped wafer. In addition, as compared with the carbon-doped wafer with the same surface resistivity, it is possible to provide a wafer capable of being compatible with high-frequency devices.

In the first aspect of the method for manufacturing the high resistivity silicon wafer according to the present invention, the method may further include a heat treatment process for forming oxygen precipitate nuclei and/or a heat treatment process for forming oxygen precipitates, after the oxygen out-diffusion heat treatment process.

Consequently, solid-solubilized oxygen can be fixed, and the influence of donors can be reduced by decreasing the oxygen concentration. Therefore, as compared with the conventional wafer, the p/n conversion region boundary can be formed at a deep position. Particularly, when nitrogen is doped with the above concentration, the position of the p/n conversion region boundary can be formed at a deeper depth position as compared with the conventional carbon-doped wafer.

A second aspect of a method for manufacturing a high resistivity silicon wafer is provided, where a p/n type conversion region is not generated and which includes a p-type region with variation in a resistivity distribution set to a range of 0 to 30% across all portions in the wafer thickness direction with respect to a reference value set to a range of 0.1 to 10 k Ωcm, the method includes: pulling a single crystal such that the single crystal has a p-type dopant concentration at which the wafer surface resistivity becomes in a range of 0.1 to 10 k Ωcm, an oxygen concentration Oi of $5.0 \times 10^{17}$ to $20 \times 10^{17}$ atoms/cm$^3$ (ASTM F-121, 1979), and either one of a nitrogen concentration of $1.0 \times 10^{13}$ to $10 \times 10^{13}$ atoms/cm$^3$ (ASTM F-121, 1979) and a carbon concentration of $0.5 \times 10^{16}$ to $10 \times 10^{16}$ atoms/cm$^3$ (ASTM F-123, 1981) by using a Czochralski method; processing the single crystal into wafers by slicing the single crystal; subjecting the wafer to an oxygen out-diffusion heat treatment process in a non-oxidizing atmosphere; and subjecting the wafer to a heat treatment process for forming oxygen precipitate nuclei and/or a heat treatment process for forming oxygen precipitates.

As a result, it is possible to realize a high resistivity silicon wafer where the p/n type conversion region is not generated. Particularly, when nitrogen is doped with the above concentration, it is possible to realize a high resistivity silicon wafer where the p/n type conversion region is not generated, which cannot be realized in the conventional carbon-doped wafer.

Further, the heat treatment process for forming oxygen precipitate nuclei and/or the heat treatment process for forming oxygen precipitates are performed, so that solid-solubilized oxygen can be fixed, and the influence of donors can be reduced by decreasing the oxygen concentration.

In the first and second aspects of the methods for manufacturing the high resistivity silicon wafer according to the present invention, the oxygen out-diffusion heat treatment process may be performed at a processing temperature of 1100 to 1250° C. for a processing time of 1 to 5 hours in an atmosphere of argon gas, hydrogen gas or a mixed gas thereof.

The oxygen out-diffusion heat treatment process may be conducted such that the p/n type conversion region due to occurrence of thermal donors is generated at a depth so as not to be brought into contact with either any device active region or any depletion layer region formed in contact therewith when a heat treatment in a device fabrication process is performed.

The heat treatment process for forming oxygen precipitate nuclei may be performed at a processing temperature of 600 to 800° C. for a processing time of 1 to 20 hours and the heat treatment process for forming oxygen precipitates may be performed at a processing temperature of 1000 to 1100° C. for a processing time of 1 to 20 hours.

A first aspect of a high resistivity silicon wafer is provided which is a p-type wafer having a resistivity of 100 Ωcm or more and having a denuded zone in a wafer surface, wherein the high resistivity silicon wafer is manufactured by the first or second aspect of the method for manufacturing the high resistivity silicon wafer according to the present invention and is doped with nitrogen or carbon, and when a heat treatment in a device fabrication process is performed, a p/n type conversion region due to occurrence of thermal donors is generated at a depth so as not to be brought into contact with either any device active region or any depletion layer region formed in contact therewith, or the p/n type conversion region is not generated.

As a result, it is possible to remove the influence of thermal donors and to provide a wafer capable of fabricating devices such as a CMOS having superior characteristics.

In the first aspect of the high resistivity silicon wafer according to the present invention, the p/n type conversion region may be generated in a depth range of 10 μm to 70 μm from the wafer surface.

As a result, the influence of thermal donors can be reduced more reliably.

Further, preferably, the boundary depth can be set to 15 to 60 μm, 20 to 50 μm, 30 to 45 μm, 35 to 55 μm, 25 to 40 μm, 40 to 65 μm and 45 to 70 μm.

The p/n type conversion region may include oxygen precipitates.

As a result, gettering ability can be obtained, and deformation and crack can be prevented.

An oxygen concentration in the wafer may be set to $1.0 \times 10^{13}$ to $10 \times 10^{13}$ atoms/cm$^3$ (ASTM F-121, 1979) or a carbon concentration may be set to $0.5 \times 10^{16}$ to $10 \times 10^{16}$ atoms/cm$^3$ (ASTM F-123, 1981).

Within this concentration range, in the case of a high concentration, the p/n type conversion region boundary can be set to a deep position. Further, in the case of a low concentration, the p/n type conversion region boundary can be set to a shallow position.

A second aspect of a high resistivity silicon wafer is provided which is a p-type wafer doped with nitrogen or carbon, wherein the high resistivity silicon wafer is subjected to a heat treatment at a processing temperature of 1100 to 1250° C. for a processing time of 1 to 5 hours in an atmosphere of argon gas, hydrogen or a mixed gas thereof, and the high resistivity silicon wafer includes a p-type surface region where a resistivity distribution in the depth direction from the wafer surface is about 0.1 to 10 k Ωcm, a peak region with a peak having a resistivity rising and falling in the depth direction, and a p/n type conversion depth region due to oxygen donors, and a peak position in the peak region is located in a depth range of 10 μm to 70 μm from a wafer surface.

A third aspect of a high resistivity silicon wafer is provided, which is a p-type wafer doped with nitrogen or carbon, wherein the high resistivity silicon wafer is subjected to a heat treatment at a processing temperature of 1100 to 1250° C. for a processing time of 1 to 5 hours and a heat treatment at a processing temperature of 1000 to 1100° C. for a processing time of 1 to 20 hours, in an atmosphere of argon gas, hydrogen or a mixed gas thereof, and variation in a resistivity distribution in the depth direction from the wafer surface is set to a range of 0 to 30% across all portions in a wafer thickness direction with respect to a reference value set to a range of 0.1 to 10 k Ωcm.

In the second and third aspects of the high resistivity silicon wafer according to the present invention, the high resistivity silicon wafer may be doped with nitrogen, and the density of oxygen precipitates generated when performing a heat treatment at 800° C. for 3 hours and a heat treatment at 1000° C. for 16 hours may be $2.0 \times 10^{10}$ to $4 \times 10^{10}$/cm$^3$ higher than the density of oxygen precipitates which are generated when performing a heat treatment under the above conditions on a wafer doped with carbon of $32 \times 10^{16}$ atoms/cm$^3$ (ASTM F-123, 1981) which is at a maximum concentration limit causing no polycrystallization (DF breakage).

A third aspect of a method for manufacturing a high resistivity silicon wafer is provided, which has a sufficient resistivity for reducing current loss occurring in a device region in which a voltage controller is to be formed in a radio transmission/reception circuit using a high frequency of 10 GHz to 100 GHz and having a power of about 10 mW to 100 mW, and where a depth range of a p/n type conversion occurrence region from a wafer surface can be adjusted, the method includes: pulling a single crystal such that the single crystal has a p-type dopant concentration at which a wafer surface resistivity becomes in a range of 0.1 to 10 k Ωcm, an oxygen concentration Oi of $5.0 \times 10^{17}$ to $20 \times 10^{17}$ atoms/cm$^3$ (ASTM F-121, 1979), and either one of a nitrogen concentration of $1.0 \times 10^{13}$ to $10 \times 10^{13}$ atoms/cm$^3$ (ASTM F-121, 1979) and a carbon concentration of $0.5 \times 10^{16}$ to $50 \times 10^{16}$ atoms/cm$^3$ (ASTM F-123, 1981) by using a Czochralski method; processing the single crystal into wafers by slicing the single crystal; and subjecting the wafer to an oxygen out-diffusion heat treatment process in a non-oxidizing atmosphere, wherein a peak position of a resistivity serving as the boundary between a p-type region of the wafer surface side and a p/n conversion region of an inner side of the thickness direction is adjusted by the nitrogen concentration or the carbon concentration such that the peak position is set to a boundary depth in a range of 10 to 70 μm from the wafer surface.

When the position of the p/n conversion region boundary represented by the peak position is controlled in the above-described depth range which is a depth position that cannot be realized in a carbon-doped wafer, the p/n conversion region boundary is almost uniformly formed over the in-plane direction in the wafer surface. Due to the same level of heat treatment time, high gettering ability can be obtained, and the wafer deformation and the occurrence of slip/crack can be prevented. In addition, as compared with a wafer with the same surface resistivity, it is possible to provide a wafer capable of being compatible with high-frequency devices and reducing current loss in terms of device characteristics.

In the third aspect of the method for manufacturing the high resistivity silicon wafer according to the present invention, the method may further comprise a heat treatment process for forming oxygen precipitate nuclei and/or a heat treatment process for forming oxygen precipitates, after the oxygen out-diffusion heat treatment process.

As a result, solid-solubilized oxygen can be fixed, and the influence of donors can be reduced by decreasing the oxygen concentration. Therefore, as compared with the conventional carbon-doped wafer, the p/n conversion region boundary can be formed at a deep position.

A fourth aspect of a method for manufacturing a high resistivity silicon wafer is provided, which has a sufficient resistivity for reducing current loss occurring in a device region in which a voltage controller is to be formed in a radio transmission/reception circuit using a high frequency of 10 GHz to 100 GHz and having a power of about 10 mW to 100 mW, where a p/n type conversion region is not generated, and which includes a p-type region with variation in a resistivity distribution set to a range of 0 to 30% across all portions in the wafer thickness direction with respect to a reference value set to a range of 0.1 to 10 k $\Omega$cm, the method includes: pulling a single crystal such that the single crystal has a p-type dopant concentration at which the wafer surface resistivity becomes in a range of 0.1 to 10 k $\Omega$cm, an oxygen concentration Oi of $5.0 \times 10^{17}$ to $20 \times 10^{17}$ atoms/cm$^3$ (ASTM F-121, 1979), and either one of a nitrogen concentration of $1.0 \times 10^{13}$ to $10 \times 10^{13}$ atoms/cm$^3$ (ASTM F-121, 1979) and a carbon concentration of $0.5 \times 10^{16}$ to $50 \times 10^{16}$ atoms/cm$^3$ (ASTM F-123, 1981) by using a Czochralski method; processing the single crystal into wafers by slicing the single crystal; subjecting the wafer to an oxygen out-diffusion heat treatment process in a non-oxidizing atmosphere; and subjecting the wafer to a heat treatment process for forming oxygen precipitate nuclei and/or a heat treatment process for forming oxygen precipitates.

As a result, it is possible to realize a high resistivity silicon wafer where the p/n type conversion region is not generated.

Further, the heat treatment process for forming oxygen precipitate nuclei and/or the heat treatment process for forming oxygen precipitates are performed, so that solid-solubilized oxygen can be fixed, and the influence of donors can be reduced by decreasing the oxygen concentration.

In the third and fourth aspects of the method for manufacturing the high resistivity silicon wafer according to the present invention, the oxygen out-diffusion heat treatment process may be performed at a processing temperature of 1100 to 1250° C. for a processing time of 1 to 5 hours in an atmosphere of argon gas, hydrogen gas or a mixed gas thereof.

The oxygen out-diffusion heat treatment process may be conducted such that the p/n type conversion region due to occurrence of thermal donors is generated at a depth so as not to be brought into contact with either any device active region or any depletion layer region formed in contact therewith when a heat treatment in a device fabrication process is performed.

The heat treatment process for forming oxygen precipitate nuclei may be performed at a processing temperature of 600 to 800° C. for a processing time of 1 to 20 hours and the heat treatment process for forming oxygen precipitates may be performed at a processing temperature of 1000 to 1100° C. for a processing time of 1 to 20 hours.

A fourth aspect of a high resistivity silicon wafer is provided which is a p-type wafer to be subjected to a device process for allowing a voltage controller in a radio transmission/reception circuit using a high frequency of 10 GHz to 100 GHz and having a power of about 10 mW to 100 mW to be formed on a surface, which has a resistivity of 100 $\Omega$cm or more, and where a denuded zone is formed in a wafer surface, wherein the high resistivity silicon wafer is manufactured by the third or fourth aspect of the method for manufacturing the high resistivity silicon wafer according to the present invention and is doped with nitrogen or carbon, and when a heat treatment in a device fabrication process is performed, a p/n type conversion region due to occurrence of thermal donors is generated at a depth so as not to be brought into contact with either any device active region or any depletion layer region formed in contact therewith, or the p/n type conversion region is not generated.

As a result, it is possible to remove the influence of thermal donors and to provide a wafer capable of fabricating devices such as a CMOS having superior characteristics.

In the fourth aspect of the high resistivity silicon wafer according to the present invention, the p/n type conversion region may be generated in a depth range of 10 µm to 70 µm from the wafer surface.

As a result, the influence of thermal donors can be reduced more reliably.

Further, preferably, the boundary depth can be set to 15 to 60 µm, 20 to 50 µm, 30 to 45 µm, 35 to 55 µm, 25 to 40 µm, 40 to 65 µm and 45 to 70 µm.

The p/n type conversion region may include oxygen precipitates.

As a result, gettering ability can be obtained, and deformation and crack can be prevented.

An oxygen concentration in the wafer may be set to $1.0 \times 10^{13}$ to $10 \times 10^{13}$ atoms/cm$^3$ (ASTM F-121, 1979) or a carbon concentration may be set to $0.5 \times 10^{16}$ to $50 \times 10^{16}$ atoms/cm$^3$ (ASTM F-123, 1981).

Within the concentration range, in the case of a high concentration, the p/n type conversion region boundary can be set to a deep position. Further, in the case of a low concentration, the p/n type conversion region boundary can be set to a shallow position.

A fifth aspect of a high resistivity silicon wafer is provided which is a p-type wafer doped with nitrogen or carbon, wherein the high resistivity silicon wafer is subjected to a heat treatment at a processing temperature of 1100 to 1250° C. for a processing time of 1 to 5 hours in an atmosphere of argon gas, hydrogen or a mixed gas thereof, the high resistivity silicon wafer includes a p-type surface region where a resistivity distribution in the depth direction from the wafer surface is about 0.1 to 10 k $\Omega$cm, a peak region with a peak having a resistivity rising and falling in the depth direction, and a p/n type conversion depth region due to oxygen donors, and a peak position in the peak region is located in a depth range of 10 µm to 70 µm from the wafer surface.

A sixth aspect of a high resistivity silicon wafer is provided which is a p-type wafer doped with nitrogen or carbon, wherein the high resistivity silicon wafer is subjected to a heat treatment at a processing temperature of 1100 to 1250° C. for a processing time of 1 to 5 hours and a heat treatment at a processing temperature of 1000 to 1100° C. for a processing time of 1 to 20 hours in an atmosphere of argon gas, hydrogen or a mixed gas thereof, and variation in a resistivity distribution in the depth direction from the wafer surface is set to a range of 0 to 30% across all portions in the wafer thickness direction with respect to a reference value set to a range of 0.1 to 10 k $\Omega$cm.

In the fifth and sixth aspects of the high resistivity silicon wafer according to the present invention, the high resistivity silicon wafer may be doped with nitrogen, and the density of oxygen precipitates generated when performing a heat treatment at 780° C. for 3 hours and a heat treatment at 1000° C. for 16 hours may be $2.0 \times 10^{10}$ to $4 \times 10^{10}$/cm$^3$ higher than the density of oxygen precipitates which are generated when performing a heat treatment under the above conditions on a wafer doped with carbon of $32 \times 10^{16}$ atoms/cm$^3$ (ASTM F-123, 1981) which is at a maximum concentration limit causing no polycrystallization (DF breakage).

Based on the above heat treatment condition, in the case of performing the oxygen out-diffusion heat treatment at a high temperature for one hour or more in a controlled atmosphere using argon, hydrogen or a mixed gas thereof, or another mixed gas of nitrogen with a small amount of oxygen, it is found that the position of the p/n conversion region can be located at a deep position in a limited time period. Although high temperature heating can realize the oxygen out-diffusion even in an oxygen atmosphere or an atmosphere containing oxygen, it seems that the partial pressure of oxygen at or in the vicinity of the surface can be reduced in a non-oxidizing or week oxidizing atmosphere, resulting in an increase in a release rate of oxygen. A high-temperature heat treatment in a non-oxidizing atmosphere has also an effect of eliminating defects at or in the vicinity of the surface such as COP (Crystal Originated Particle) defects, as with the so-called DZ treatment.

Further, the region used for forming devices thereon is restricted to a depth of about several μm from the wafer surface region. For this reason, it is recently often the case that other lower regions of wafers which are not used for forming devices thereon are removed by polishing and the like. In view of the situation above, it is not necessary to reduce the oxygen concentration across all portions of a wafer, and by conducting the oxygen out-diffusion heat treatment, the amount of oxygen in wafer surface region to be used for forming devices thereon can be reduced sufficiently and p-type regions with a high resistivity for forming devices can be ensured.

After reducing the amount of oxygen in the surface region by the out-diffusion, it is preferred to perform a low-temperature heating and a subsequent high-temperature heating, that is, an oxygen precipitate heat treatment. The oxygen precipitate heat treatment promotes oxygen precipitation, so that the amount of residual oxygen in the wafer is reduced, resulting in an increase in the resistivity. Further, the p/n type conversion region can be generated at a deeper position.

The oxygen precipitate heat treatment includes a heat treatment for forming oxygen precipitate nuclei by a low-temperature heating to re-form or grow nuclei for oxygen precipitation that have disappeared or shrunk due to a high-temperature heating for oxygen out-diffusion, and a heat treatment for growing oxygen precipitates by a high-temperature heating to further grow the nuclei to be oxygen precipitates.

For example, in the case of an oscillator for voltage control in a transmission/reception circuit of a wireless device such as a cell phone as illustrated in FIG. 23, depending on the type of devices, if the resistivity in a wafer is too low, the amount of current flowing through a region deeper than those used for devices increases; and thereby, energy loss or current noise is caused. As a result, device characteristics deteriorate drastically. For this reason, an increase in the resistivity in a region deeper than those used for devices may be required.

In such a case, in the case where the wafer is only subjected to the oxygen out-diffusion heat treatment, it is difficult to reduce the amount of oxygen in the interior of the wafer, that is, across all portions of the wafer, resulting inevitably in an increase in residual oxygen concentration in the interior of the wafer. To deal with this, it is preferred to perform the oxygen precipitate heat treatment after diffusing oxygen in the wafer surface region outward.

That is, in regard to problems such as energy loss or current noise due to a low resistivity in the wafer, since it is only required that an increase in the resistivity in the region deeper than those used for devices is achieved, and there seems no problems even if the conduction type is an n-type, it is effective to perform the oxygen precipitate heat treatment to increase the resistivity in the interior region converted to an n-type.

The present invention has been achieved by clarifying conditions for acquiring more desired conditions concerning DZ in the surface region, the generation position of the p/n type conversion region and the internal formation of BMD, that is, conditions for realizing a state with a low oxygen concentration and a high BMD density. Further, the present invention has been achieved by clarifying conditions for generating the p/n type conversion region at a deeper position or preventing the resistivity from being reduced in the depth direction without generating the p/n type conversion region.

In the case of doping nitrogen, the present invention has been achieved by clarifying conditions for realizing a state with a low oxygen concentration as compared with the conventional carbon-doped wafer and realizing a high BMD density as compared with the conventional carbon-doped wafer.

In addition, the present invention can be applied to a wafer supplied to the fabrication of devices compatible with a high frequency.

The present invention provides a high resistivity silicon wafer which is optimal for the fabrication of devices such as an oscillator for voltage control in a transmission/reception circuit of a wireless device such as a high frequency diode or a cell phone, the high resistivity silicon wafer can ensure density of oxygen precipitation-induced defects necessary for gettering while effectively preventing the occurrence of oxygen donors in the device heat treatment process, and has a sufficient mechanical strength. Further, the present invention provides a high resistivity silicon wafer capable of reducing power loss in terms of device characteristics.

Furthermore, the present invention provides a method for manufacturing a high resistivity silicon wafer, where a heat treatment time is short, heavy metal contamination of a silicon wafer in a heat treatment furnace does not easily occur, and the above-described silicon wafer can be manufactured with a high quality and a low cost.

In addition, the present invention provides a silicon wafer which is adapted for an oscillator for voltage control in a transmission/reception circuit of a wireless device such as a high frequency diode or a cell phone, which is low-priced, has a sufficiently high resistivity of a high specific-resistance layer, and has a small noise.

Moreover, according to the production method of the present invention, after growing a high resistivity CZ crystal, a heat treatment process to be applied to a processed wafer can be reduced, so that economic efficiency is high and oxygen donors can be effectively prevented from being generated in the device heat treatment process. Further, in the high resistivity silicon wafer of the present invention, oxygen precipitate-induced defects (oxygen precipitate nuclei or oxygen precipitates) formed in a bulk serve as a recombination center; and therefore, it is not necessary to form a recombination center, and gettering ability and mechanical strength of a wafer are improved. Consequently, it is possible to fabricate a low-priced high frequency diode with a high efficiency and a controllable lifetime.

According to the high resistivity silicon wafer of the present invention, there occurs no problems such as faulty characteristics or n-well separation failure when devices such as CMOS are formed on the surface. In the high resistivity silicon wafer, the above-described problems frequently occur due to the influence of thermal donors. In order to prevent the generation of the thermal donors, solid-solubilized oxygen concentration in the wafer is reduced as much as possible.

However, since the reduction in solid-solubilized oxygen causes the reduction in wafer strength, trouble due to deformation in the device fabrication process may occur. Further, in the case where solid-solubilized oxygen concentration in the wafer is reduced through a heat treatment, a lot of man-hour is required. Compared with this, in the high resistivity silicon wafer of the present invention, the above-described problems do not occur because solid-solubilized oxygen concentration in the wafer is not reduced. In addition, when various heat treatments in the device fabrication process are performed, it is possible to fabricate devices such as a CMOS having superior characteristics by removing the influence of thermal donors. Moreover, according to the present invention, the depth of the generation position of the p/n type conversion region can be controlled and the p/n type conversion region can be located at a deep position.

In addition, the present invention can provide a high resistivity silicon wafer capable of reducing power loss. Such a high resistivity silicon wafer is adapted for devices such as an oscillator for voltage control in a transmission/reception circuit of a wireless device such as a cell phone.

DETAILED DESCRIPTION OF THE INVENTION

Hereinafter, a silicon wafer and a method for manufacturing the same according to embodiments of the present invention will be described with reference to the accompanying drawings.

First Embodiment

A silicon wafer of the present embodiment is a p-type wafer where a denuded zone is formed at or in the vicinity of the surface thereof, and is manufactured by the following production method so as to control a depth range from a surface in which p/n type conversion occurs.

The production method includes pulling a single crystal such that the single crystal has a dopant concentration at which the wafer surface resistivity becomes in a range of 0.1 to 10 k$\Omega$cm, a nitrogen concentration of $1.0 \times 10^{13}$ to $10 \times 10^{13}$ atoms/cm$^3$ (ASTM F-121, 1979) and an oxygen concentration Oi of $5.0\times10^{17}$ to $20\times10^{17}$ atoms/cm$^3$ (ASTM F-121, 1979) by using a Czochralski method, processing the single crystal into wafers by slicing the single crystal, and subjecting the wafer to an oxygen out-diffusion heat treatment process in a non-oxidizing atmosphere.

Figure 1:
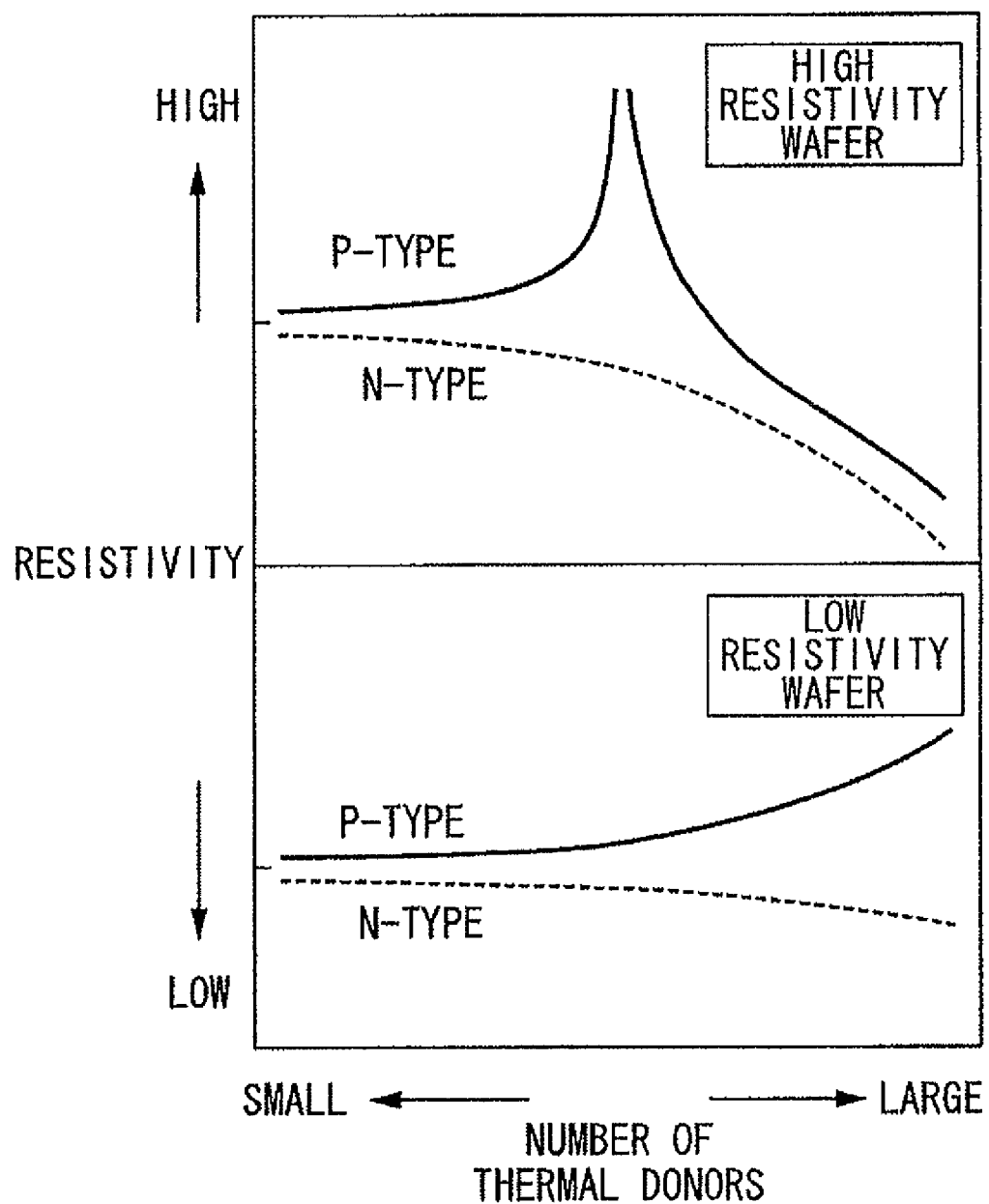
FIG. 1 is a diagram illustrating the relationship between the number of thermal donors generated and the resistivity in a silicon wafer.
Figure 2:
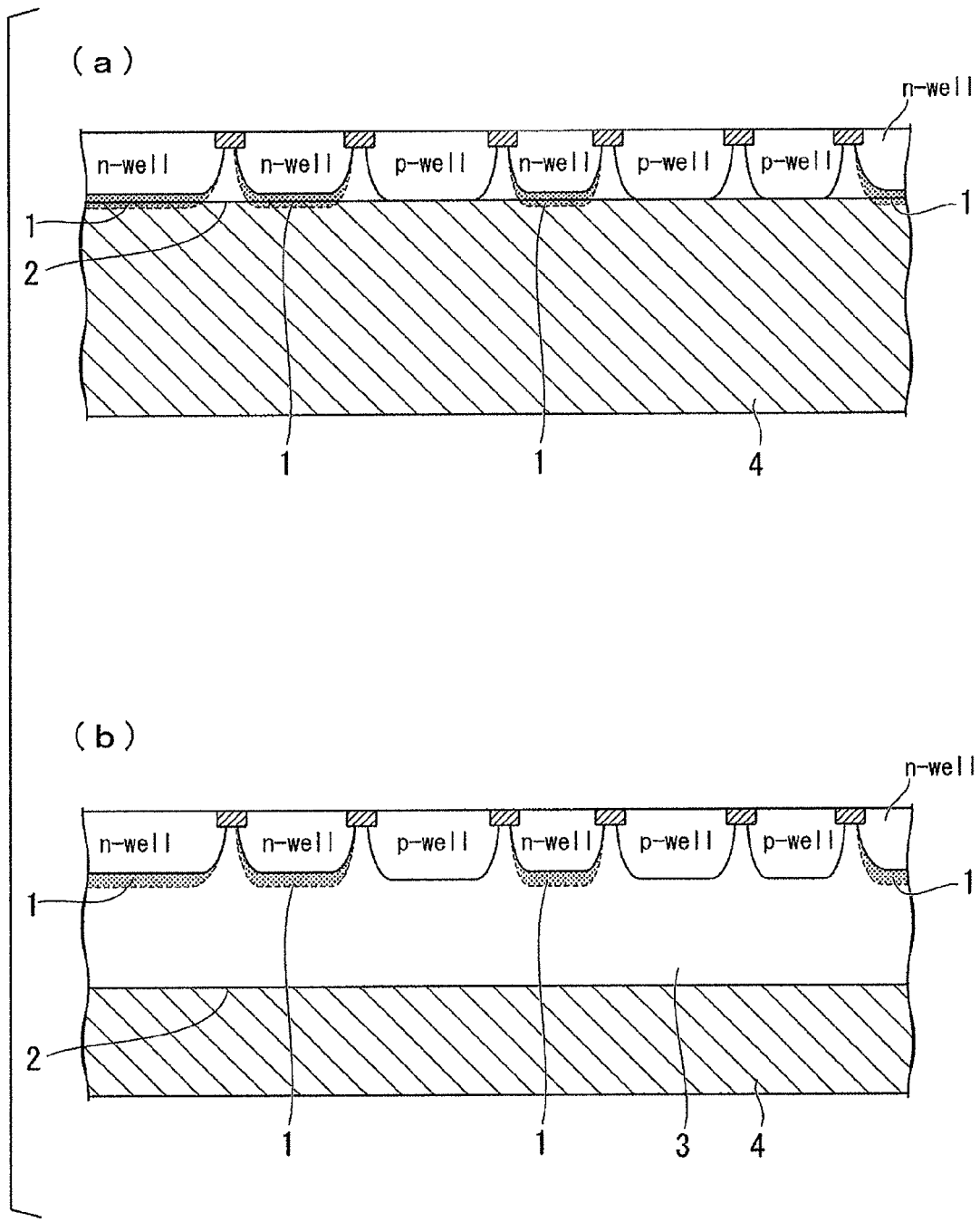
FIGS. 2A and 2B are sectional views illustrating the relationship between the configuration of a CMOS formed on a p-type wafer and a p/n conversion region.
Figure 3:
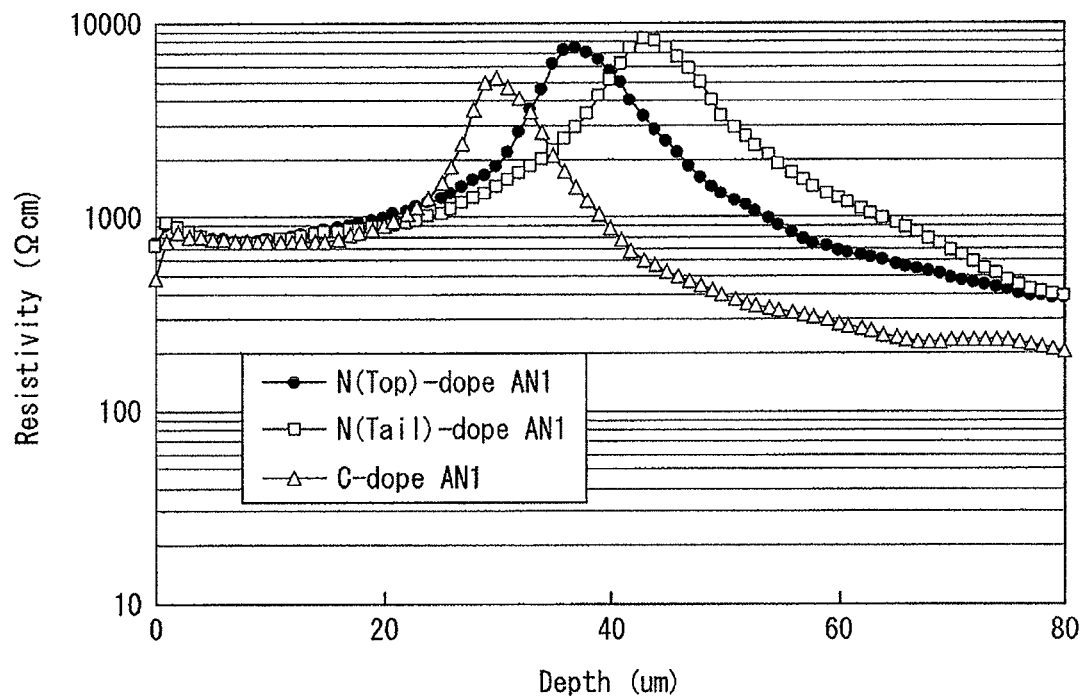
FIG. 3 is a graph illustrating a resistivity distribution in a wafer depth direction after an annealing process according to example 1 of a method for manufacturing a silicon wafer of the present invention.

Since the silicon wafer is manufactured by the above-described production method, when a heat treatment in a device fabrication process is performed, a resistivity distribution in the depth direction is obtained as illustrated in FIG. 3. As illustrated in FIG. 3, a peak position of a resistivity serving as the boundary between a p-type region of the wafer surface side and a p/n conversion region of an inner side of the thickness direction is set by the nitrogen concentration such that the peak position is located at a boundary depth in a range of 10 to 70 μm from the wafer surface.

Thus, when various heat treatments in the device fabrication process are performed, the p/n type conversion region due to occurrence of thermal donors is generated at a depth apart from a device active region and a depletion layer region formed in contact therewith.

In the silicon wafer of the present embodiment, no p/n type conversion region due to thermal donors is generated in a range from the boundary depth in the range of 10 to 70 μm to the wafer surface. Thus, the p/n type conversion region can be generated at the depth apart from the device active region and the depletion layer region formed in contact therewith.

The reason for setting the resistivity to 0.1 to 10 kΩcm is as follows.

If a frequency used in devices is high, and particularly exceeds 2.5 GHz or a target value is equal to or more than about 60 GHz, noise generation or signal attenuation markedly occurs in conventional low resistivity substrates with a resistivity of 10 Ωcm or less. However, the influence of the occurrence can be reduced in high resistivity ones.

In low resistivity p-type wafers with a low resistivity of less than 100 Ωcm, since dopant exists sufficiently, n-type conversion does not occur easily.

Further, if the silicon wafer with a resistivity of 600 to 1000 Ωcm according to the present embodiment is used, the resistivity of a high specific-resistance layer is significantly high; and therefore, it is possible to fabricate a high-quality high-frequency diode in which noises are significantly reduced.

According to the present embodiment, when n-type conversion is generated due to the occurrence of thermal donors in the heat treatment of the device fabrication process using a wafer, the p/n type conversion region due to occurrence of thermal donors is located at the depth apart from the device active region and the depletion layer region formed in contact therewith. Compared with this, if the p/n type conversion region is brought into contact with these regions, it impacts on devices formed on a surface region, resulting in faulty characteristics of the devices and insufficient n-well separation. According to the present embodiment, the above problems do not occur.

The p/n type conversion region is required to be generated at the depth apart from the device active region and the depletion layer region formed in contact therewith. For example, if the p/n type conversion region is generated at a position lower than setting values of the boundary depth in the range of 10 to 70 μm, it impacts on the devices formed in the surface portion. The setting values include 10 μm, 15 μm, 20 μm, 25 μm, 30 μm, 35 μm, 40 μm, 45 μm, 50 μm, 55 μm, 60 μm and 65 μm. The fact that the p/n type conversion region is located at a depth exceeding the boundary depth from the surface represents that an n-type conversion region is located at an inner side of the depth exceeding the boundary depth although n-type conversion has occurred in the heat treatment of the device fabrication process.

The heat treatment of the device fabrication process, for example, can be represented by conditions in which thermal donors are most easily generated such as a 1-hour heating at 450° C. or a 30-minute heating at 650° C.

As illustrated in FIG. 3, the position of the p/n type conversion region can be detected by measuring a resistivity distribution in the wafer depth direction through a spreading resistance measurement method and detected in a depth at which the resistivity is at a maximum.

Preferably, the oxygen concentration in the wafer is not particularly limited as long as being included within the range that is included in single crystals of silicon manufactured by the normal CZ method. It is however preferred that oxygen in the interior of the wafer exist as oxygen precipitates for forming Bulk Micro Defects (BMD) having gettering effects, and a heat treatment for forming such oxygen precipitates is performed.

In addition, nitrogen is electrically neutral and has effects such as promoting the formation of oxygen precipitates having the gettering effects and keeping wafer strength when the concentration of interstitial oxygen (solid-solubilized oxygen) is reduced due to the heat treatment resulting in the reduction in the wafer strength. Therefore, nitrogen may be contained within the range of $1.0\times10^{13}$ to $10\times10^{13}$ atoms/cm$^3$ (ASTM F-121, 1979). In the case of a content of less than $1.0\times10^{13}$ atoms/cm$^3$ (ASTM F-121, 1979), the effects may not be exerted sufficiently, while in the case of more than $10\times10^{13}$ atoms/cm$^3$ (ASTM F-121, 1979), polycrystallization may easily occur when growing single crystals by the CZ method, or variation of a resistivity or defect density may be large. It is therefore preferred to contain $10\times10^{13}$ atoms/cm$^3$ or less (ASTM F-121, 1979) of nitrogen.

In addition, similarly to nitrogen, carbon is electrically neutral, and has effects such as promoting the formation of oxygen precipitates having the gettering effects and keeping wafer strength when the concentration of interstitial oxygen (solid-solubilized oxygen) is reduced due to the heat treatment resulting in the reduction in the wafer strength. Therefore, carbon may be contained within the range of $0.5\times10^{16}$ to $32\times10^{16}$ atoms/cm$^3$ (ASTM F-123, 1981). In the case of a content of less than $0.5\times10^{16}$ atoms/cm$^3$ (ASTM F-123, 1981), the effects may not be exerted sufficiently, while in the case of more than $32\times10^{16}$ atoms/cm$^3$ (ASTM F-123, 1981), polycrystallization may easily occur when growing single crystals by the CZ method. It is therefore preferred to contain $32\times10^{16}$ atoms/cm$^3$ or less (ASTM F-123, 1981) of carbon.

In order to manufacture the silicon wafer of the present embodiment, first, a pulling process is performed to grow a single crystal of a p-type silicon with a resistivity of 0.1 to 10 kΩcm or more, an initial interstitial oxygen concentration of $5.0\times10^{17}$ to $20\times10^{17}$ atoms/cm$^3$ (ASTM F-121, 1979), and a nitrogen concentration of $1.0\times10^{13}$ to $10\times10^{13}$ atoms/cm$^3$ (ASTM F-121, 1979) by using the CZ method (single crystal growing process). At this time, pulling conditions such as the crucible rotation number, the type and flow rate of introduced gas, applied magnetic field condition, or temperature distribution and convection of molten silicon liquid are appropriately controlled, so that the above-described silicon single crystal can be grown.

Next, the obtained silicon single crystal is sliced by a cutting apparatus such as a wire-saw or a slicer, and is then processed into a silicon wafer by performing a process such as chamfering, lapping, etching or polishing if necessary.

Then, the obtained silicon wafer is subjected to a first heat treatment process (oxygen out-diffusion heat treatment) in a heat treating furnace employing a lamp heating scheme under the conditions in which a temperature is increased from 700° C. to 1000° C. by 1 to 2° C./min, and the temperature is maintained at 1000° C. for 0 to 6 hours in an atmosphere of argon, nitrogen or a mixed gas thereof, and is cooled; thereby, the silicon wafer of the present embodiment is obtained.

In the above-described first heat treatment process, an oxygen out-diffusion heat treatment is performed on the wafer at 1100 to 1250° C. for 1 to 5 hours in a controlled atmosphere using argon, hydrogen or a mixed gas thereof, or another mixed gas of nitrogen with a small amount of oxygen. Consequently, when a heat treatment in the device fabrication process is performed on the silicon wafer, the p/n type conversion region due to the occurrence of thermal donors is not generated on a surface region rather than the boundary depth in the range of 10 to 70 μm from the wafer surface.

Through the heating process, out-diffusion of oxygen sufficiently occurs, so the oxygen concentration of a surface layer is reduced. Thus, even if thermal donors are generated in the subsequent device fabrication process resulting in an internal conversion to an n-type semiconductor, the p/n type conversion region is located at a sufficiently deep position from the surface as illustrated in FIG. 3.

A controlled atmosphere using argon, hydrogen or a mixed gas thereof, or another mixed gas of nitrogen with a small amount of oxygen is used as a treatment atmosphere. The out-diffusion of the oxygen in a high-temperature heating is promoted using these gases, so that the p/n type conversion region can be located at the sufficiently deep position from the surface. In the case of using hydrogen, argon or a mixed gas thereof, there is an expected effect of oxygen out-diffusion as well as an effect of eliminating Crystal Originated Particle (COP) in the wafer surface, which makes it possible to obtain a wafer having a superior surface quality.

Although nitrogen is less expensive compared to argon and hydrogen and has advantages in cost, a treatment in a nitrogen atmosphere, which also allows oxygen out-diffusion, fauns a nitride film on the wafer surface which requires an additional process for removing the nitride film. It is consequently preferred to use a mixed gas of nitrogen with about 3% of oxygen as the controlled atmosphere. However, it should be noted that in the atmosphere using the nitrogen, there is no effect of eliminating the COP in the wafer surface layer.

The heat treatment is performed at a heating temperature of 1100 to 1250° C. for the heating time of 1 to 5 hours. In the case of a temperature of less than 1100° C., the oxygen out-diffusion does not easily occur, resulting in a small effect, while in the case of a temperature of 1250° C., slip dislocation can be easily generated in the wafer and the burden put on the heat treating furnace is increased, resulting in shortening of the life span of internal structural parts in the furnace. Also, in the case of a heating time of less than one hour, the p/n type conversion region cannot be located at a depth of more than the boundary depth from the wafer surface, while in the case of a heating time of more than 5 hours, the effect of the oxygen out-diffusion is to be saturated.

The wafer of the present embodiment is manufactured such that the p/n type conversion region is to be positioned at the depth apart from the device active region and the depletion layer region formed in contact therewith, for example, at a depth of more than the boundary depth from the wafer surface. Furthermore, it is preferable to perform an oxygen precipitate heat treatment so as to form BMD due to the oxygen precipitates having gettering effect sufficiently in the interior of the wafer and to reduce residual oxygen in the wafer and thereby increase the resistivity.

As the oxygen precipitate heat treatment, a second heat treatment process is performed. In detail, the silicon wafer having passed the oxygen out-diffusion heat treatment is subjected to the second heat treatment process in a heat treating furnace employing a lamp heating scheme same as the first heat treatment process under the conditions in which a temperature is increased to 1200° C., and the temperature is maintained at 1200° C. for 1 to 2 hours in an atmosphere of argon, hydrogen or a mixed gas thereof, and is cooled; thereby, the silicon wafer of the present embodiment is obtained. Further, the second heat treatment performs a heat treatment for forming oxygen precipitate nuclei at 600 to 800° C. for 1 to 20 hours, and subsequently a heat treatment for growing oxygen precipitates at 1000 to 1100° C. for 1 to 20 hours to form BMD.

Since these heat treatments are dependent on heating temperature and heating time, while independent on the atmosphere conditions to be used, any one of argon, hydrogen, a mixed gas thereof and nitrogen can be used. Due to advantages in cost, as mentioned above, it is preferred to use a mixed gas of nitrogen with about 3% of oxygen as an atmosphere.

In the heat treatment for forming oxygen precipitate nuclei, if the heating temperature is out of the range of 600 to 800° C., the oxygen precipitates are not easily formed; and thereby, the effect is restricted, resulting in a restriction of the effect. Also, in the case of a heating time of less than one hour, the effect cannot be exerted sufficiently, while in the case of a heating time of more than 20 hours, a further lengthening of time cannot cause any significant improvement of the effect and adds up to nothing.

Moreover, this heat treatment can be employed as a heat treatment process in which a temperature is increased from 700° C. to 1000° C. by 1 to 2° C./min, and the temperature is maintained at 1000° C. for 0 to 6 hours in an atmosphere of argon, nitrogen or a mixed gas thereof (non-oxidizing atmosphere). Consequently, the occurrence of new donors such as oxygen donors can be prevented more effectively in a short heat treatment time.

After the heat treatment for forming the nuclei, the heat treatment for growing oxygen precipitates is performed at 1000 to 1100° C. for 1 to 20 hours. The heat treatment for growing the oxygen precipitates is performed at a heating temperature of 1000 to 1100° C., for the reason that in the case of a heating temperature of less than 1000° C., the growth of the oxygen precipitates is not promoted, while in the case of a heating temperature of more than 1100° C., the growth of the oxygen precipitates is not advanced, and further the amount of formed precipitates may be reduced due to re-solid-solubilization. Also, the heat treatment is performed for 1 to 20 hours, for the reason that in the case of a heating time of less than one hour, the growth of the oxygen precipitates is not enough, while in the case of a heating time of more than 20 hours, a further lengthening of a time causes the effect to be saturated.

As described above, according to the production method of the present embodiment, even if the p/n type conversion region due to the thermal donors is generated, the p/n type conversion region is to be located at a depth so as not to be brought into contact with either any device active region or any depletion layer region to prevent a faulty operation or n-well separation failure of a CMOS.

In this regard, after the oxygen out-diffusion heat treatment is performed, it is preferred to perform the heat treatment for forming oxygen precipitate nuclei and the heat treatment for growing oxygen precipitates if necessary. As the conditions of these treatments, there are shown examples, that is, a temperature of 1100 to 1250° C. and a time of 1 to 5 hours for the oxygen out-diffusion heat treatment, a temperature of 600 to 800° C. and a time of 1 to 20 hours for heat treatment for forming the oxygen precipitate nuclei, and a temperature of 1000 to 1100° C. and a time of 1 to 20 hours for the heat treatment for growing oxygen precipitates.

However, specified treatment conditions for each of the treatments are determined based on the wafer resistivity, the depth of a high resistivity layer, the oxygen concentration and the like, which are required according to the device fabrication conditions. Therefore, in order to generate the p/n type conversion region at a depth so as not to be brought into contact with either any device active region or any depletion layer region, the initial oxygen concentration is determined according to the following procedure, and specified treatment conditions are determined on the basis of this determination.

Figure 11:
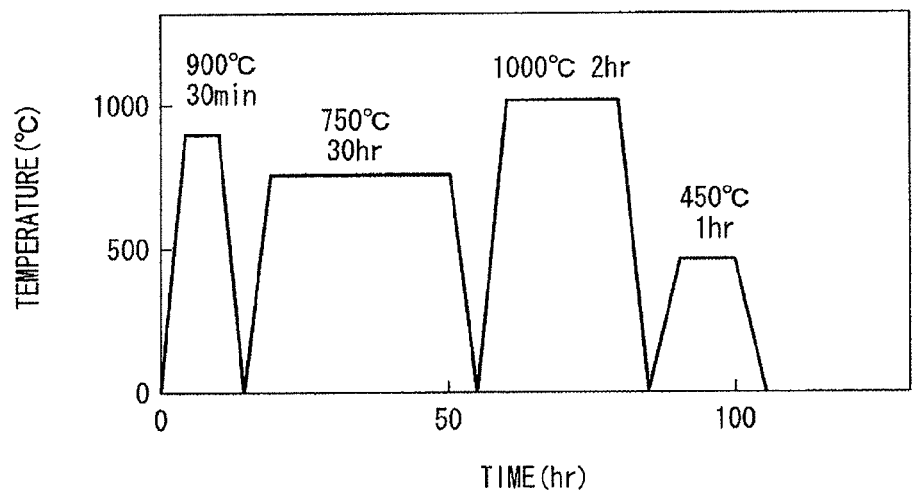
FIG. 11 is a diagram illustrating heat treatment conditions obtained by simulating a process of forming a CMOS on a wafer, using for examining the influence of occurrence of thermal donors.
Figure 12:
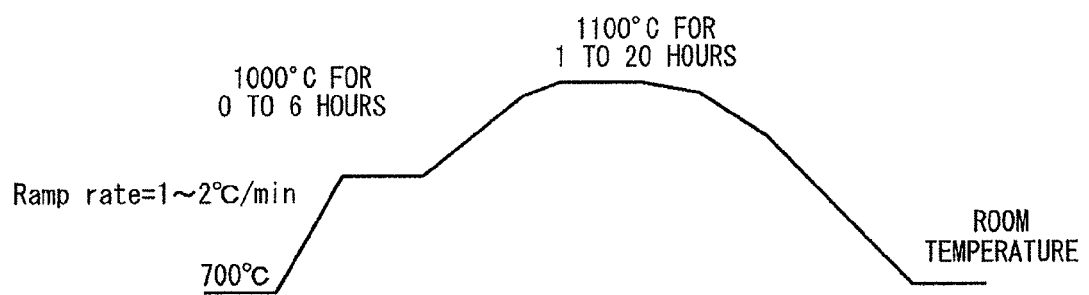
FIG. 12 is a diagram illustrating one example of the oxygen precipitate heat treatment according to the present invention.
Figure 13:
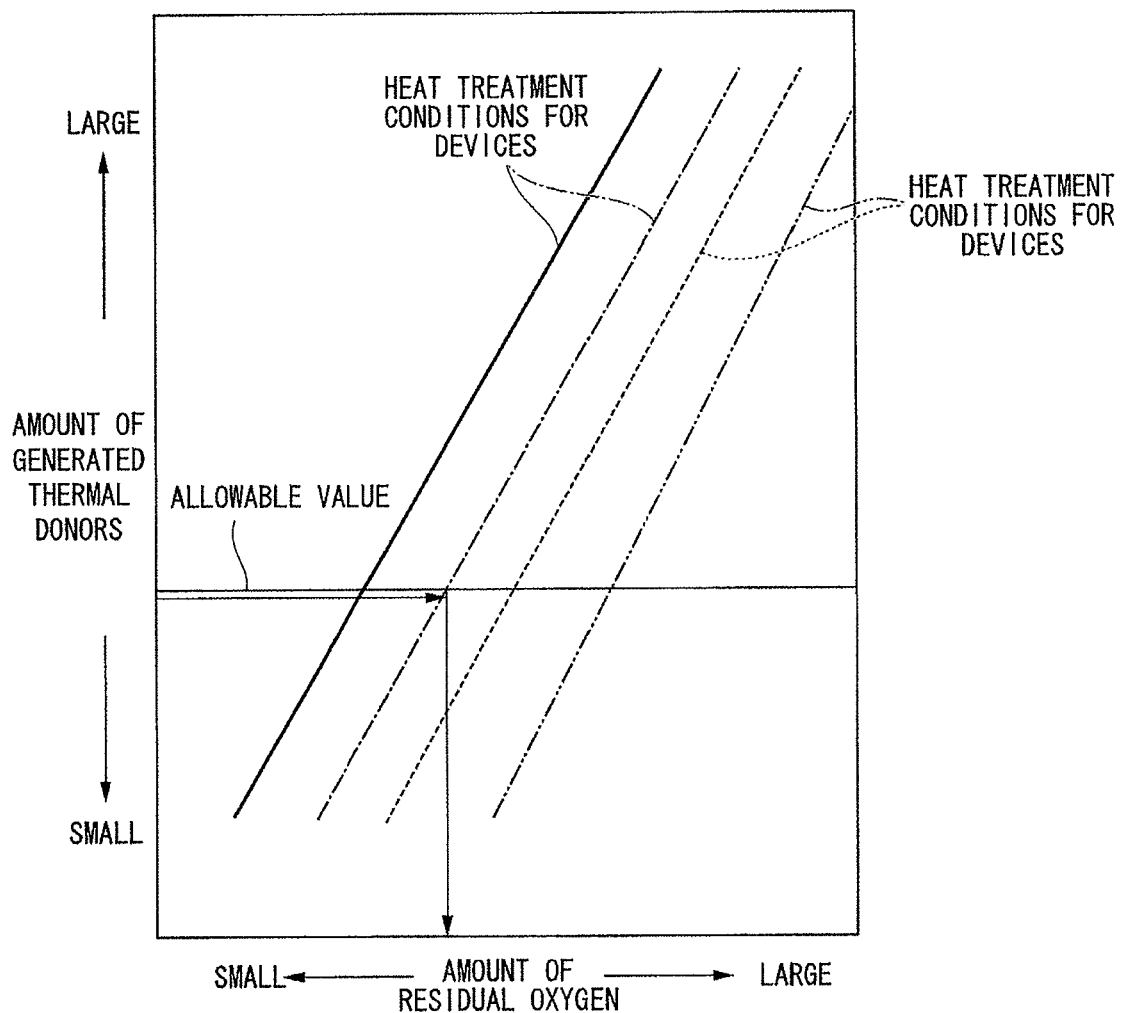
FIG. 13 is a diagram schematically illustrating the relationship between the amount of residual oxygen in a wafer and the density of thermal donors to be generated, using heat treatment conditions in a device fabrication process as parameters.

FIG. 13 is a diagram schematically illustrating the relationship between the amount of residual oxygen in a wafer and the density of thermal donors to be generated, using heat treatment conditions in the device fabrication process as parameters. First, the relationship between the amount of residual oxygen in a wafer and the amount of thermal donors generated for each heat treatment as illustrated in FIG. 11 or FIG. 12 in the device fabrication process is prepared as a master table, where as a heat treatment condition in the device fabrication process, a heating temperature in a range of 400 to 500° C. and a heating time of 1 to 12 hours are used for example.

Next, based on a heat treatment condition (heat treatment sequence) in the device fabrication process, the density of thermal donors to be generated from each residual amount of oxygen is calculated from the master table. Meanwhile, the allowable amount of thermal donors generated is calculated from the wafer resistance and the depth of a high resistivity layer which are defined by the specification for fabrication of devices.

The amount of residual oxygen at a target depth in a wafer is determined by the obtained allowable amount of thermal donors. To secure the determined amount of residual oxygen, the initial oxygen concentration of a wafer made of a p-type single crystal is determined, and on the basis of this determination, specified heat treatment conditions for the oxygen out-diffusion heat treatment and other treatments if necessary are determined using an oxygen precipitate heat treatment simulator.

According to the production method of the present embodiment, a wafer is manufactured such that the p/n type conversion region is generated at a depth so as not to be brought into contact with either any device active region or any depletion layer region, and after the oxygen out-diffusion heat treatment is performed, the heat treatment for forming oxygen precipitate nuclei and the heat treatment for growing oxygen precipitates are performed if necessary, so that the internal oxygen precipitates are formed more reliably, resulting in reduction in the amount of thermal donors generated.

Normally, a device fabrication heat treatment process in which oxygen donors may be generated is an interconnection sintering process. A heat treatment condition for a general sintering process is a temperature of 400° C. and a time of one hour or a temperature of 450° C. and a time of 5 hours, and the generation of thermal donors can be reduced by the heat treatment in such a device process.

Therefore, in the high resistivity p-type silicon wafer of the present embodiment, p-type conversion may occur due to the promotion of internal oxygen precipitation as well as n-type conversion in the p/n type conversion region.

According to the present embodiment, the generation of oxygen donors in the device heat treatment process can be effectively suppressed, and oxygen precipitation-induced defects in the silicon wafer can be controlled in a desired state. Therefore, the silicon wafer can be formed with a sufficient mechanical strength and the oxygen precipitates can be prevented from serving as a slip dislocation source. Further, the oxygen precipitation-induced defects in the silicon wafer can be used as a recombination center in a high specific-resistance layer disposed between a p-type region and an n-type region of a high frequency diode. Therefore, the number of processing steps can be reduced without requiring a process of forming a recombination center (a recombination center of Au, Pt and the like, a recombination center due to electron irradiation-induced defects, and the like) for controlling a lifetime. In addition, sufficient gettering ability is obtained and the resistivity is not changed from a desired range by the device fabrication heat treatment. Therefore, a processing time is shortened and thereby the fabrication cost can be reduced. Consequently, the wafer according to the present embodiment can be easily applied to a high-quality high-frequency diode with a low price in which the resistivity of a high specific-resistance layer is sufficiently high and noises are small.

Second Embodiment

Hereinafter, a silicon wafer according to the present embodiment will be described with reference to the accompanying drawings.

The silicon wafer of the present embodiment does not include a p/n type conversion region and includes a p-type region with variation in a resistivity distribution set to a range of 0 to 30% across all portions in a wafer thickness direction with respect to a reference value set to a range of 0.1 to 10 k Ωcm, and the silicon wafer of the present embodiment is manufactured by a following production method.

The method includes pulling a single crystal such that the single crystal has a p-type dopant concentration at which a wafer surface resistivity becomes in a range of 0.1 to 10 k Ωcm, a nitrogen concentration of $1.0 \times 10^{13}$ to $10 \times 10^{13}$ atoms/$cm^3$ (ASTM F-121, 1979) and an oxygen concentration Oi of $5.0 \times 10^{17}$ to $20 \times 10^{17}$ atoms/$cm^3$ (ASTM F-121, 1979) by using a Czochralski method, processing the single crystal into wafers by slicing the single crystal, subjecting the wafer to an oxygen out-diffusion heat treatment process in a non-oxidizing atmosphere, and subjecting the wafer to a heat treatment process for forming oxygen precipitate nuclei and/or a heat treatment process for forming oxygen precipitates.

Figure 4:
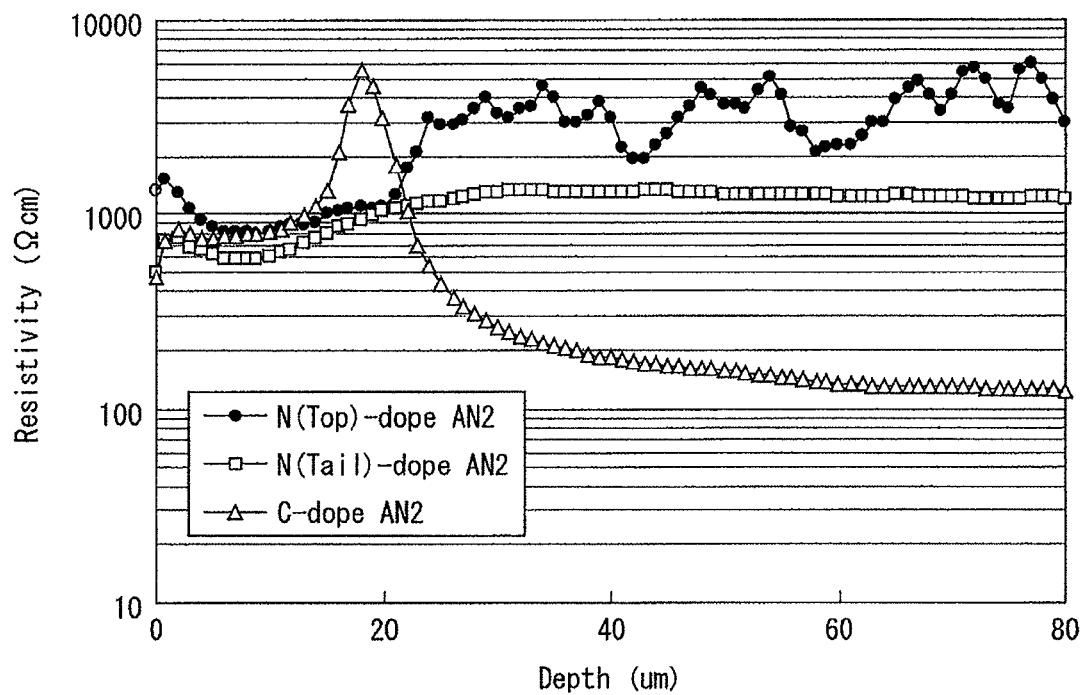
FIG. 4 is a graph illustrating a resistivity distribution in a wafer depth direction after an annealing process according to example 1 of a method for manufacturing a silicon wafer of the present invention.

Since the silicon wafer is manufactured by the above-described production method, when a heat treatment in a device fabrication process is performed, a resistivity distribution in a depth direction is obtained as illustrated in FIG. 4. As illustrated in FIG. 4, the silicon wafer includes a p-type region on a wafer surface side and a region deeper than the p-type region, and the region deeper than the p-type region has a resistivity nearly equal to or higher than that of the p-type region. That is, in the silicon wafer of the present embodiment, there exists no region in the depth direction of the wafer, which has a resistivity lower than a resistivity set in the p-type region on the surface.

As described above, according to the present embodiment, a heat treatment, for example, is performed at 1000° C. for one hour or a heat treatment having a heating effect identical to that obtained by the above heat treatment is performed as well as an oxygen out-diffusion heat treatment process, so that it is possible to manufacture a wafer having no p/n type conversion region with a resistivity lower than the resistivity set in the surface p-type region generated in a carbon-doped wafer.

Consequently, gettering ability and a mechanical strength of a wafer are improved, so that it is possible to fabricate a low-priced high frequency diode with a high efficiency and a controllable lifetime.

Third Embodiment

A silicon wafer of the present embodiment is a p-type wafer where a denuded zone is formed at or in the vicinity of the surface thereof, and is manufactured by the following production method so as to control a depth range from a surface in which p/n type conversion occurs.

The production method includes pulling a single crystal such that the single crystal has a p-type dopant concentration at which a wafer surface resistivity becomes in a range of 0.1 to 10 k Ωcm, a carbon concentration of $0.5 \times 10^{16}$ to $10 \times 10^{16}$ atoms/cm$^3$ (ASTM F-123, 1981) and an oxygen concentration Oi of $5.0 \times 10^{17}$ to $20 \times 10^{17}$ atoms/cm$^3$ (ASTM F-121, 1979) by using a Czochralski method, processing the single crystal into wafers by slicing the single crystal, and subjecting the wafer to an oxygen out-diffusion heat treatment process in a non-oxidizing atmosphere.

Figure 16:
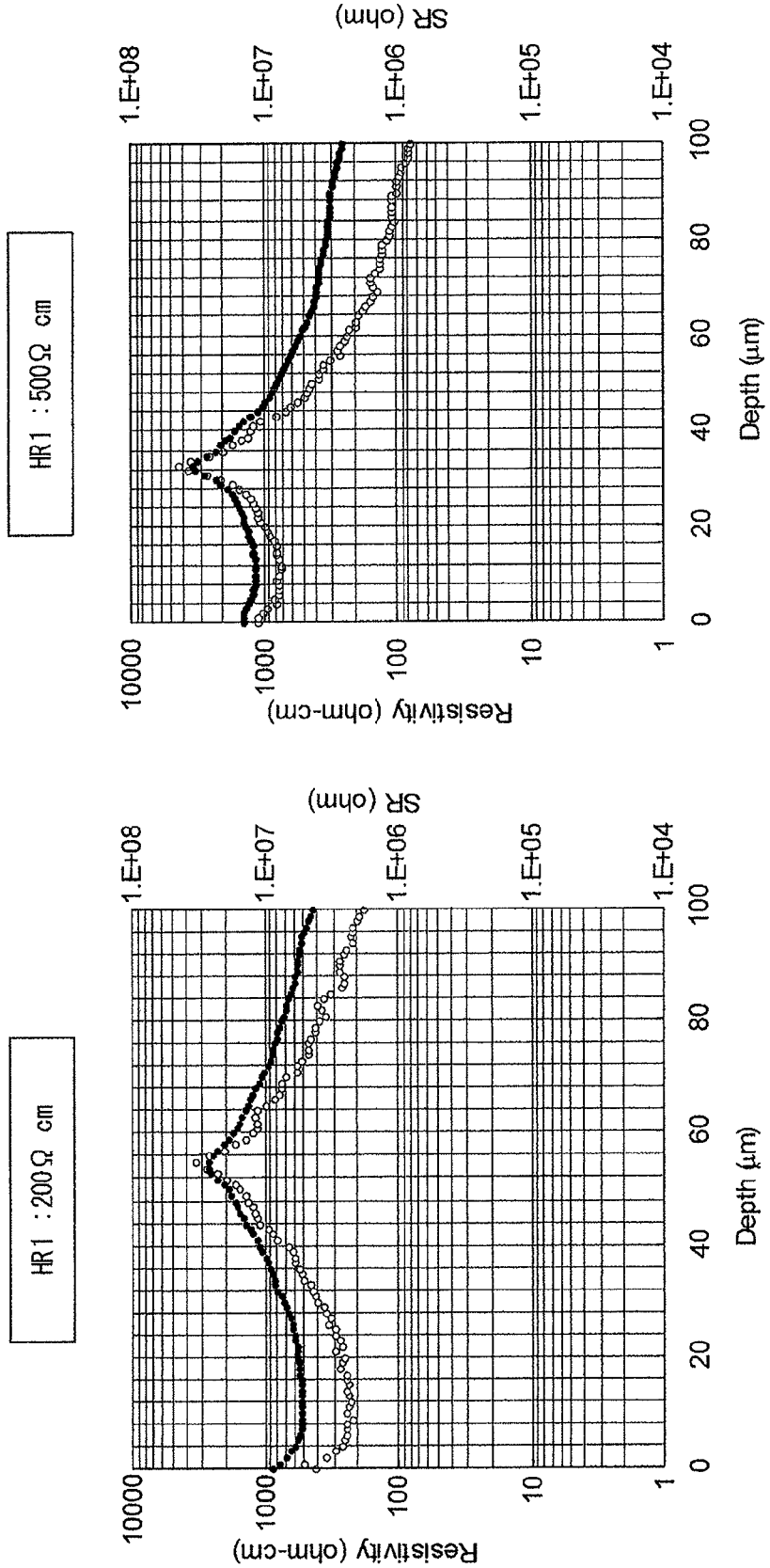
FIG. 16 is a graph illustrating a resistivity distribution in a wafer depth direction after an annealing process according to example 2 of a method for manufacturing a silicon wafer of the present invention.

Since the silicon wafer is manufactured by the above-described production method, when a heat treatment in a device fabrication process is performed, a resistivity distribution in a depth direction is obtained as illustrated in FIG. 16. As illustrated in FIG. 16, a peak position of a resistivity serving as a boundary between a p-type region of a wafer surface side and a p/n conversion region of an inner side of a thickness direction is set by the nitrogen concentration such that the peak position is located at a boundary depth in a range of 10 to 70 μm from the wafer surface.

Thus, when various heat treatments in the device fabrication process are performed, the p/n type conversion region due to occurrence of thermal donors is generated at a depth apart from a device active region and a depletion layer region formed in contact therewith.

In the silicon wafer of the present embodiment, no p/n type conversion region due to thermal donors is generated in a range from the boundary depth in the range of 10 to 70 μm to the wafer surface. Thus, the p/n type conversion region can be generated at the depth apart from the device active region and the depletion layer region formed in contact therewith.

The reason for setting a resistivity to 0.1 to 10 k Ωcm is as follows.

If a frequency used in devices is high, and particularly exceeds 2.5 GHz or a target value is equal to or more than about 60 GHz, noise generation or signal attenuation markedly occurs in conventional low resistivity substrates with a resistivity of 10 Ωcm or less. However, the influence of the occurrence can be reduced in high resistivity ones.

In low resistivity p-type wafers with a low resistivity of less than 100 Ωcm, since dopant exists sufficiently, n-type conversion does not occur easily.

Further, if the silicon wafer with a resistivity of 600 to 1000 Ωcm according to the present embodiment is used, the resistivity of a high specific-resistance layer is significantly high, so it is possible to fabricate a high-quality high-frequency diode in which noises are significantly reduced.

According to the present embodiment, when n-type conversion is generated due to the occurrence of thermal donors in the heat treatment of the device fabrication process using a wafer, the p/n type conversion region due to occurrence of thermal donors is located at the depth apart from the device active region and the depletion layer region formed in contact therewith. Compared with this, if the p/n type conversion region is brought into contact with these regions, it impacts on devices formed in a surface region, resulting in faulty characteristics of the devices and insufficient n-well separation. According to the present embodiment, the above problems do not occur.

The p/n type conversion region is required to be generated at the depth apart from the device active region and the depletion layer region formed in contact therewith. For example, if the p/n type conversion region is generated at a position lower than setting values of the boundary depth in the range of 10 to 70 μm, it impacts on the devices formed in the surface portion. The setting values include 10 μm, 15 μm, 20 μM, 25 μm, 30 μm, 35 μm, 40 μm, 45 μm, 50 μm, 55 μm, 60 μm and 65 μm. The fact that the p/n type conversion region is located at a depth exceeding the boundary depth from the surface represents that an n-type conversion region is located at an inner side of the depth exceeding the boundary depth although n-type conversion has occurred in the heat treatment of the device fabrication process.

The heat treatment of the device fabrication process, for example, can be represented by conditions in which maximum thermal donors are easily generated such as a 1-hour heating at 450° C. or a 30-minute heating at 650° C. The position of the p/n type conversion region can be detected by measuring a resistivity distribution in the wafer depth direction through a spreading resistance measurement method and detected in a depth at which the resistivity is maximum.

Preferably, the oxygen concentration in the wafer is not particularly limited as long as being included within the range that is included in single crystals of silicon manufactured by the normal CZ method. It is however preferred that oxygen in the interior of the wafer exist as oxygen precipitates for forming Bulk Micro Defects (BMD) having gettering effects, and a heat treatment for forming such oxygen precipitates is performed.

In addition, carbon is electrically neutral and has effects such as promoting the formation of oxygen precipitates having the gettering effects and keeping wafer strength when the concentration of interstitial oxygen (solid-solubilized oxygen) is reduced due to the heat treatment resulting in the reduction in the wafer strength. Therefore, carbon may be contained within the range of $0.5 \times 10^{16}$ to $10 \times 10^{16}$ atoms/cm$^3$ (ASTM F-123, 1981). In the case of a content of less than $0.5 \times 10^{16}$ atoms/cm$^3$ (ASTM F-123, 1981), the effects may not be exerted sufficiently, while in the case of more than $10 \times 10^{16}$ atoms/cm$^3$ (ASTM F-123, 1981), polycrystallization may easily occur when growing single crystals by the CZ method, or variation of a resistivity or defect density may be large. It is therefore preferred to contain $10 \times 10^{16}$ atoms/cm$^3$ or less of carbon.

In addition, similarly to carbon, nitrogen is electrically neutral and has effects such as promoting the formation of oxygen precipitates having the gettering effects and keeping wafer strength when the concentration of interstitial oxygen (solid-solubilized oxygen) is reduced due to the heat treatment resulting in the reduction in the wafer strength. Therefore, nitrogen may be contained within the range of $0.5 \times 10^{16}$ to $10 \times 10^{16}$ atoms/cm$^3$ (ASTM F-121, 1979).

In order to manufacture the silicon wafer of the present embodiment, first, a pulling process is performed to grow a single crystal of a p-type silicon with a resistivity of 0.1 to 10 kΩcm or more, an initial interstitial oxygen concentration of $5.0 \times 10^{17}$ to $20 \times 10^{17}$ atoms/cm$^3$ (ASTM F-121, 1979), and a carbon concentration of $0.5 \times 10^{16}$ to $10 \times 10^{16}$ atoms/cm$^3$ (ASTM F-123, 1981) by using the CZ method (single crystal growing process). At this time, pulling conditions such as the crucible rotation number, the type and flow rate of introduced gas, applied magnetic field condition, or temperature distribution and convection of molten silicon liquid are appropriately controlled, so that the above-described silicon single crystal can be grown.

Next, the obtained silicon single crystal is sliced by a cutting apparatus such as a wire-saw or a slicer, and is then processed into a silicon wafer by performing a process such as chamfering, lapping, etching or polishing if necessary.

Then, the obtained silicon wafer is subjected to a first heat treatment process (oxygen out-diffusion heat treatment) in a heat treating furnace employing a lamp heating scheme under the conditions in which a temperature is increased from 700° C. to 1000° C. by 1 to 2° C./min, and the temperature is maintained at 1000° C. for 0 to 6 hours in an atmosphere of argon, nitrogen or a mixed gas thereof, and is cooled; thereby, the silicon wafer of the present embodiment is obtained.

In the above-described first heat treatment process, an oxygen out-diffusion heat treatment is performed on the wafer at 1100 to 1250° C. for 1 to 5 hours in a controlled atmosphere using argon, hydrogen or a mixed gas thereof, or another mixed gas of nitrogen with a small amount of oxygen. Consequently, when a heat treatment in the device fabrication process is performed on the silicon wafer, the p/n type conversion region due to the occurrence of thermal donors is not generated in a surface region rather than the boundary depth in the range of 10 to 70 μm from the wafer surface.

Through the heating process, out-diffusion of oxygen sufficiently occurs, so the oxygen concentration of a surface layer is reduced. Thus, even if thermal donors are generated in the subsequent device fabrication process resulting in an internal conversion to an n-type semiconductor, the p/n type conversion region is located at a sufficiently deep position from the surface.

A controlled atmosphere using argon, hydrogen or a mixed gas thereof, or another mixed gas of nitrogen with a small amount of oxygen is used as a treatment atmosphere. The out-diffusion of the oxygen in a high-temperature heating is promoted using these gases, so that the p/n type conversion region can be located at the sufficiently deep position from the surface. In the case of using hydrogen, argon or a mixed gas thereof, there is an expected effect of oxygen out-diffusion as well as an effect of eliminating Crystal Originated Particle (COP) in the wafer surface, which makes it possible to obtain a wafer having a superior surface quality.

Although nitrogen is less expensive compared to argon and hydrogen and has advantages in cost, a treatment in a nitrogen atmosphere, which also allows oxygen out-diffusion, forms a nitride film on the wafer surface which requires an additional process for removing the nitride film. It is consequently preferred to use a mixed gas of nitrogen with about 3% of oxygen as the controlled atmosphere. However, it should be noted that in the atmosphere using the nitrogen there is no effect of eliminating the COP in the wafer surface layer.

The heat treatment is performed at a heating temperature of 1100 to 1250° C. for the heating time of 1 to 5 hours. In the case of a temperature of less than 1100° C., the oxygen out-diffusion does not easily occur, resulting in a small effect, while in the case of a temperature of 1250° C., slip dislocation can be easily generated in the wafer and the burden put on the heat treating furnace is increased, resulting in shortening of the life span of internal structural parts in the furnace. Also, in the case of a heating time of less than one hour, the p/n type conversion region cannot be located at a depth of more than the boundary depth from the wafer surface, while in the case of a heating time of more than 5 hours, the effect of the oxygen out-diffusion is to be saturated.

The wafer of the present embodiment is manufactured such that the p/n type conversion region is to be positioned at the depth apart from the device active region and the depletion layer region formed in contact therewith, for example, at a depth of more than the boundary depth from the wafer surface. Furthermore, it is preferable to perform an oxygen precipitate heat treatment so as to form BMD due to the oxygen precipitates having gettering effect sufficiently in the interior of the wafer and to reduce residual oxygen in the wafer and thereby increase the resistivity.

As the oxygen precipitate heat treatment, a second heat treatment process is performed. In detail, the silicon wafer having passed the oxygen out-diffusion heat treatment is subjected to the second heat treatment process in a heat treating furnace employing a lamp heating scheme same as the first heat treatment process under the conditions in which a temperature is increased to 1200° C., and the temperature is maintained at 1200° C. for 1 to 2 hours in an atmosphere of argon, hydrogen or a mixed gas thereof, and is cooled; thereby, the silicon wafer of the present embodiment is obtained. Further, the second heat treatment performs a heat treatment for forming oxygen precipitate nuclei at 600 to 800° C. for 1 to 20 hours, and subsequently a heat treatment for growing oxygen precipitates at 1000 to 1100° C. for 1 to 20 hours to form BMD.

Since the heat treatments above are dependent on heating temperature and heating time, while independent on the atmosphere conditions to be used, any one of argon, hydrogen, a mixed gas thereof and nitrogen can be used. Due to advantages in cost, as mentioned above, it is preferred to use a mixed gas of nitrogen with about 3% of oxygen as an atmosphere.

In the heat treatment for forming oxygen precipitate nuclei, if the heating temperature is out of the range of 600 to 800° C., the oxygen precipitates are not easily formed; and thereby, the effect is restricted, resulting in a restriction of the effect. Also, in the case of a heating time of less than one hour, the effect cannot be exerted sufficiently, while in the case of a heating time of more than 20 hours, a further lengthening of time cannot cause any significant improvement of the effect and adds up to nothing.

Moreover, the heat treatment above can be employed as a heat treatment process in which a temperature is increased from 700° C. to 1000° C. by 1 to 2° C./min, and the temperature is maintained at 1000° C. for 0 to 6 hours in an atmosphere of argon, nitrogen or a mixed gas thereof (non-oxidizing atmosphere). Consequently, the occurrence of new donors such as oxygen donors can be prevented more effectively in a short heat treatment time.

After the heat treatment for forming the nuclei, the heat treatment for growing oxygen precipitates is performed at 1000 to 1100° C. for 1 to 20 hours. The heat treatment for growing the oxygen precipitates is performed at a heating temperature of 1000 to 1100° C., for the reason that in the case of a heating temperature of less than 1000° C., the growth of the oxygen precipitates is not promoted, while in the case of a heating temperature of more than 1100° C., the growth of the oxygen precipitates is not advanced, and further the amount of formed precipitates may be reduced due to re-solid-solubilization. Also, the heat treatment is performed for 1 to 20 hours, for the reason that in the case of a heating time of less than one hour, the growth of the oxygen precipitates is not enough, while in the case of a heating time of more than 20 hours, a further lengthening of a time causes the effect to be saturated.

As described above, according to the production method of the present embodiment, even if the p/n type conversion region due to the thermal donors is generated, the p/n type conversion region is to be located at a depth so as not to be brought into contact with either any device active region or any depletion layer region to prevent a faulty operation or n-well separation failure of a CMOS.

In this regard, after the oxygen out-diffusion heat treatment is performed, it is preferred to perform the heat treatment for forming oxygen precipitate nuclei and the heat treatment for growing oxygen precipitates if necessary. As the conditions of these treatments, there are shown examples, that is, a temperature of 1100 to 1250° C. and a time of 1 to 5 hours for the oxygen out-diffusion heat treatment, a temperature of 600 to 800° C. and a time of 1 to 20 hours for heat treatment for forming the oxygen precipitate nuclei, and a temperature of 1000 to 1100° C. and a time of 1 to 20 hours for the heat treatment for growing oxygen precipitates.

However, specified treatment conditions for each of the treatments are determined based on the wafer resistivity, the depth of a high resistivity layer, the oxygen concentration and the like, which are required according to the device fabrication conditions. Therefore, in order to generate the p/n type conversion region at a depth so as not to be brought into contact with either any device active region or any depletion layer region, the initial oxygen concentration is determined according to the following procedure, and specified treatment conditions are determined on the basis of this determination.

FIG. 13 is a diagram schematically illustrating the relationship between the amount of residual oxygen in a wafer and the density of thermal donors to be generated, using heat treatment conditions in the device fabrication process as parameters. First, the relationship between the amount of residual oxygen in a wafer and the amount of thermal donors generated for each heat treatment as illustrated in FIG. 11 or FIG. 12 in the device fabrication process is prepared as a master table, where as a heat treatment condition in the device fabrication process, a heating temperature in a range of 400 to 500° C. and a heating time of 1 to 12 hours are used for example.

Next, based on a heat treatment condition (heat treatment sequence) in the device fabrication process, the density of thermal donors to be generated from each residual amount of oxygen is calculated from the master table. Meanwhile, the allowable amount of thermal donors generated is calculated from the wafer resistance and the depth of a high resistivity layer which are defined by the specification for fabrication of devices.

The amount of residual oxygen at a target depth in a wafer is determined by the obtained allowable amount of thermal donors. To secure the determined amount of residual oxygen, the initial oxygen concentration of a wafer made of a p-type single crystal is determined, and on the basis of this determination, specified heat treatment conditions for the oxygen out-diffusion heat treatment and other treatments if necessary are determined using an oxygen precipitate heat treatment simulator.

According to the production method of the present embodiment, a wafer is manufactured such that the p/n type conversion region is generated at a depth so as not to be brought into contact with either any device active region or any depletion layer region, and after the oxygen out-diffusion heat treatment is performed, the heat treatment for forming oxygen precipitate nuclei and the heat treatment for growing oxygen precipitates are performed if necessary, so that the internal oxygen precipitates are formed more reliably, resulting in reduction in the amount of thermal donors generated.

Normally, a device fabrication heat treatment process in which oxygen donors may be generated is an interconnection sintering process. A heat treatment condition for a general sintering process is a temperature of 400° C. and a time of one hour or a temperature of 450° C. and a time of 5 hours, and the generation of thermal donors can be reduced by the heat treatment in such a device process.

Therefore, in the high resistivity p-type silicon wafer of the present embodiment, p-type conversion may occur due to the promotion of internal oxygen precipitation as well as n-type conversion in the phi type conversion region.

According to the present embodiment, the generation of oxygen donors in the device heat treatment process can be effectively suppressed and oxygen precipitation-induced defects in the silicon wafer can be controlled in a desired state. Therefore, the silicon wafer can be formed with a sufficient mechanical strength and the oxygen precipitates can be prevented from serving as a slip dislocation source. Further, the oxygen precipitation-induced defects in the silicon wafer can be used as a recombination center in a high specific-resistance layer disposed between a P-type region and an N-type region of a high frequency diode. Therefore, the number of processing steps can be reduced without requiring a process of forming a recombination center (a recombination center of Au, Pt and the like, a recombination center due to electron irradiation-induced defects, and the like) for controlling a lifetime. In addition, sufficient gettering ability is obtained and the resistivity is not changed from a desired range by the device fabrication heat treatment. Therefore, a processing time is shortened and thereby fabrication costs can be reduced. Consequently, the wafer according to the present embodiment can be easily applied to a high-quality high-frequency diode with a low price in which the resistivity of a high specific-resistance layer is sufficiently high and noises are small.

Fourth Embodiment

Hereinafter, a silicon wafer according to the present embodiment will be described with reference to the accompanying drawings.

The silicon wafer of the present embodiment does not include a p/n type conversion region and includes a p-type region with variation in a resistivity distribution set to a range of 0 to 30% across all portions in the wafer thickness direction with respect to a reference value set to a range of 0.1 to 10 k Ωcm, and the silicon wafer of the present embodiment is manufactured by a following production method.

The method includes pulling a single crystal such that the single crystal has a p-type dopant concentration at which the wafer surface resistivity becomes in a range of 0.1 to 10 k Ωcm, a carbon concentration of $0.5 \times 10^{16}$ to $10 \times 10^{16}$ atoms/$cm^3$ (ASTM F-123, 1981) and an oxygen concentration Oi of $5.0 \times 10^{17}$ to $20 \times 10^{17}$ atoms/$cm^3$ (ASTM F-121, 1979) by using a Czochralski method, processing the single crystal into wafers by slicing the single crystal, subjecting the wafer to an oxygen out-diffusion heat treatment process in a non-oxidizing atmosphere, and subjecting the wafer to a heat treatment process for forming oxygen precipitate nuclei and/or a heat treatment process for forming oxygen precipitates.

Since the silicon wafer is manufactured by the above-described production method, when a heat treatment in a device fabrication process is performed, a resistivity distribution in the depth direction is obtained as illustrated in FIG. 16.

As illustrated in FIG. 16, the silicon wafer includes a p-type region on the wafer surface and a region deeper than the p-type region, and the region deeper than the p-type region has a resistivity nearly equal to or higher than that of the p-type region. That is, in the silicon wafer of the present embodiment, there exists no region in the depth direction of the wafer, which has a resistivity lower than the resistivity set in the p-type region on the surface.

As described above, according to the present embodiment, a heat treatment, for example, is performed at 1000° C. for one hour or a heat treatment having a heating effect identical to that obtained by the above heat treatment is performed as well as an oxygen out-diffusion heat treatment process, so that it is possible to manufacture a wafer having no p/n type conversion region with a resistivity lower than the resistivity set in the surface p-type region generated in a carbon-doped wafer.

Consequently, gettering ability and a mechanical strength of a wafer are improved, so that it is possible to fabricate a low-priced high frequency diode with a high efficiency and a controllable lifetime.

High Frequency Diode Using Silicon Wafer of First to Fourth Embodiments

Next, high frequency diodes to which the silicon wafers of the first to fourth embodiments are applied will be described.

Figure 14:
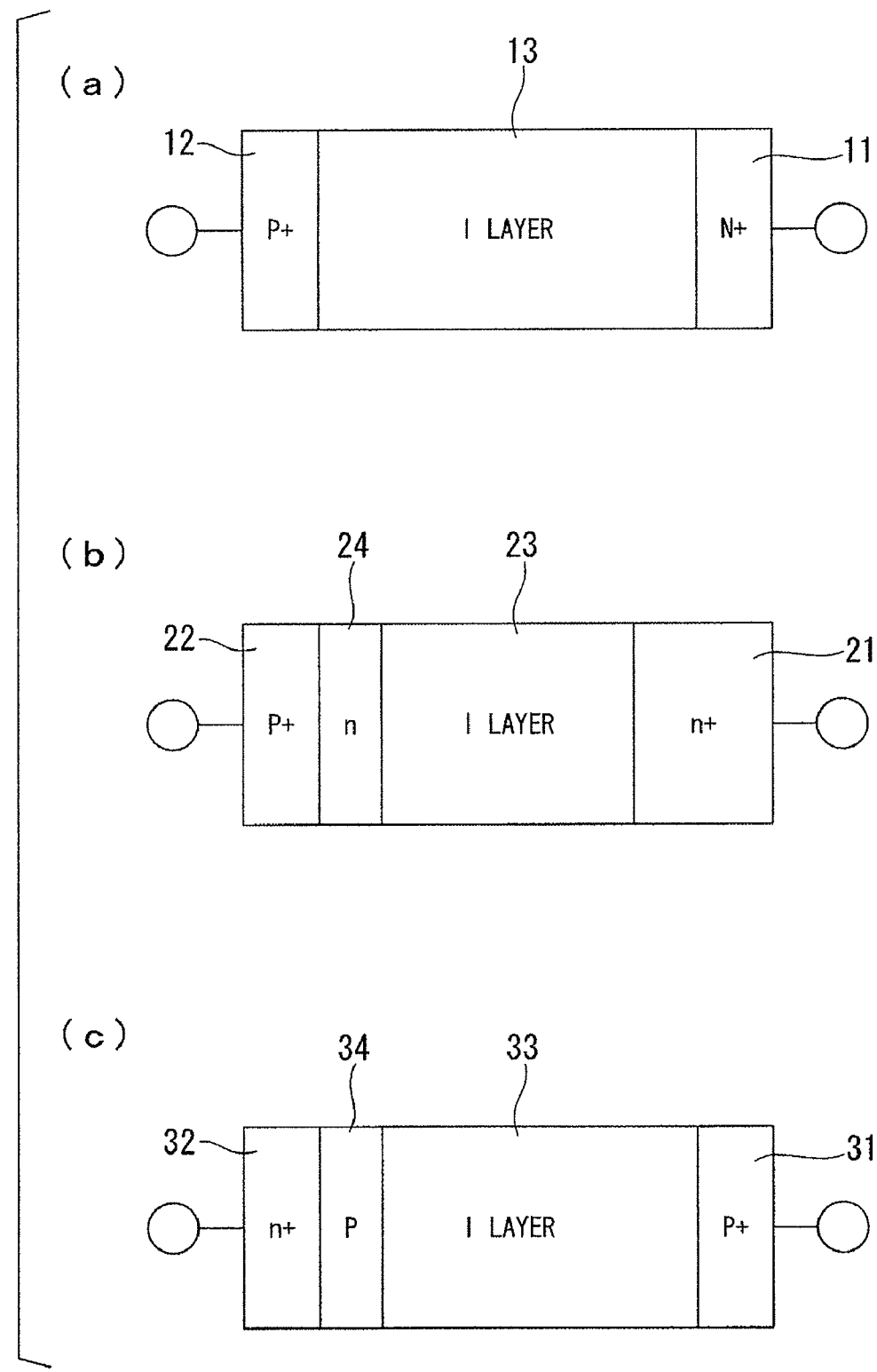
FIG. 14 shows sectional views schematically illustrating one example of high frequency diodes fabricated from silicon wafers of the present invention.

FIG. 14 shows sectional views schematically illustrating one example of high frequency diodes fabricated from the silicon wafers of the first to fourth embodiments. The high frequency diode illustrated in FIG. 14(a) is a PIN diode, and includes a P-type region 12, an N-type region 11 and a high specific-resistance layer (I layer) 13 disposed between the P-type region 12 and the N-type region 11, which are formed in the silicon wafers of the first to fourth embodiments.

The high frequency diode illustrated in FIG. 14(a) can be fabricated by the following procedure.

First, after the silicon wafers of the first to fourth embodiments are prepared, boron B is diffused with a concentration of about $1\times10^{18}$ atoms/cm$^3$ at a position of about 2 µm from the wafer surface. Herein, the diffusion of boron can be performed at a temperature of about 1000° C. by using a heat diffusion method, an ion implantation method and the like.

Next, phosphorous P is diffused with a concentration of $1\times10^{18}$ atoms/cm$^3$ at a position of about 2 µm from the silicon surface diffused with boron. Herein, the diffusion of phosphorous can be performed at a temperature of about 850° C. by using a heat diffusion method, an ion implantation method and the like.

Then, an Au electrode is formed on the surface of the silicon surface through electron beam deposition, and an Al electrode is formed on the rear surface of the silicon surface through the electron beam deposition.

Thereafter, the diode is cut from the silicon wafer so that mesa etching is performed, and silicon resin is coated on an etched surface after the mesa etching (a passivation process for an end surface).

FIG. 14(b) is a sectional view schematically illustrating another example of high frequency diodes fabricated from the silicon wafers of the first to fourth embodiments.

The high frequency diode illustrated in FIG. 14(b) is an IMPATT diode, and includes a p+ layer 22, an n+ region 21, a high specific-resistance layer (I layer) 23, and an n layer 24 disposed between the P+ layer 22 and the high specific-resistance layer (I layer) 23, which are formed in the silicon wafers of the first to fourth embodiments. The IMPATT diode is an oscillating element using a negative resistor. In the IMPATT diode, carriers generated by impact ionization in a semiconductor are moved at a saturation drift velocity. At this time, a phase difference of π/2 occurs between the phase of current generated by the generated carriers and an applied voltage, and an effective resistance component becomes negative, that is, negative resistance appears.

The high frequency diode illustrated in FIG. 14(b) can be fabricated by forming the p+ layer 22, the n+ region 21, the high specific-resistance layer (I layer) 23, and the n layer 24 in the silicon wafer by using a method equal to that used for fabricating the PIN diode.

FIG. 14(c) is a sectional view schematically illustrating another example of high frequency diodes fabricated from the silicon wafers of the first to fourth embodiments.

The high frequency diode illustrated in FIG. 14(c) is an IMPATT diode, and includes a p+ layer 31, an n+ region 32, a high specific-resistance layer (I layer) 33, and a p layer 34 disposed between the n+ layer 32 and the high specific-resistance layer (I layer) 33, which are formed in the silicon wafers of the first to fourth embodiments.

The high frequency diode illustrated in FIG. 14(c) can be fabricated by forming the p+ layer 31, the n+ region 32, the high specific-resistance layer (I layer) 33, and the p layer 34 in the silicon wafer by using a method equal to that used for fabricating the PIN diode.

Fifth Embodiment

A silicon wafer of the present embodiment is a p-type wafer where a denuded zone is formed at or in the vicinity of the surface thereof, and is manufactured by the following production method so as to control a depth range from a surface in which p/n type conversion occurs.

The production method includes pulling a single crystal such that the single crystal has a dopant concentration at which the wafer surface resistivity becomes in a range of 0.1 to 10 k Ωcm, a nitrogen concentration of $1.0\times10^{13}$ to $10\times10^{13}$ atoms/cm$^3$ (ASTM F-121, 1979) and an oxygen concentration Oi of $5.0\times10^{17}$ to $20\times10^{17}$ atoms/cm$^3$ (ASTM F-121, 1979) by using a Czochralski method, processing the single crystal into wafers by slicing the single crystal, and subjecting the wafer to an oxygen out-diffusion heat treatment process in a non-oxidizing atmosphere.

Since the silicon wafer is manufactured by the above-described production method, when a heat treatment in a device fabrication process is performed, a resistivity distribution in the depth direction is obtained as illustrated in FIG. 3. As illustrated in FIG. 3, a peak position of a resistivity serving as the boundary between a p-type region of the wafer surface side and a p/n conversion region of an inner side of the thickness direction is set by the nitrogen concentration such that the peak position is located at a boundary depth in a range of 10 to 70 µm from the wafer surface.

Thus, when various heat treatments in the device fabrication process are performed, the p/n type conversion region due to occurrence of thermal donors is generated at a depth apart from a device active region and a depletion layer region formed in contact therewith.

In the silicon wafer of the present embodiment, no p/n type conversion region due to thermal donors is generated in a range from the boundary depth in the range of 10 to 70 µm to the wafer surface. Thus, the p/n type conversion region can be generated at the depth apart from the device active region and the depletion layer region formed in contact therewith.

The reason for setting a resistivity to 0.1 to 10 k Ωcm is as follows.

If a frequency used in devices is high, and particularly exceeds 2.5 GHz or a target value is equal to or more than about 60 GHz, noise generation or signal attenuation markedly occurs in conventional low resistivity substrates with a resistivity of 10 Ωcm or less. However, the influence of the occurrence can be reduced in high resistivity ones.

In low resistivity p-type wafers with a low resistivity of less than 100 Ωcm, since dopant exists sufficiently, n-type conversion does not occur easily.

Further, if the silicon wafer with a resistivity of 600 to 1000 Ωcm according to the present embodiment is used, the resistivity of a high specific-resistance layer is significantly high, so it is possible to fabricate a high-quality high-frequency diode in which noises are significantly reduced.

According to the present embodiment, when n-type conversion is generated due to the occurrence of thermal donors in the heat treatment of the device fabrication process using a wafer, the p/n type conversion region due to occurrence of thermal donors is located at the depth apart from the device active region and the depletion layer region formed in contact therewith. Compared with this, if the p/n type conversion region is brought into contact with these regions, it impacts on devices formed on a surface region, resulting in faulty characteristics of the devices and insufficient n-well separation. According to the present embodiment, the above problems do not occur.

The p/n type conversion region is required to be generated at the depth apart from the device active region and the depletion layer region formed in contact therewith. For example, if the p/n type conversion region is generated at a position lower than setting values of the boundary depth in the range of 10 to 70 μm, it impacts on the devices formed in the surface portion. The setting values include 10 μm, 15 μm, 20 μm, 25 μm, 30 μm, 35 μm, 40 μm, 45 μm, 50 μm, 55 μm, 60 μm and 65 μm. The fact that the p/n type conversion region is located at a depth exceeding the boundary depth from the surface represents that an n-type conversion region is located at an inner side of the depth exceeding the boundary depth although n-type conversion has occurred in the heat treatment of the device fabrication process.

The heat treatment of the device fabrication process, for example, can be represented by conditions in which maximum thermal donors are easily generated such as a 1-hour heating at 450° C. or a 30-minute heating at 650° C.

As illustrated in FIG. 3, the position of the p/n type conversion region can be detected by measuring a resistivity distribution in the wafer depth direction through a spreading resistance measurement method and detected in a depth at which the resistivity is at a maximum.

Preferably, the oxygen concentration in the wafer is not particularly limited as long as being included within the range that is included in single crystals of silicon manufactured by the normal CZ method. It is however preferred that oxygen in the interior of the wafer exist as oxygen precipitates for forming Bulk Micro Defects (BMD) having gettering effects, and a heat treatment for forming such oxygen precipitates is performed.

In addition, nitrogen is electrically neutral and has effects such as promoting the formation of oxygen precipitates having the gettering effects and keeping wafer strength when the concentration of interstitial oxygen (solid-solubilized oxygen) is reduced due to the heat treatment resulting in the reduction in the wafer strength. Therefore, nitrogen may be contained within the range of $1.0 \times 10^{13}$ to $10 \times 10^{13}$ atoms/cm$^3$ (ASTM F-121, 1979). In the case of a content of less than $1.0 \times 10^{13}$ atoms/cm$^3$ (ASTM F-121, 1979), the effects may not be exerted sufficiently, while in the case of more than $10 \times 10^{13}$ atoms/cm$^3$ (ASTM F-121, 1979), polycrystallization may easily occur when growing single crystals by the CZ method, or variation of a resistivity or defect density may be large. It is therefore preferred to contain $10 \times 10^{13}$ atoms/cm$^3$ or less (ASTM F-121, 1979) of nitrogen.

In addition, similarly to nitrogen, carbon is electrically neutral and has effects such as promoting the formation of oxygen precipitates having the gettering effects and keeping wafer strength when the concentration of interstitial oxygen (solid-solubilized oxygen) is reduced due to the heat treatment resulting in the reduction in the wafer strength. Therefore, carbon may be contained within the range of $0.5 \times 10^{16}$ to $32 \times 10^{16}$ atoms/cm$^3$ (ASTM F-123, 1981). In the case of a content of less than $0.5 \times 10^{16}$ atoms/cm$^3$ (ASTM F-123, 1981), the effects may not be exerted sufficiently, while in the case of more than $32 \times 10^{16}$ atoms/cm$^3$ (ASTM F-123, 1981), excessive content causes the occurrence of polycrystallization when growing single crystals by the CZ method. It is therefore preferred to contain $32 \times 10^{16}$ atoms/cm$^3$ or less (ASTM F-123, 1981) of carbon.

In order to manufacture the silicon wafer of the present embodiment, first, a pulling process is performed to grow a single crystal of a p-type silicon with a resistivity of 0.1 to 10 k Ωcm or more, an initial interstitial oxygen concentration of $5.0 \times 10^{17}$ to $20 \times 10^{17}$ atoms/cm$^3$ (ASTM F-121, 1979), and a nitrogen concentration of $1.0 \times 10^{13}$ to $10 \times 10^{13}$ atoms/cm$^3$ (ASTM F-121, 1979) by using the CZ method (single crystal growing process). At this time, pulling conditions such as the crucible rotation number, the type and flow rate of introduced gas, applied magnetic field condition, or temperature distribution and convection of molten silicon liquid are appropriately controlled, so that the above-described silicon single crystal can be grown.

Next, the obtained silicon single crystal is sliced by a cutting apparatus such as a wire-saw or a slicer, and is then processed into a silicon wafer by performing a process such as chamfering, lapping, etching or polishing if necessary.

Then, the obtained silicon wafer is subjected to a first heat treatment process (oxygen out-diffusion heat treatment) in a heat treating furnace employing a lamp heating scheme under the conditions in which a temperature is increased from 700° C. to 1000° C. by 1 to 2° C./min, and the temperature is maintained at 1000° C. for 0 to 6 hours in an atmosphere of argon, nitrogen or a mixed gas thereof, and is cooled; thereby, the silicon wafer of the present embodiment is obtained.

In the above-described first heat treatment process, an oxygen out-diffusion heat treatment is performed on the wafer at 1100 to 1250° C. for 1 to 5 hours in a controlled atmosphere using argon, hydrogen or a mixed gas thereof, or another mixed gas of nitrogen with a small amount of oxygen. Consequently, when a heat treatment in the device fabrication process is performed on the silicon wafer, the p/n type conversion region due to the occurrence of thermal donors is not generated on a surface region rather than the boundary depth in the range of 10 to 70 μm from the wafer surface.

Through the heating process, out-diffusion of oxygen sufficiently occurs, so the oxygen concentration of a surface layer is reduced. Thus, even if thermal donors are generated in the subsequent device fabrication process resulting in an internal conversion to an n-type semiconductor, the p/n type conversion region is located at a sufficiently deep position from the surface as illustrated in FIG. 3.

A controlled atmosphere using argon, hydrogen or a mixed gas thereof, or another mixed gas of nitrogen with a small amount of oxygen is used as a treatment atmosphere. The out-diffusion of the oxygen in a high-temperature heating is promoted using these gases, so that the p/n type conversion region can be located at the sufficiently deep position from the surface. In the case of using hydrogen, argon or a mixed gas thereof, there is an expected effect of oxygen out-diffusion as well as an effect of eliminating Crystal Originated Particle (COP) in the wafer surface layer, which makes it possible to obtain a wafer having a superior surface quality.

Although nitrogen is less expensive compared to argon and hydrogen and has advantages in cost, treatment in a nitrogen atmosphere, which also allows oxygen out-diffusion, forms a nitride film on the wafer surface, and removal of which requires an additional process. It is consequently preferred to use a mixed gas of nitrogen with about 3% of oxygen as the controlled atmosphere. However, it should be noted that in the atmosphere using the nitrogen there is no effect of eliminating the COP in the wafer surface layer.

The heat treatment is performed at a heating temperature of 1100 to 1250° C. for the heating time of 1 to 5 hours. In the case of a temperature of less than 1100° C., the oxygen out-diffusion does not easily occur, resulting in a small effect, while in the case of a temperature of 1250° C., slip dislocation can be easily generated in the wafer and the burden put on the heat treating furnace is increased, resulting in shortening of the life span of internal structural parts in the furnace. Also, in the case of a heating time of less than one hour, the p/n type conversion region cannot be located at a depth of more than the boundary depth from the wafer surface, while in the case of a heating time of more than 5 hours, the effect of the oxygen out-diffusion is to be saturated.

The wafer of the present embodiment is manufactured such that the p/n type conversion region is to be positioned at the depth apart from the device active region and the depletion layer region formed in contact therewith, for example, at a depth of more than the boundary depth from the wafer surface. Furthermore, it is preferable to perform an oxygen precipitate heat treatment so as to form BMD due to the oxygen precipitates having gettering effect sufficiently in the interior of the wafer and to reduce residual oxygen in the wafer and thereby increase the resistivity.

As the oxygen precipitate heat treatment, a second heat treatment process is performed. In detail, the silicon wafer having passed the oxygen out-diffusion heat treatment is subjected to the second heat treatment process in a heat treating furnace employing a lamp heating scheme same as the first heat treatment process under the conditions in which a temperature is increased to 1200° C., and the temperature is Maintained at 1200° C. for 1 to 2 hours in an atmosphere of argon, hydrogen or a mixed gas thereof, and is cooled; thereby, the silicon wafer of the present embodiment is obtained. Further, the second heat treatment performs a heat treatment for forming oxygen precipitate nuclei at 600 to 800° C. for 1 to 20 hours, and subsequently a heat treatment for growing oxygen precipitates at 1000 to 1100° C. for 1 to 20 hours to form BMD.

Since the heat treatments above are dependent on heating temperature and heating time, while independent on the atmosphere conditions to be used, any one of argon, hydrogen, a mixed gas thereof and nitrogen can be used. Due to advantages in cost, as mentioned above, it is preferred to use a mixed gas of nitrogen with about 3% of oxygen as an atmosphere.

In the heat treatment for forming oxygen precipitate nuclei, if the heating temperature is out of the range of 600 to 800° C., the oxygen precipitates are not easily formed; and thereby, the effect is restricted, resulting in a restriction of the effect. Also, in the case of a heating time of less than one hour, the effect cannot be exerted sufficiently, while in the case of a heating time of more than 20 hours, a further lengthening of time cannot cause any significant improvement of the effect and adds up to nothing.

Moreover, the heat treatment above can be employed as a heat treatment process in which a temperature is increased from 700° C. to 1000° C. by 1 to 2° C./min, and the temperature is maintained at 1000° C. for 0 to 6 hours in an atmosphere of argon, nitrogen or a mixed gas thereof (non-oxidizing atmosphere). Consequently, the occurrence of new donors such as oxygen donors can be prevented more effectively in a short heat treatment time.

After the heat treatment for forming the nuclei, the heat treatment for growing oxygen precipitates is performed at 1000 to 1100° C. for 1 to 20 hours. The heat treatment for growing the oxygen precipitates is performed at a heating temperature of 1000 to 1100° C., for the reason that in the case of a heating temperature of less than 1000° C., the growth of the oxygen precipitates is not promoted, while in the case of a heating temperature of more than 1100° C., the growth of the oxygen precipitates is not advanced, and further the amount of formed precipitates may be reduced due to re-solid-solubilization. Also, the heat treatment is performed for 1 to 20 hours, for the reason that in the case of a heating time of less than one hour, the growth of the oxygen precipitates is not enough, while in the case of a heating time of more than 20 hours, a further lengthening of a time causes the effect to be saturated.

As described above, according to the production method of the present embodiment, even if the p/n type conversion region due to the thermal donors is generated, the p/n type conversion region is to be located at a depth so as not to be brought into contact with either any device active region or any depletion layer region to prevent a faulty operation or n-well separation failure of a CMOS.

In this regard, after the oxygen out-diffusion heat treatment is performed, it is preferred to perform the heat treatment for forming oxygen precipitate nuclei and the heat treatment for growing oxygen precipitates if necessary. As the conditions of these treatments, there are shown examples, that is, a temperature of 1100 to 1250° C. and a time of 1 to 5 hours for the oxygen out-diffusion heat treatment, a temperature of 600 to 800° C. and a time of 1 to 20 hours for heat treatment for forming the oxygen precipitate nuclei, and a temperature of 1000 to 1100° C. and a time of 1 to 20 hours for the heat treatment for growing oxygen precipitates.

However, specified treatment conditions for each of the treatments are determined based on the wafer resistivity, the depth of a high resistivity layer, the oxygen concentration and the like, which are required according to the device fabrication conditions. Therefore, in order to generate the p/n type conversion region at a depth so as not to be brought into contact with either any device active region or any depletion layer region, the initial oxygen concentration is determined according to the following procedure, and specified treatment conditions are determined on the basis of this determination.

FIG. 13 is a diagram schematically illustrating the relationship between the amount of residual oxygen in a wafer and the density of thermal donors to be generated, using heat treatment conditions in the device fabrication process as parameters. First, the relationship between the amount of residual oxygen in a wafer and the amount of thermal donors generated for each heat treatment as illustrated in FIG. 11 or FIG. 12 in the device fabrication process is prepared as a master table, where as a heat treatment condition in the device fabrication process, a heating temperature in a range of 400 to 500° C. and a heating time of 1 to 12 hours are used for example.

Next, based on a heat treatment condition (heat treatment sequence) in the device fabrication process, the density of thermal donors to be generated from each residual amount of oxygen is calculated from the master table. Meanwhile, the allowable amount of thermal donors generated is calculated from the wafer resistance and the depth of a high resistivity layer which are defined by the specification for fabrication of devices.

The amount of residual oxygen at a target depth in a wafer is determined by the obtained allowable amount of thermal donors. To secure the determined amount of residual oxygen, the initial oxygen concentration of a wafer made of a p-type single crystal is determined, and on the basis of this determination, specified heat treatment conditions for the oxygen out-diffusion heat treatment and other treatments if necessary are determined using an oxygen precipitate heat treatment simulator.

According to the production method of the present embodiment, a wafer is manufactured such that the p/n type conversion region is generated at a depth so as not to be brought into contact with either any device active region or any depletion layer region, and after the oxygen out-diffusion heat treatment is performed, the heat treatment for forming oxygen precipitate nuclei and the heat treatment for growing oxygen precipitates are performed if necessary, so that the internal oxygen precipitates are formed more reliably, resulting in reduction in the amount of thermal donors generated.

Normally, a device fabrication heat treatment process in which oxygen donors may be generated is an interconnection sintering process. A heat treatment condition for a general sintering process is a temperature of 400° C. and a time of one hour or a temperature of 450° C. and a time of 5 hours, and the generation of thermal donors can be reduced by the heat treatment in such a device process.

Therefore, in the high resistivity p-type silicon wafer of the present embodiment, p-type conversion may occur due to the promotion of internal oxygen precipitation as well as n-type conversion in the p/n type conversion region.

According to the present embodiment, the generation of oxygen donors in the device heat treatment process can be effectively suppressed and oxygen precipitation-induced defects in the silicon wafer can be controlled in a desired state. Therefore, the silicon wafer can be formed with a sufficient mechanical strength and the oxygen precipitates can be prevented from serving as a slip dislocation source. Further, the oxygen precipitation-induced defects in the silicon wafer can be used as a recombination center in a high specific-resistance layer disposed between a P-type region and an N-type region of a high frequency diode. Therefore, the number of processing steps can be reduced without requiring a process of forming a recombination center (a recombination center of Au, Pt and the like, a recombination center due to electron irradiation-induced defects, and the like) for controlling a lifetime. In addition, sufficient gettering ability is obtained and the resistivity is not changed from a desired range by the device fabrication heat treatment. Therefore, a processing time is shortened and thereby fabrication costs can be reduced. Consequently, the wafer according to the present embodiment can be easily applied to a high-quality high-frequency diode with a low price in which the resistivity of a high specific-resistance layer is sufficiently high and noises are small.

Sixth Embodiment

Hereinafter, a silicon wafer according to the present embodiment will be described with reference to the accompanying drawings.

The silicon wafer of the present embodiment does not include a p/n type conversion region and includes a p-type region with variation in a resistivity distribution set to a range of 0 to 30% across all portions in the wafer thickness direction with respect to a reference value set to a range of 0.1 to 10 k Ωcm, and the silicon wafer of the present embodiment is manufactured by a production method including pulling a single crystal such that the single crystal has a p-type dopant concentration at which the wafer surface resistivity becomes in a range of 0.1 to 10 k Ωcm, a nitrogen concentration of $1.0 \times 10^{13}$ to $10 \times 10^{13}$ atoms/cm$^3$ (ASTM F-121, 1979) and an oxygen concentration Oi of $5.0 \times 10^{17}$ to $20 \times 10^{17}$ atoms/cm$^3$ (ASTM F-121, 1979) by using a Czochralski method, processing the single crystal into wafers by slicing the single crystal, subjecting the wafer to an oxygen out-diffusion heat treatment process in a non-oxidizing atmosphere, and subjecting the wafer to a heat treatment process for forming oxygen precipitate nuclei and/or a heat treatment process for forming oxygen precipitates.

Since the silicon wafer is manufactured by the above-described production method, when a heat treatment in a device fabrication process is performed, a resistivity distribution in the depth direction is obtained as illustrated in FIG. 4. As illustrated in FIG. 4, the silicon wafer includes a p-type region on the wafer surface and a region deeper than the p-type region, and the region deeper than the p-type region has a resistivity nearly equal to or higher than that of the p-type region. That is, in the silicon wafer of the present embodiment, there exists no region in the depth direction of the wafer, which has a resistivity lower than a resistivity set in the p-type region on the surface.

As described above, according to the present embodiment, a heat treatment, for example, is performed at 1000° C. for one hour or a heat treatment having a heating effect identical to that obtained by the above heat treatment is performed as well as an oxygen out-diffusion heat treatment process, so that it is possible to manufacture a wafer having no p/n type conversion region with a resistivity lower than the resistivity set in the surface p-type region generated in a carbon-doped wafer.

Consequently, gettering ability and a mechanical strength of a wafer are improved, so that it is possible to fabricate a low-priced high frequency diode with a high efficiency and a controllable lifetime.

High Frequency Diode Using Silicon Wafer of Fifth and Sixth Embodiments

Next, high frequency diodes to which the silicon wafers of the fifth and sixth embodiments are applied will be described.

FIG. 14 shows sectional views schematically illustrating examples of high frequency diodes fabricated from the silicon wafers of the fifth and sixth embodiments. The high frequency diode illustrated in FIG. 14(a) is a PIN diode, and includes the P-type region 12, the N-type region 11 and the high specific-resistance layer (I layer) 13 disposed between the P-type region 12 and the N-type region 11, which are formed in the silicon wafers of the fifth and sixth embodiments.

The high frequency diode illustrated in FIG. 14(a) can be fabricated by the following procedure.

First, after the silicon wafers of the fifth and sixth embodiments are prepared, boron B is diffused with a concentration of about $1\times10^{18}$ atoms/cm$^3$ at a position of about 2 μm from the wafer surface. Herein, the diffusion of boron can be performed at a temperature of about 1000° C. by using a heat diffusion method, an ion implantation method and the like.

Next, phosphorous P is diffused with a concentration of $1\times10^{18}$ atoms/cm$^3$ at a position of about 2 μm from the silicon surface diffused with boron. Herein, the diffusion of phosphorous can be performed at a temperature of about 850° C. by using a heat diffusion method, an ion implantation method and the like.

Then, an Au electrode is formed on the surface of the silicon surface through electron beam deposition, and an Al electrode is formed on the rear surface of the silicon surface through the electron beam deposition.

Thereafter, the diode is cut from the silicon wafer so that mesa etching is performed, and silicon resin is coated on an etched surface after the mesa etching (a passivation process for an end surface).

FIG. 14(b) is a sectional view schematically illustrating another example of high frequency diodes fabricated from the silicon wafers of the fifth and sixth embodiments.

The high frequency diode illustrated in FIG. 14(b) is an IMPATT diode, and includes the p+ layer 22, the n+ region 21, the high specific-resistance layer (I layer) 23, and the n layer 24 disposed between the P+ layer 22 and the high specific-resistance layer (I layer) 23, which are formed in the silicon wafers of the fifth and sixth embodiments. The IMPATT diode is an oscillating element using a negative resistor. In the IMPATT diode, carriers generated by impact ionization in a semiconductor are moved at a saturation drift velocity. At this time, a phase difference of π/2 occurs between the phase of current generated by the generated carriers and an applied voltage, and an effective resistance component becomes negative, that is, negative resistance appears.

The high frequency diode illustrated in FIG. 14(b) can be fabricated by forming the p+ layer 22, the n+ region 21, the high specific-resistance layer (I layer) 23, and the n layer 24 in the silicon wafer by using a method equal to that used for fabricating the PIN diode.

FIG. 14(c) is a sectional view schematically illustrating another example of high frequency diodes fabricated from the silicon wafers of the fifth and sixth embodiments.

The high frequency diode illustrated in FIG. 14(c) is an IMPATT diode, and includes the p+ layer 31, the n+ region 32, the high specific-resistance layer (I layer) 33, and the p layer 34 disposed between the n+ layer 32 and the high specific-resistance layer (I layer) 33, which are formed in the silicon wafers of the fifth and sixth embodiments.

The high frequency diode illustrated in FIG. 14(c) can be fabricated by forming the p+ layer 31, the n+ region 32, the high specific-resistance layer (I layer) 33, and the p layer 34 in the silicon wafer by using a method equal to that used for fabricating the PIN diode.

Next, an energy diagram of the PIN diode illustrated in FIG. 14(a) will be described.

Figure 25:
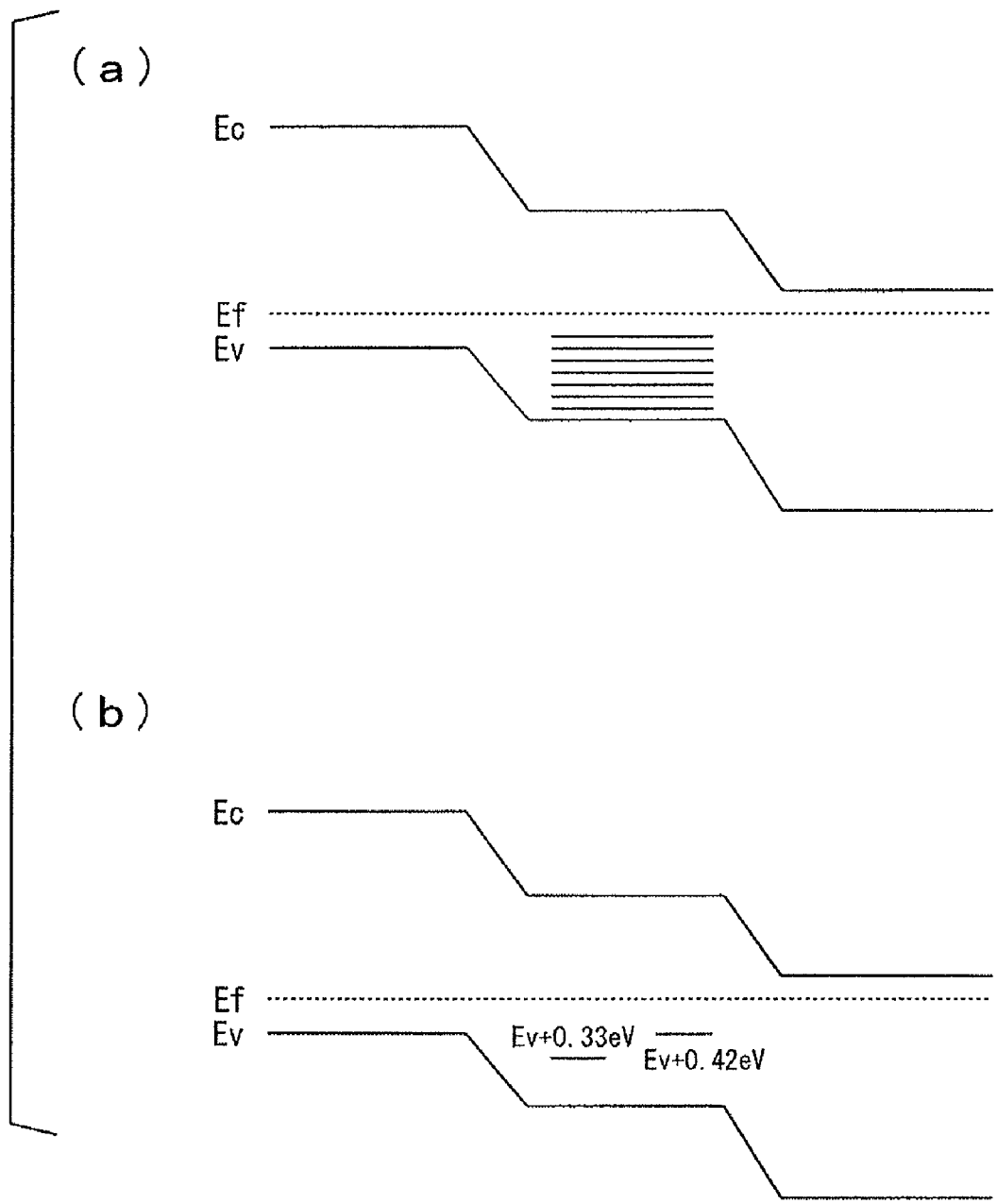
FIG. 25 shows diagrams illustrating an energy diagram of a PIN diode.

FIG. 25 shows diagrams illustrating the energy diagram of the PIN diode. FIG. 25(a) illustrates the energy diagram of the PIN diode illustrated in FIG. 14(a) and FIG. 25(b) illustrates the energy diagram of an existing PIN diode in which a heavy metal is thermally diffused as a recombination center. In FIG. 25, reference number Ec indicates the energy of the bottom of a conduction band, reference number Ef indicates a Fermi level and reference number Ev indicates the energy of the top of a valence band.

As illustrated in FIG. 25, in the existing PIN diode, a switching velocity strongly depends on the activation energy of a deep energy level of a thermally diffused heavy metal, the capture cross section area and the concentration of the heavy metal. For example, as illustrated in FIG. 25(b), in the case of thermally diffusing Pt as a heavy metal, a deep energy level of Ev+0.33 eV is formed so that a lifetime is determined. Further, for example, as illustrated in FIG. 25(b), in the case of thermally diffusing Au and Pt as a heavy metal, a deep energy level of Ev+0.42 eV is formed so that a lifetime is determined.

Compared to this, as illustrated in FIG. 25(a), in the PIN diode fabricated from the silicon wafers of the present embodiments, a deep energy level introduced by BMD in the silicon wafer is continuously formed from the energy Ev of the top of the valence band to the Fermi level Ef. Therefore, as compared with the existing PIN diode illustrated in FIG. 25(b), a lifetime can be controlled in a wide range and the degree for a control width of a switching velocity is increased.

Seventh Embodiment

Hereinafter, a silicon wafer according to the present embodiment will be described with reference to the accompanying drawings.

Figure 23:
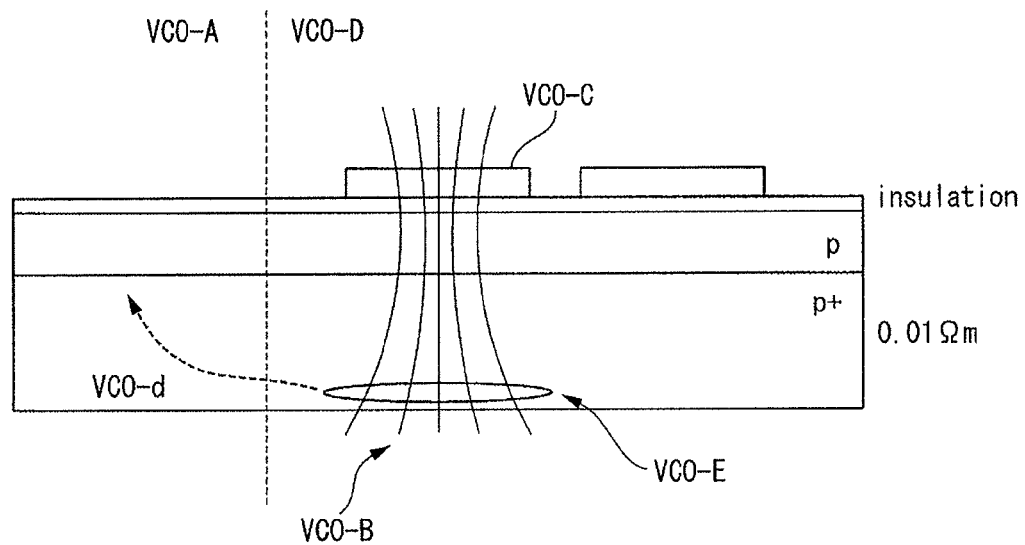
FIG. 23 is a sectional view schematically illustrating one example of a voltage controlled oscillator fabricated from a silicon wafer of the present invention.

The silicon wafer of the present embodiment is a wafer supplied to an oscillator for voltage control in a transmission/reception circuit of a wireless device such as a cell phone as illustrated in FIG. 23, which is obtained by a production method for pulling a p+ type ingot to have a carbon concentration of $0.5\times10^{16}$ to $50\times10^{16}$ atoms/cm$^3$ (ASTM F-123, 1981), an interstitial oxygen concentration of $6.5\times10^{17}$ to $13.5\times10^{17}$ atoms/cm$^3$ (ASTM F-121, 1979), and a resistivity of 100 Ωcm or more, and slicing the p+ type ingot.

In detail, in order to manufacture the silicon wafer, a silicon single crystal with a resistivity of 100 Ωcm or more, an interstitial oxygen concentration of $8.0\times10^{17}$ to $16.0\times10^{17}$ atoms/cm$^3$ (ASTM F-121, 1979), and a carbon concentration of $0.5\times10^{16}$ to $50\times10^{16}$ atoms/cm$^3$ (ASTM F-123, 1981) is grown by the CZ method (single crystal growth process). At this time, pulling conditions such as the crucible rotation number, the type and flow rate of introduced gas, applied magnetic field condition, or temperature distribution and convection of molten silicon liquid are appropriately controlled, so that the above-described silicon single crystal can be grown.

Next, similarly to the above-described fifth embodiment, the silicon single crystal is sliced, and a process such as chamfering, lapping, etching or polishing is performed if necessary.

Then, a p-type layer with a resistivity of 100 Ωcm or more is epitaxially grown on the surface to form a p/p+ type wafer.

The obtained silicon wafer is subjected to a heat treatment process in a heat treating furnace employing a lamp heating scheme similarly to the above-described fifth and sixth embodiments.

Consequently, it is possible to obtain a wafer, in which resistivity is not reduced, by using a sintering heat treatment process in a device fabrication heat treatment. Therefore, when the wafer is supplied to a device fabrication process for fabricating an oscillator for voltage control in a transmission/reception circuit of a wireless device such as a cell phone as illustrated in FIG. 23.

Figure 24:
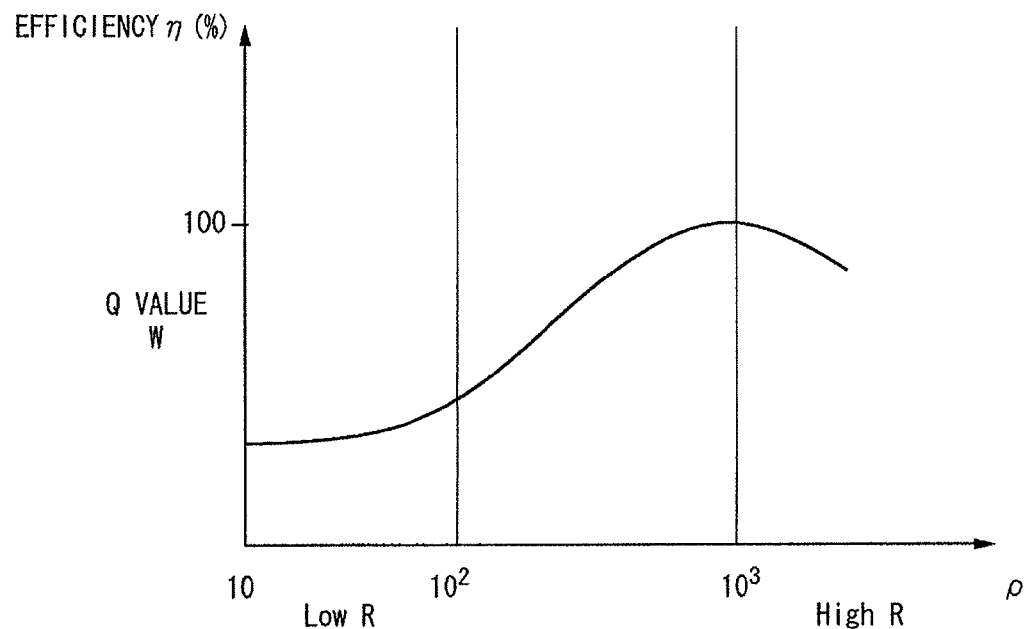
FIG. 24 is a graph illustrating the relationship between a resistivity $\rho$ of a wafer and efficiency $\eta$.

In addition, as compared with a low resistivity wafer, efficiency η can be improved as illustrated in FIG. 24.

EXAMPLES

Example 1

As an example of the present invention, a silicon single crystal doped with boron and nitrogen was pulled by the CZ method. Ingots were cut from parts (e.g., top and tail) of the silicon single crystal, which have different nitrogen concentrations. The different ingots are sliced to prepare a plurality of wafers. Table 1 shows oxygen concentrations, resistivity and nitrogen concentrations of the wafers.

Further, for comparison, a wafer doped with carbon with a concentration as shown in Table 1 was prepared.

Table 1 shows upper limit values and lower limit values of the oxygen concentrations, the resistivity and the nitrogen concentrations of the ingots from which the wafers are cut.

TABLE 1

|  | N (Top)-dope | N (Tail)-dope | C-dope |
|---|---|---|---|
| [Oi] ($\times 10^{17}$ atoms/cm$^3$) | 14.57 to 14.99 | 15.64 to 16.63 | 15.05 to 12.24 |
| [ρ] (Ωcm) | 1905 to 910 | 714 to 800 | 611.8 to 591.6 |
| [Cs] ($\times 10^{16}$ atoms/cm$^3$) |  |  | 1.37 |
| [N] ($\times 10^{13}$ atoms/cm$^3$) | 3.98 to 4.26 | 7.64 to 8.92 |  |

After a heat treatment of 1200° C. for one hour was performed on these wafers as AN1, a resistivity distribution in the depth direction was obtained through spreading resistance measurement. The result is shown in FIG. 3.

As is clear from the result thereof, the peak of a resistivity serving as a p/n conversion boundary is sequentially 30 μm, 38 μm and 45 μm in the depth direction in the sequence of C-dope (doped with carbon), N (Top)-dope with a low nitrogen concentration, and N (Tail)-dope with a high nitrogen concentration.

After a heat treatment of (1200° C. for one hour+1000° C. for 6 hours) was performed on these wafers as AN2, a resistivity distribution in the depth direction was obtained through spreading resistance measurement. The result is shown in FIG. 4.

As is clear from the result thereof, the resistivity peak is 20 μm in the case of the C-dope (doped with carbon), and no region where resistivity is reduced exists in the depth direction in the case of the N-dopes (doped with nitrogen), as compared with a p-type region of a surface layer.

Figure 5:
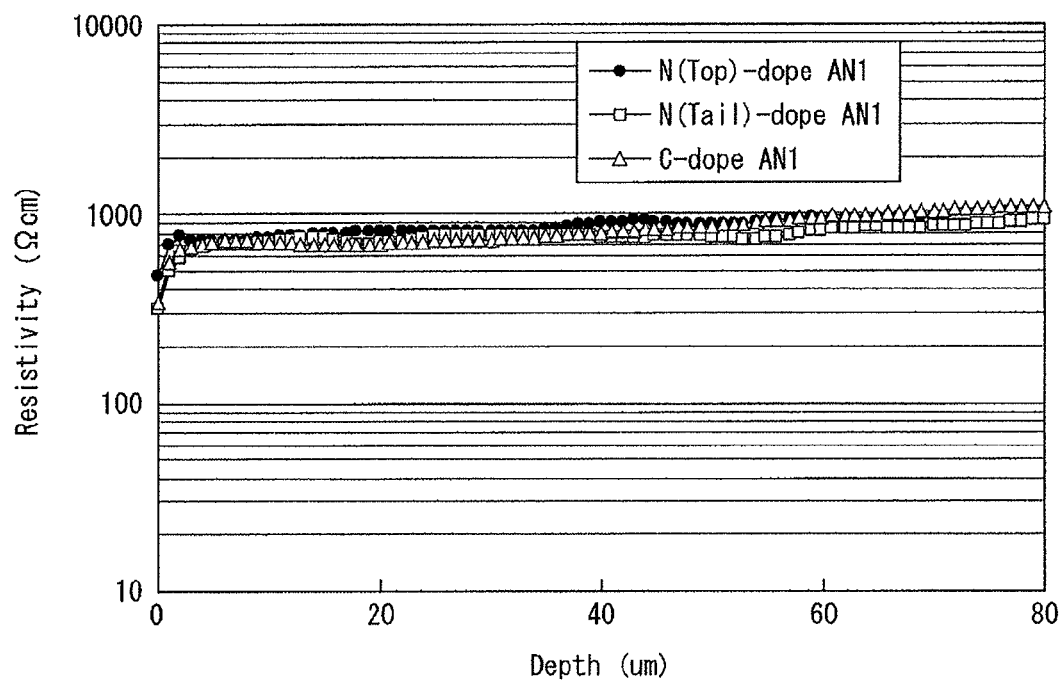
FIG. 5 is a graph illustrating a resistivity distribution in a wafer depth direction after an annealing process according to example 1 of a method for manufacturing a silicon wafer of the present invention.

After a heat treatment of 1200° C. for one hour as AN1 and subsequently a heat treatment of 650° C. for 30 minutes were performed on these wafers, a resistivity distribution in the depth direction was obtained through spreading resistance measurement. The result is shown in FIG. 5.

As is clear from the result thereof, any one of the C-dope (doped with carbon), the N (Top)-dope with a low nitrogen concentration, and the N (Tail)-dope with a high nitrogen concentration is formed with a resistivity, which is nearly equal to that of the p-type region of the surface layer, in the depth direction, and no region where resistivity is reduced exists in the depth direction.

Figure 6:
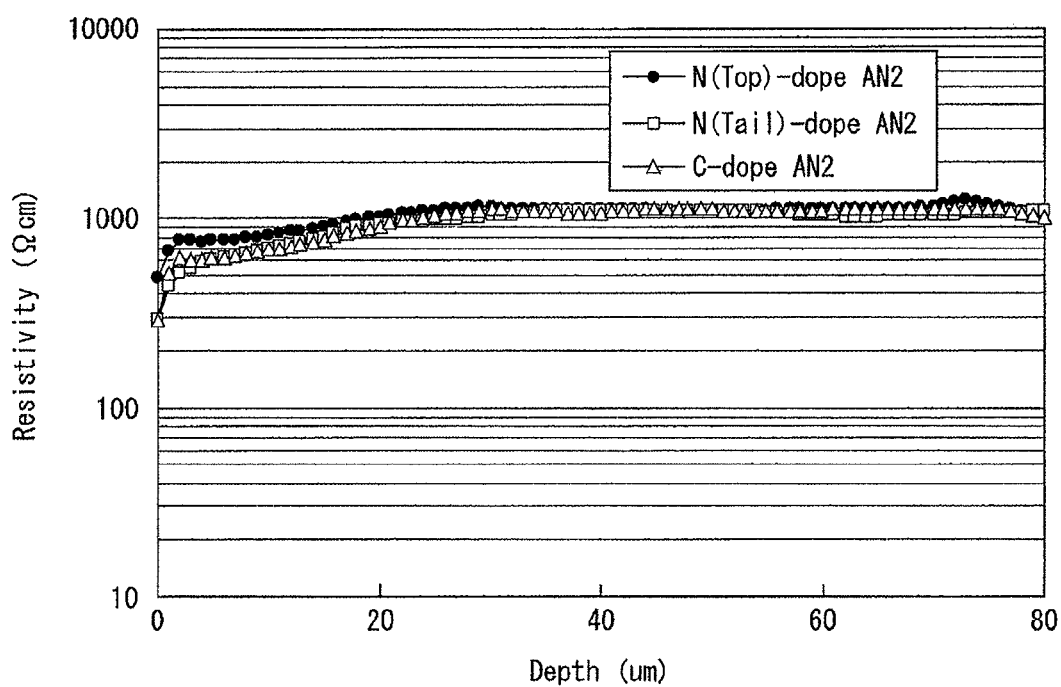
FIG. 6 is a graph illustrating a resistivity distribution in a wafer depth direction after an annealing process according to example 1 of a method for manufacturing a silicon wafer of the present invention.

After a heat treatment of (1200° C. for one hour+1000° C. for 6 hours) as AN2 and subsequently a heat treatment of 650° C. for 30 minutes were performed on these wafers, a resistivity distribution in the depth direction is obtained through spreading resistance measurement. The result is shown in FIG. 6.

As is clear from the result thereof, any one of the C-dope (doped with carbon), the N (Top)-dope with a low nitrogen concentration, and the N (Tail)-dope with a high nitrogen concentration is formed with a resistivity, which is nearly equal to that of the p-type region of the surface layer, in the depth direction, and no region where resistivity is reduced exists in the depth direction.

Figure 7:
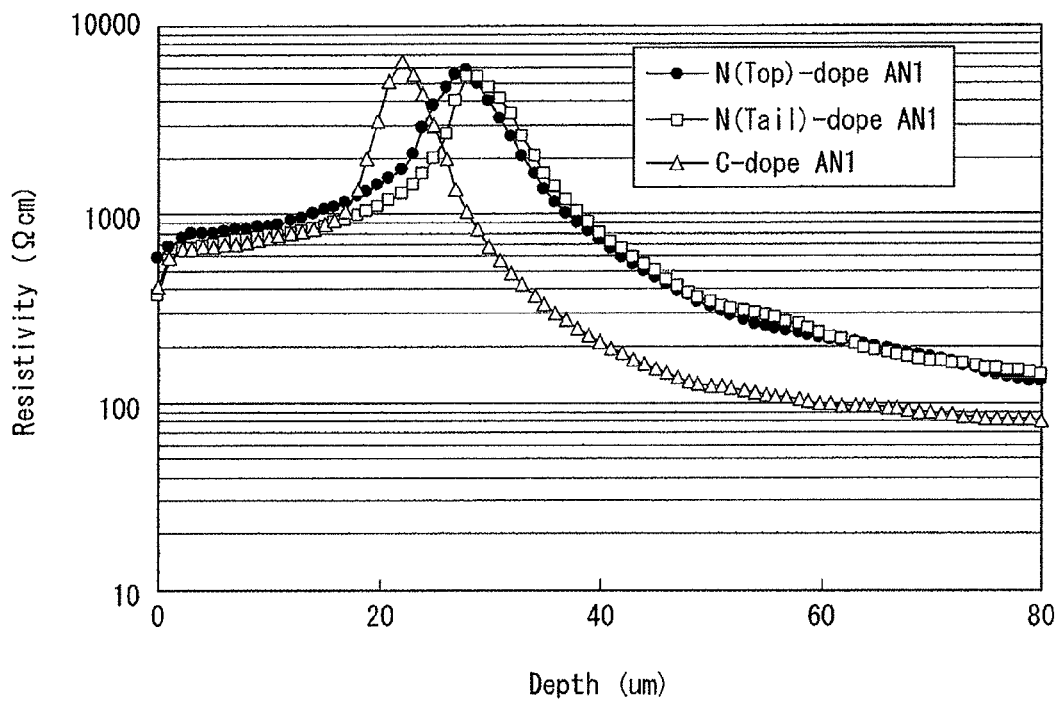
FIG. 7 is a graph illustrating a resistivity distribution in a wafer depth direction after an annealing process according to example 1 of a method for manufacturing a silicon wafer of the present invention.

After a heat treatment of 1200° C. for one hour as AN1 and subsequently a heat treatment of (650° C. for 30 minutes+ 400° C. for one hour) were performed on these wafers, a resistivity distribution in the depth direction is obtained through spreading resistance measurement. The result is shown in FIG. 7.

As is clear from the result thereof, the peak of a resistivity serving as a p/n conversion boundary is sequentially 20 μm, 30 μm and 31 μm in the depth direction in the sequence of the C-dope (doped with carbon), the N (Top)-dope with a low nitrogen concentration, and the N (Tail)-dope with a high nitrogen concentration. Also, as compared with the C-dope (doped with carbon), in the case of the N (Top)-dope with a low nitrogen concentration and the N (Tail)-dope with a high nitrogen concentration, reduction in the resistivity is alleviated in a deep part.

Figure 8:
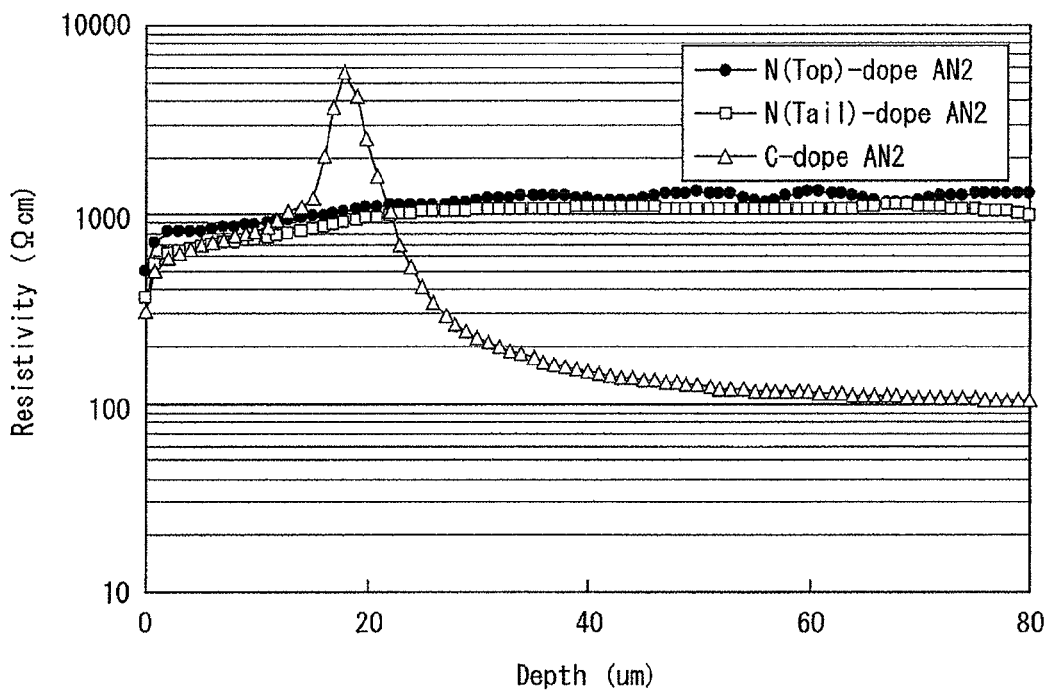
FIG. 8 is a graph illustrating a resistivity distribution in a wafer depth direction after an annealing process according to example 1 of a method for manufacturing a silicon wafer of the present invention.

After a heat treatment of (1200° C. for one hour+1000° C. for 6 hours) as AN2 and subsequently a heat treatment of (650° C. for 30 minutes+400° C. for one hour) were performed on these wafers, a resistivity distribution in the depth direction is obtained through spreading resistance measurement, which is shown in FIG. 8.

As is clear from the result thereof, the resistivity peak is 20 μm in the case of the C-dope (doped with carbon), and no region where resistivity is reduced exists in the depth direction in the case of the N-dopes (doped with nitrogen), as compared with the p-type region of the surface layer.

Figure 9:
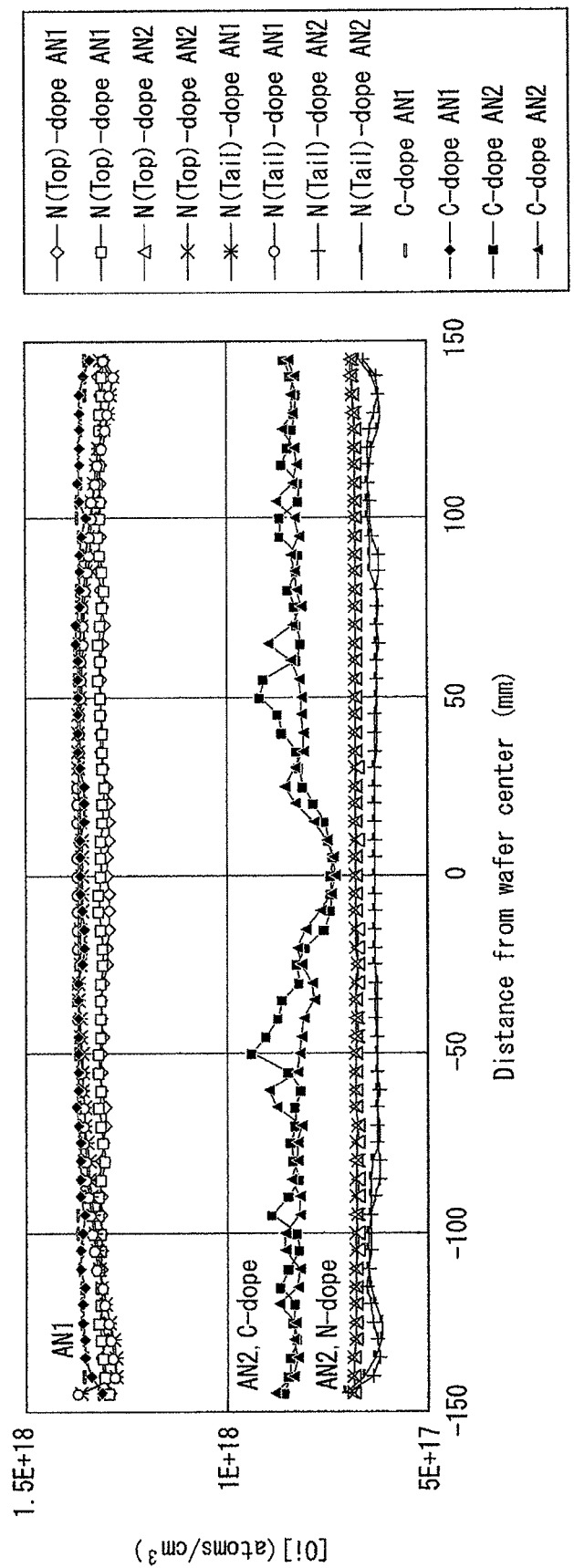
FIG. 9 is a graph illustrating the concentration of residual oxygen in the wafer surface after an annealing process according to example 1 of a method for manufacturing a silicon wafer of the present invention.

FIG. 9 illustrates the concentration of residual oxygen after a heat treatment of 1200° C. for one hour is performed as AN1 on the C-dope (doped with carbon), the N (Top)-dope with a low nitrogen concentration, and the N (Tail)-dope with a high nitrogen concentration, and the concentration of residual oxygen after a heat treatment of (1200° C. for one hour+ 1000° C. for 6 hours) is performed as AN2 on them. The oxygen concentration is measured by infrared absorption measurement (FT-IR).

As is clear from the result thereof, as compared with the C-dope (doped with carbon), in the case of the N (Top)-dope with a low nitrogen concentration and the N (Tail)-dope with a high nitrogen concentration, the concentration of residual oxygen is further reduced in AN2 in which a heat treatment time is lengthened.

Figure 10:
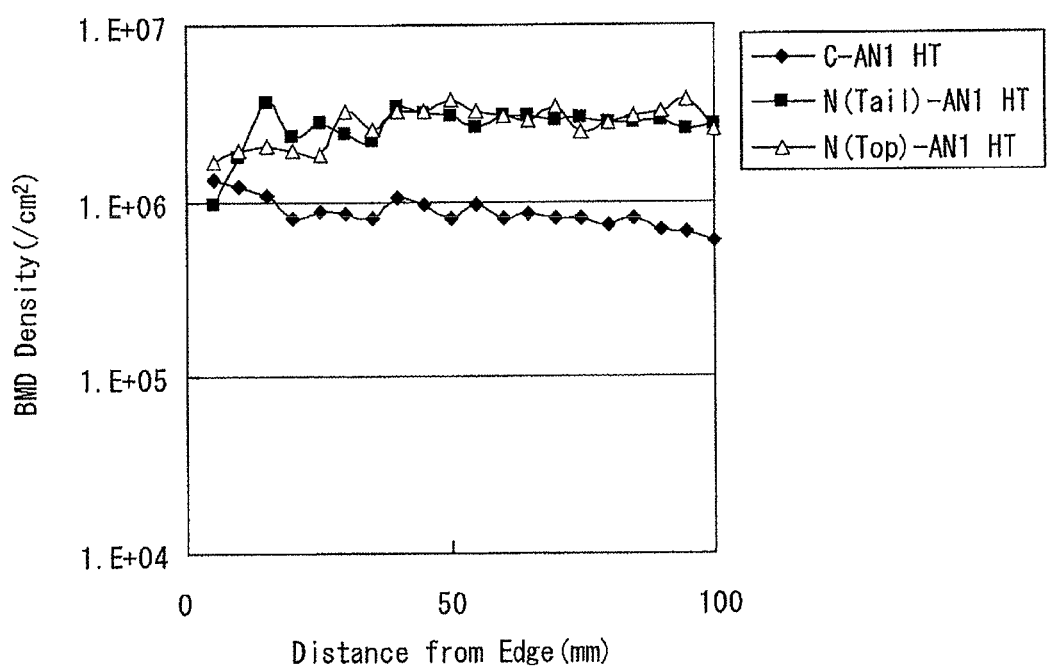
FIG. 10 is a graph illustrating the density of BMD (oxygen precipitates) in the wafer surface after an annealing process according to example 1 of a method for manufacturing a silicon wafer of the present invention.

Similarly to the above, for the C-dope (doped with carbon), the N (Top)-dope with a low nitrogen concentration and the N (Tail)-dope with a high nitrogen concentration, a wafer after a heat treatment of 1200° C. for one hour as AN1, and a wafer after a heat treatment of (1200° C. for one hour+1000° C. for 6 hours) as AN2 were further subjected to a heat treatment of (780° C. for 3 hours+1000° C. for 16 hours). Then, the density of BMD generated is measured and illustrated in FIG. 10. The density measurement is performed by observing the wright-etched cross-section through an optical microscope.

As is clear from the result thereof, as compared with the C-dope (doped with carbon), in the case of the N (Top)-dope with a low nitrogen concentration and the N (Tail)-dope with a high nitrogen concentration, the BMD is increased in AN2 in which a heat treatment time is lengthened.

Example 2

As an example of the present invention, a silicon single crystal doped with boron and nitrogen is pulled by the CZ method. Ingots were cut from parts (e.g., top and tail) of the silicon single crystal, which have different nitrogen concentrations. The different ingots were sliced to prepare a plurality of wafers. Table 2 shows oxygen concentrations, resistivity and carbon concentrations of the wafer samples.

Further, a wafer doped with nitrogen with a concentration written Table 2 is prepared.

Table 2 shows average values of the oxygen concentrations, the resistivity, the carbon concentrations and the nitrogen concentrations of the ingots from which the wafers were cut.

TABLE 2

| | Impurity addition | Initial oxygen concentration (atoms/cm$^3$) | Initial carbon concentration (atoms/cm$^3$) | Initial nitrogen concentration (atoms/cm$^3$) | pn junction |
|---|---|---|---|---|---|
| HR-1 | C-dope | $1.40 \times 10^{18}$ | $2.00 \times 10^{16}$ | | existence |
| HR-2 | C-dope | $1.40 \times 10^{18}$ | $2.00 \times 10^{16}$ | | absence |
| HR-3 | N-dope | $1.40 \times 10^{18}$ | | $1.00 \times 10^{13}$ | existence |
| HR-4 | N-dope | $1.40 \times 10^{18}$ | | $1.00 \times 10^{13}$ | existence |

Figure 15:
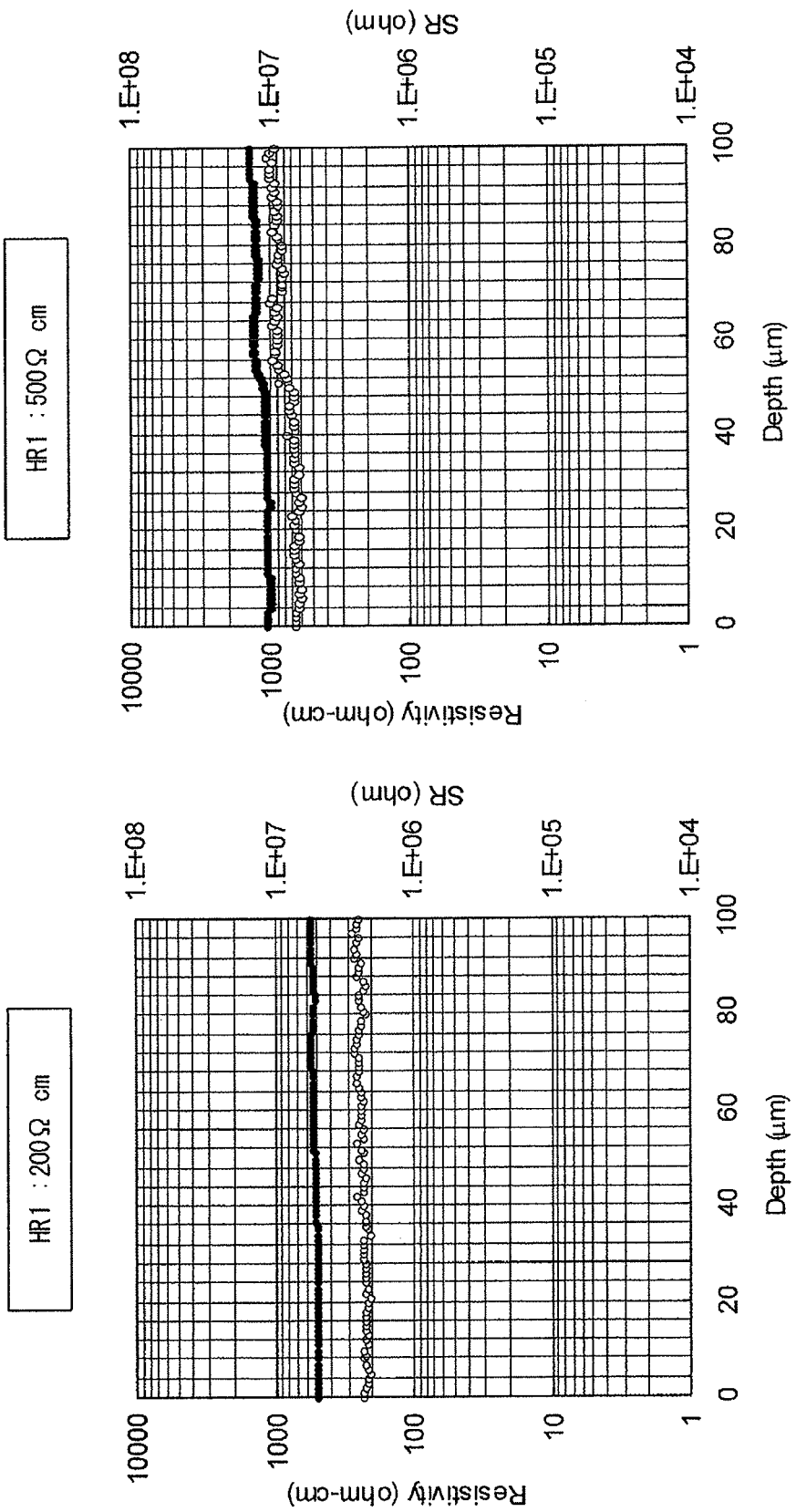
FIG. 15 is a graph illustrating a resistivity distribution in a wafer depth direction after an annealing process according to example 2 of a method for manufacturing a silicon wafer of the present invention.

After the wafer samples HR-1 shown in Table 2 were subjected to a heat treatment of 1200° C. for one hour as AN1, and then were further subjected to a heat treatment of (1200° C. for one hour+1000° C. for 6 hours) as AN2, a resistivity distribution in the depth direction is obtained through spreading resistance measurement, which is shown in FIGS. 15 and 16.

FIG. 15 shows resistivity distributions of wafers just after the heat treatment (oxygen out-diffusion heat treatment+oxygen precipitate heat treatment). Since oxygen donors are not generated just after the heat treatment, p-type is maintained, and the resistivity distribution in the thickness direction is not changed and peaks showing p/n type conversion region are not observed.

As is clear from the result shown in FIG. 16, a resistivity peak exists at or in the vicinity of 48 μm in the case of the wafer samples HR-1 (200 Ωcm), and a resistivity peak exists at or in the vicinity of 30 μm in the case of the wafer samples HR-1 (500 Ωcm), so no region where resistivity is reduced exists in the depth direction.

Figure 17:
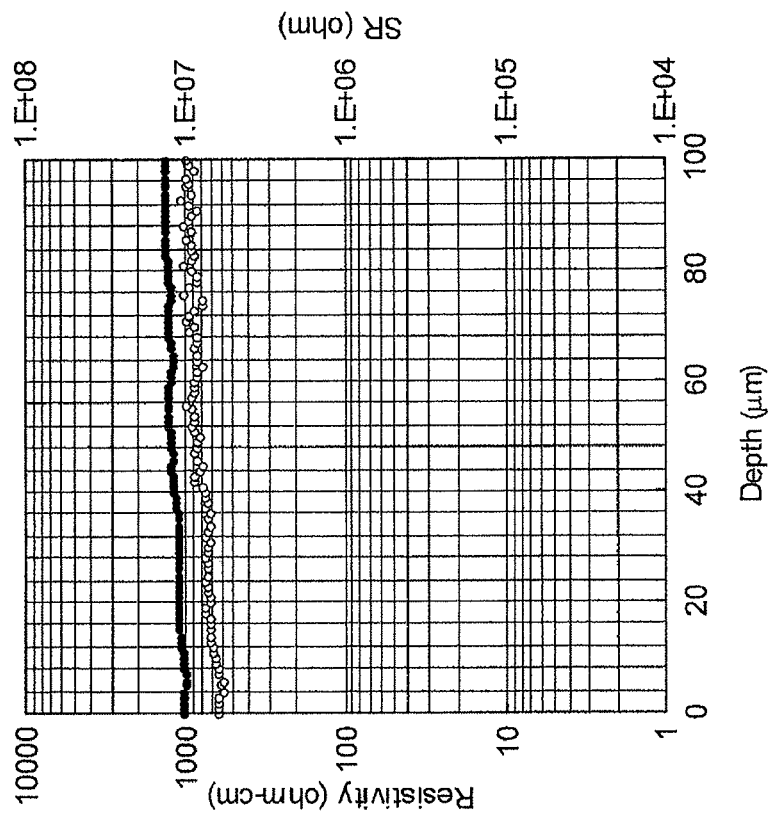
FIG. 17 is a graph illustrating a resistivity distribution in a wafer depth direction after an annealing process according to example 2 of a method for manufacturing a silicon wafer of the present invention.
Figure 17:
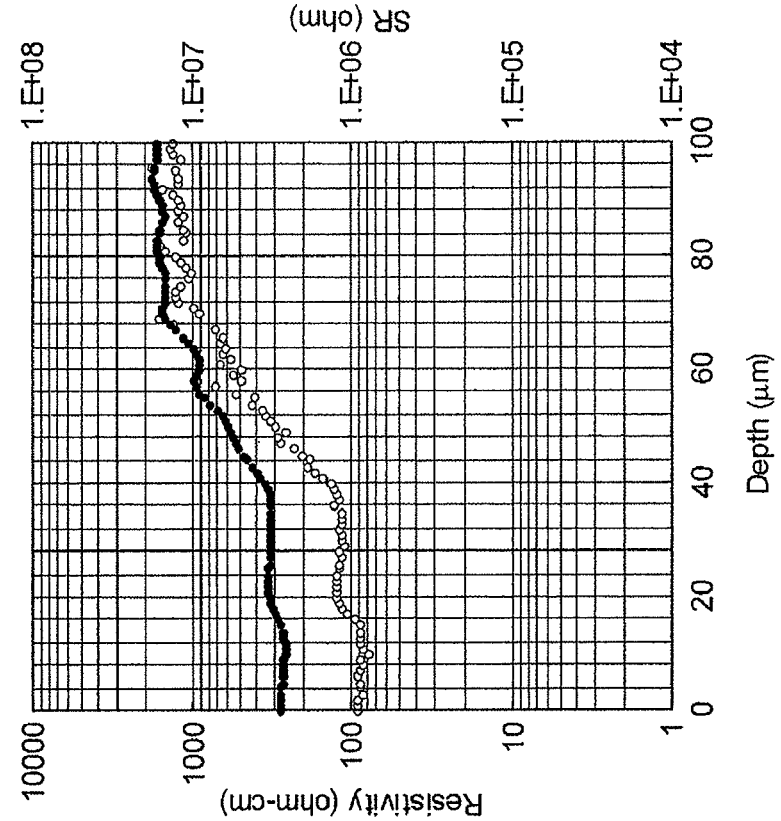

Next, after the wafer samples HR-2 shown in Table 2 were subjected to a heat treatment of 1200° C. for one hour as AN1, a resistivity distribution in the depth direction is obtained through spreading resistance measurement, which is shown in FIG. 17.

Figure 18:
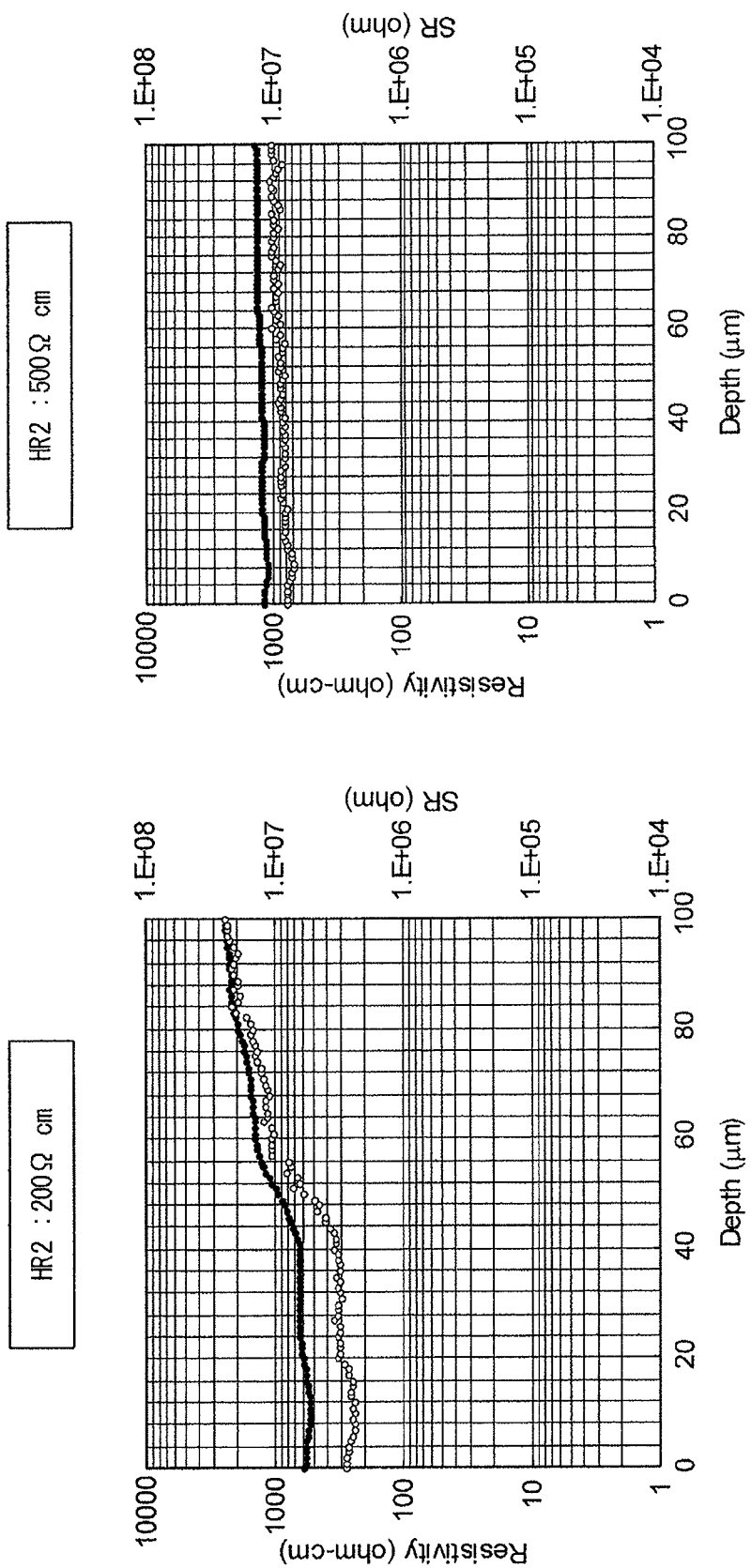
FIG. 18 is a graph illustrating a resistivity distribution in a wafer depth direction after an annealing process according to example 2 of a method for manufacturing a silicon wafer of the present invention.

Then, after the wafer samples HR-2 were further subjected to a heat treatment of (1200° C. for one hour+1000° C. for 6 hours) as AN2, a resistivity distribution in the depth direction is obtained through spreading resistance measurement, which is shown in FIG. 18.

As is clear from the result thereof, no region where resistivity is reduced exists in the depth direction.

Figure 19:
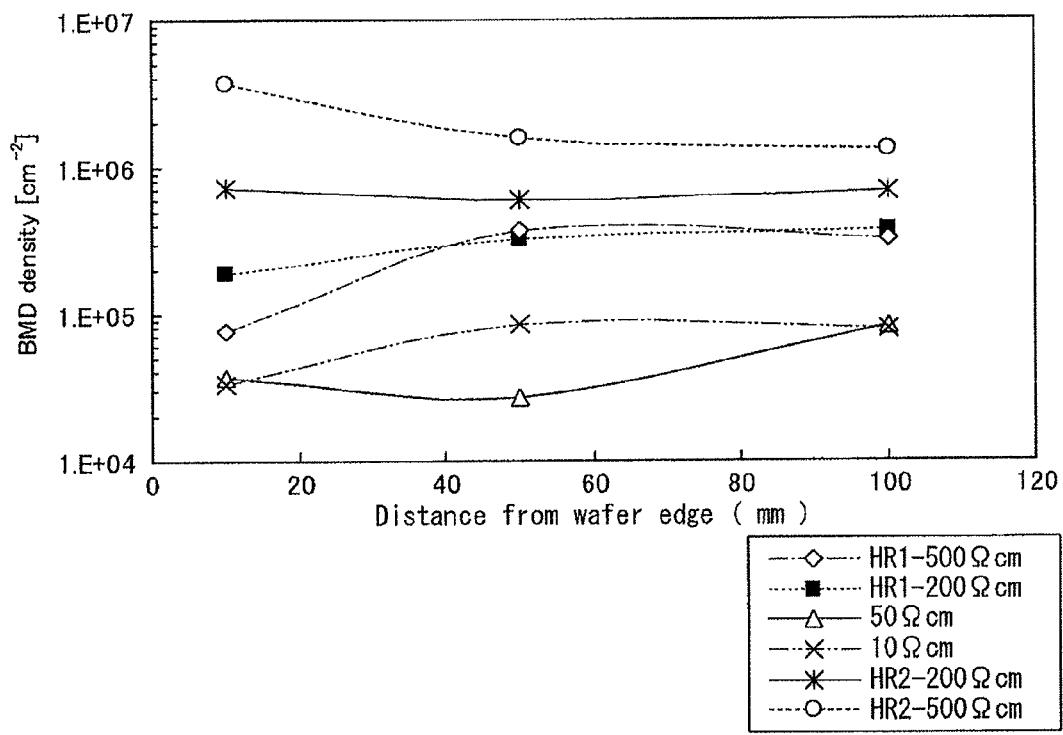
FIG. 19 is a graph illustrating a resistivity distribution in a wafer depth direction after an annealing process according to example 2 of a method for manufacturing a silicon wafer of the present invention.

Next, the BMD densities of six types of samples having resistivity different from each other were measured in a range of 10 to 100 mm from the wafer edge to the center, which is shown in FIG. 19. As is clear from the result thereof, the sample HR-2 (200 Ωcm) has a high BMD density as compared with the sample HR-1 (500 Ωcm), while an existing product with a resistivity of 50 Ωcm and 10 Ωcm has a low BMD density.

Figure 20:
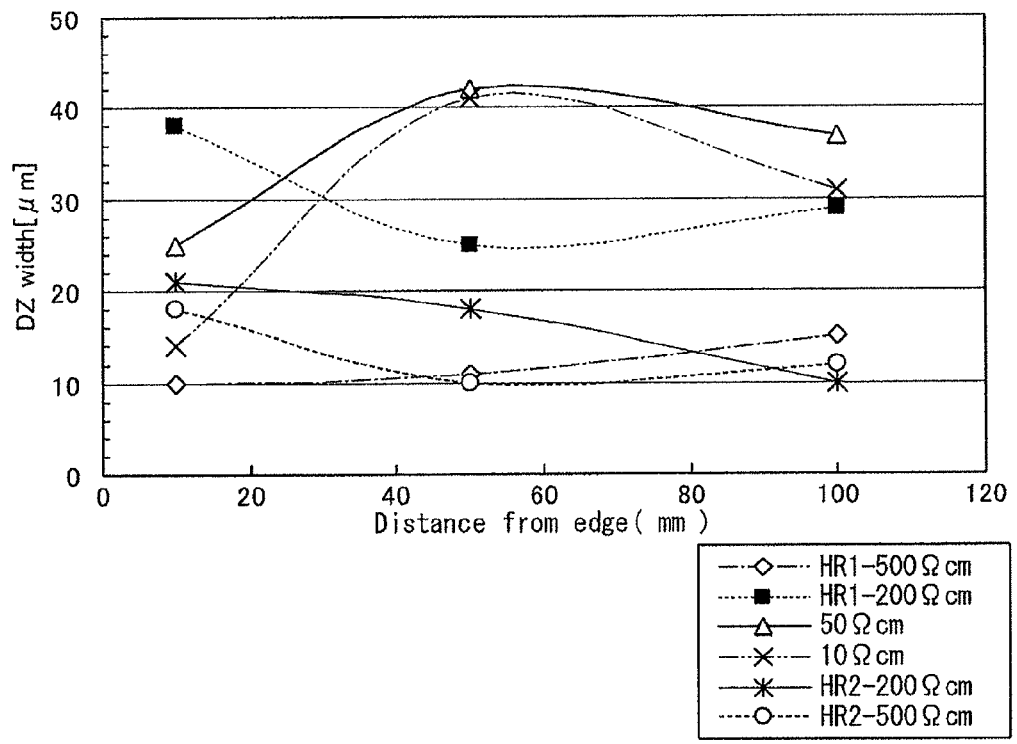
FIG. 20 is a graph illustrating a resistivity distribution in a wafer depth direction after an annealing process according to example 2 of a method for manufacturing a silicon wafer of the present invention.

Then, the DZ (Denuded Zone) widths of six types of samples having resistivity different from each other were measured in a range of 10 to 100 mm from the wafer edge to the center, which is shown in FIG. 20. As is clear from the result thereof, the sample HR-2 (500 Ωcm), the sample HR-1 (500 Ωcm) and the sample HR-2 (200 Ωcm) can be particularly formed with a small DZ width. For the DZ width, in terms of a gettering ability, it is preferred that an IG source is adjacent to an active region for device generation if possible, that is to say, the DZ width is narrow if possible.

Figure 21:
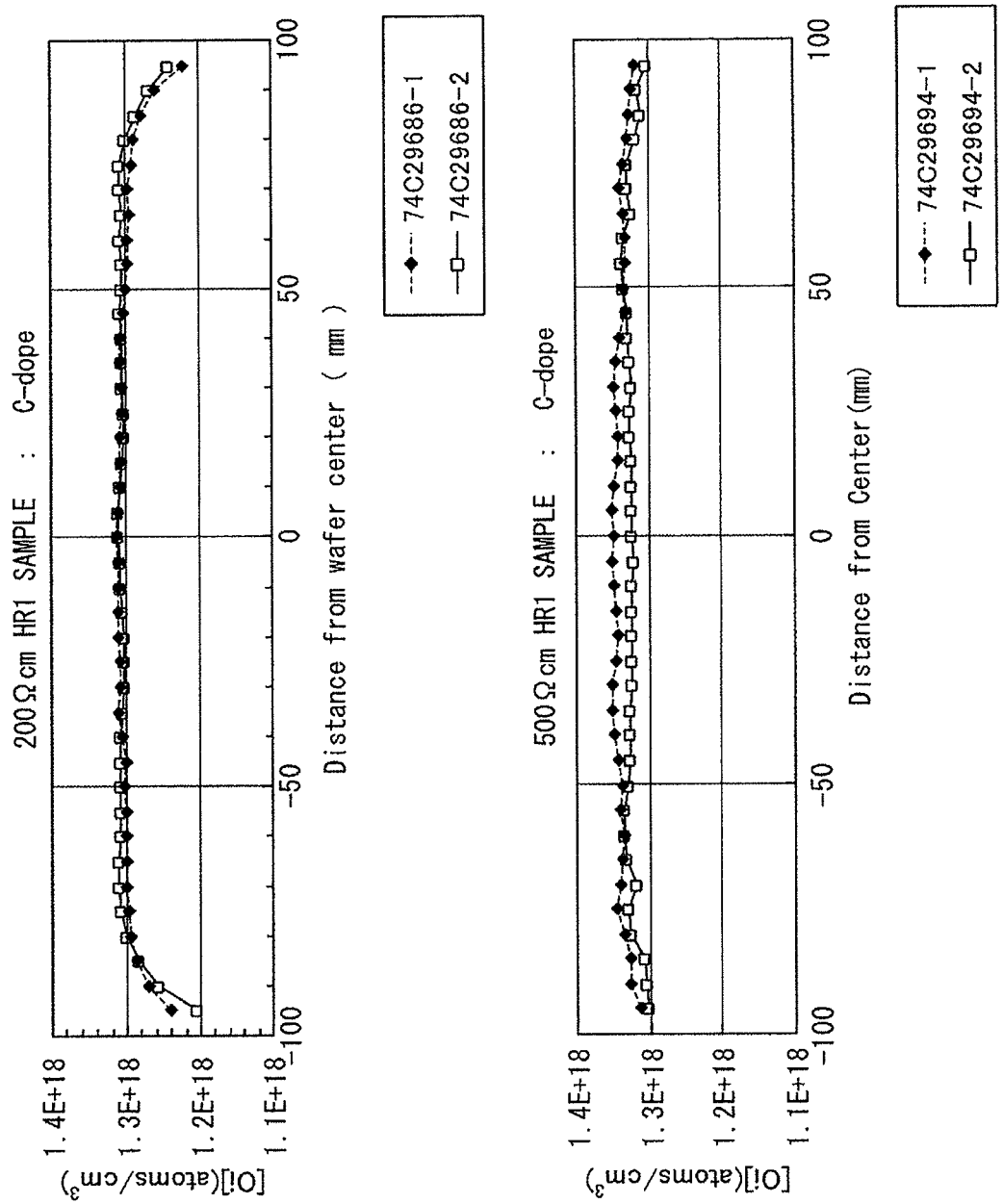
FIG. 21 is a graph illustrating the concentration of residual oxygen in the wafer surface after an annealing process according to example 2 of a method for manufacturing a silicon wafer of the present invention.

Next, the concentration of residual oxygen after the wafer samples HR-1 (200 Ωcm) and HR-1 (500 Ωcm) shown in Table 2 were subjected to a heat treatment was measured. The result is shown in FIG. 21. The oxygen concentration is measured by infrared absorption measurement (FT-IR).

Figure 22:
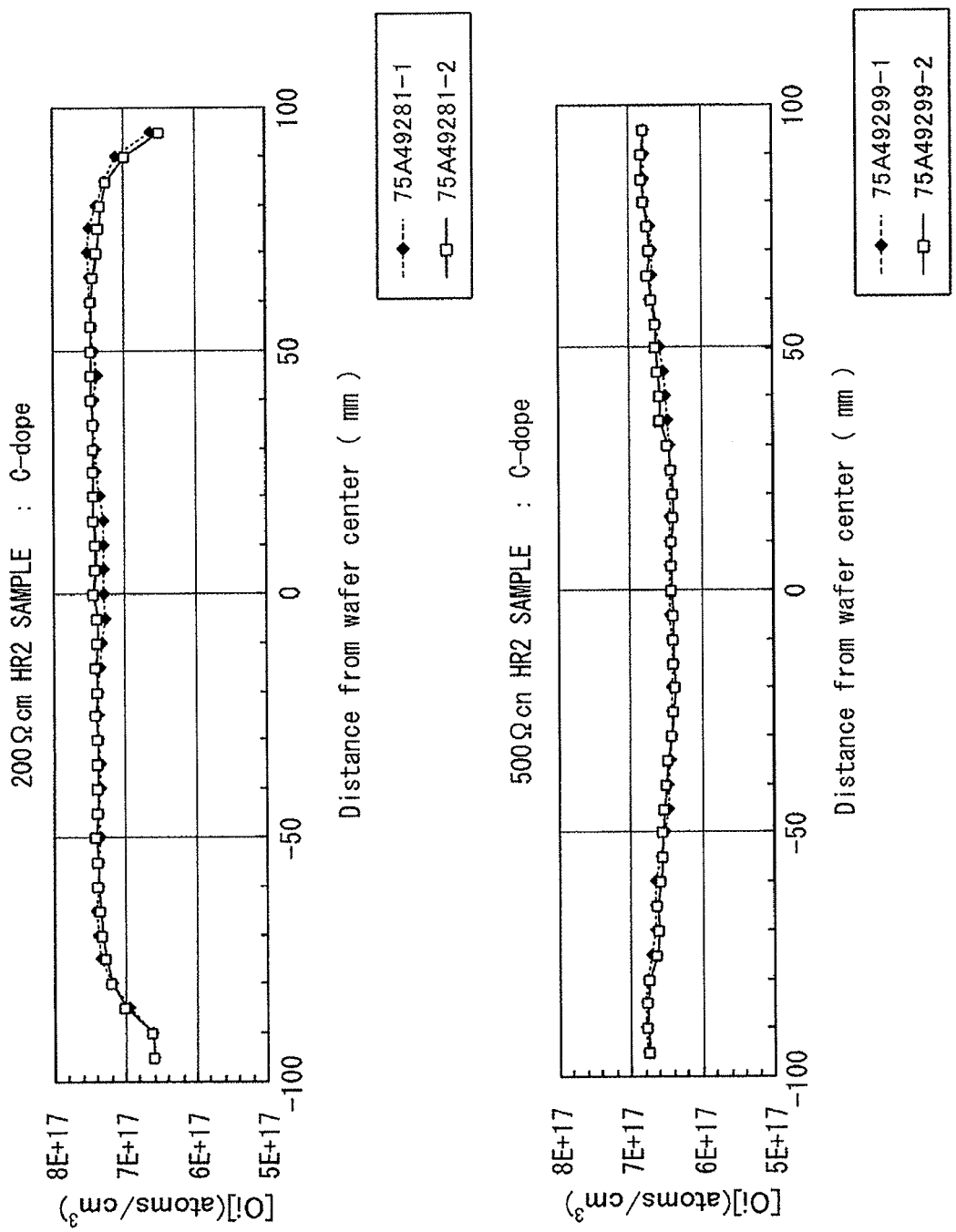
FIG. 22 is a graph illustrating the density of BMD (oxygen precipitates) in the wafer surface after an annealing process according to example 2 of a method for manufacturing a silicon wafer of the present invention.

Similarly to this, the concentration of residual oxygen after the wafer samples HR-2 (200 Ωcm) and HR-2 (500 Ωcm) shown in Table 2 were subjected to a heat treatment is measured. The result is shown in FIG. 22.

Example 3

In addition, as an example, after a VCO (voltage controlled oscillator) is fabricated using the high resistivity silicon wafer obtained in the present invention, a Q value (quality factor), which is an evaluation index of power loss, is measured. At this time, evaluation is performed for an effect exerted on power loss in a high resistivity wafer (500 Ωcm) and a normal wafer (10 Ωcm).

As a result of the evaluation, it can be proved that the VCO fabricated using the high resistivity wafer has an improved Q value corresponding to about three times in a frequency band of 60 GHz as compared with a normal resistivity. It is considered that the above effect is caused by suppression of noise propagation (propagation of noise current) in a deep region of a substrate, resulting from the use of the high resistivity silicon substrate.

INDUSTRIAL APPLICABILITY

According to the high resistivity silicon wafer of the present invention, there occur no problems such as faulty characteristics or n-well separation failure when devices such as CMOS are formed on the surface. Further, power loss can be reduced in terms of device properties. Consequently, the high resistivity silicon wafer of the present invention can be easily used as a wafer for fabricating a device such as an oscillator for voltage control in a transmission/reception circuit of a wireless device such as a high frequency diode or a cell phone.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A method for manufacturing a high resistivity silicon wafer where a depth range of a p/n type conversion occurrence region from a wafer surface can be adjusted, the method comprising:

pulling a single crystal such that the single crystal has a p-type dopant concentration at which a wafer surface resistivity becomes in a range of 0.1 to 10 k Ωcm, an oxygen concentration Oi of $5.0 \times 10^{17}$ to $20 \times 10^{17}$ atoms/cm$^3$ (ASTM F-121, 1979), and a nitrogen concentration of $1.0 \times 10^{13}$ to $10 \times 10^{13}$ atoms/cm$^3$ (ASTM F-121, 1979) by using a Czochralski method;

processing the single crystal into wafers by slicing the single crystal; and subjecting the wafer to an oxygen out-diffusion heat treatment process in a non-oxidizing atmosphere, wherein a peak position of a resistivity serving as a boundary between a p-type region of a wafer surface side and a p/n conversion region of an inner side of a thickness direction is adjusted by the nitrogen concentration such that the peak position is set to a boundary depth in a range of 10 to 70 μm from the wafer surface.

2. The method for manufacturing a high resistivity silicon wafer according to claim 1, wherein the method further comprises a heat treatment process for forming oxygen precipitate nuclei and/or a heat treatment process for forming oxygen precipitates, after the oxygen out-diffusion heat treatment process.

3. The method for manufacturing a high resistivity silicon wafer according to claim 2, wherein the heat treatment process for forming oxygen precipitate nuclei is performed at a processing temperature of 600 to 800° C. for a processing time of 1 to 20 hours and a heat treatment process for forming oxygen precipitates is performed at a processing temperature of 1000 to 1100° C. for a processing time of 1 to 20 hours.

4. The method for manufacturing a high resistivity silicon wafer according to claim 1, wherein the oxygen out-diffusion heat treatment process is performed at a processing temperature of 1100 to 1250° C. for a processing time of 1 to 5 hours in an atmosphere of argon gas, hydrogen gas or a mixed gas thereof.

5. The method for manufacturing a high resistivity silicon wafer according to claim 4, wherein, the oxygen out-diffusion heat treatment process is conducted such that the p/n type conversion region due to occurrence of thermal donors is generated at a depth so as not to be brought into contact with either any device active region or any depletion layer region formed in contact therewith when a heat treatment in a device fabrication process is performed.

6. A method for manufacturing a high resistivity silicon wafer where a p/n type conversion region is not generated and which includes a p-type region with variation in a resistivity distribution set to a range of 0 to 30% across all portions in a wafer thickness direction with respect to a reference value set to a range of 0.1 to 10 k Ωcm, the method comprising:

pulling a single crystal such that the single crystal has a p-type dopant concentration at which a wafer surface resistivity becomes in a range of 0.1 to 10 k Ωcm, an oxygen concentration Oi of $5.0 \times 10^{17}$ to $20 \times 10^{17}$ atoms/cm$^3$ (ASTM F-121, 1979), and a nitrogen concentration of $1.0 \times 10^{13}$ to $10 \times 10^{13}$ atoms/cm$^3$ (ASTM F-121, 1979) by using a Czochralski method;

processing the single crystal into wafers by slicing the single crystal;

subjecting the wafer to an oxygen out-diffusion heat treatment process in a non-oxidizing atmosphere; and subjecting the wafer to a heat treatment process for forming oxygen precipitate nuclei and/or a heat treatment process for forming oxygen precipitates.

7. A high resistivity silicon wafer which is a p-type wafer having a resistivity of 100 k Ωcm or more and having a denuded zone in a wafer surface, wherein the high resistivity silicon wafer is manufactured by the method according to claim 1 and is doped with nitrogen, and when a heat treatment in a device fabrication process is performed, a p/n type conversion region due to occurrence of thermal donors is generated at a depth so as not to be brought into contact with either any device active region or any depletion layer region formed in contact therewith, or the p/n type conversion region is not generated.

8. The high resistivity silicon wafer according to claim 7, wherein the p/n type conversion region is generated in a depth range of 10 μm to 70 μm from a wafer surface.

9. The high resistivity silicon wafer according to claim 7, wherein the p/n type conversion region includes oxygen precipitates.

10. The high resistivity silicon wafer according to claim 7, wherein an oxygen concentration in the wafer is $1.0 \times 10^{13}$ to $10 \times 10^{13}$ atoms/cm$^3$ (ASTM F-121, 1979).

11. A method for manufacturing a high resistivity silicon wafer, which has a sufficient resistivity for reducing current loss occurring in a device region in which a voltage controller is to be formed in a radio transmission/reception circuit using a high frequency of 10 GHz to 100 GHz and having a power of about 10 mW to 100 mW, and where a depth range of a p/n type conversion occurrence region from a wafer surface can be adjusted, the method comprising:

pulling a single crystal such that the single crystal has a p-type dopant concentration at which a wafer surface resistivity becomes in a range of 0.1 to 10 k Ωcm, an oxygen concentration Oi of $5.0 \times 10^{17}$ to $20 \times 10^{17}$ atoms/cm$^3$ (ASTM F-121, 1979), and a nitrogen concentration of $1.0 \times 10^{13}$ to $10 \times 10^{13}$ atoms/cm$^3$ (ASTM F-121, 1979) by using a Czochralski method;

processing the single crystal into wafers by slicing the single crystal; and subjecting the wafer to an oxygen out-diffusion heat treatment process in a non-oxidizing atmosphere, wherein a peak position of a resistivity serving as a boundary between a p-type region of a wafer surface side and a p/n conversion region of an inner side of a thickness direction is adjusted by the nitrogen concentration such that the peak position is set to a boundary depth in a range of 10 to 70 μm from a wafer surface.

12. The method for manufacturing a high resistivity silicon wafer according to claim 11, wherein the method further comprises a heat treatment process for forming oxygen precipitate nuclei and/or a heat treatment process for forming oxygen precipitates, after the oxygen out-diffusion heat treatment process.

13. The method for manufacturing a high resistivity silicon wafer according to claim 12, wherein the heat treatment process for forming oxygen precipitate nuclei is performed at a processing temperature of 600 to 800° C. for a processing time of 1 to 20 hours and a heat treatment process for forming oxygen precipitates is performed at a processing temperature of 1000 to 1100° C. for a processing time of 1 to 20 hours.

14. The method for manufacturing a high resistivity silicon wafer according to claim 11, wherein the oxygen out-diffusion heat treatment process is performed at a processing temperature of 1100 to 1250° C. for a processing time of 1 to 5 hours in an atmosphere of argon gas, hydrogen gas or a mixed gas thereof.

15. The method for manufacturing a high resistivity silicon wafer according to claim 14, wherein, the oxygen out-diffusion heat treatment process is conducted such that the p/n type conversion region due to occurrence of thermal donors is generated at a depth so as not to be brought into contact with either any device active region or any depletion layer region formed in contact therewith when a heat treatment in a device fabrication process is performed.

16. A method for manufacturing a high resistivity silicon wafer, which has a sufficient resistivity for reducing current loss occurring in a device region in which a voltage controller is to be formed in a radio transmission/reception circuit using a high frequency of 10 GHz to 100 GHz and having a power of about 10 mW to 100 mW, where a p/n type conversion region is not generated, and which includes a p-type region with variation in a resistivity distribution set to a range of 0 to 30% across all portions in a wafer thickness direction with respect to a reference value set to a range of 0.1 to 10 k Ωcm, the method comprising:
    pulling a single crystal such that the single crystal has a p-type dopant concentration at which a wafer surface resistivity becomes in a range of 0.1 to 10 k Ωcm, an oxygen concentration Oi of $5.0 \times 10^{17}$ to $20 \times 10^{17}$ atoms/cm$^3$ (ASTM F-121, 1979), and a nitrogen concentration of $1.0 \times 10^{13}$ to $10 \times 10^{13}$ atoms/cm$^3$ (ASTM F-121, 1979) by using a Czochralski method;
    processing the single crystal into wafers by slicing the single crystal;
    subjecting the wafer to an oxygen out-diffusion heat treatment process in a non-oxidizing atmosphere; and
    subjecting the wafer to a heat treatment process for forming oxygen precipitate nuclei and/or a heat treatment process for forming oxygen precipitates.

17. A high resistivity silicon wafer, which is a p-type wafer to be subjected to a device process for allowing a voltage controller in a radio transmission/reception circuit using a high frequency of 10 GHz to 100 GHz and having a power of about 10 mW to 100 mW to be formed on a surface, which has a resistivity of 100 Ωcm or more, and where a denuded zone is formed in a wafer surface,
    wherein the high resistivity silicon wafer is manufactured by the method according to claim 11 and is doped with nitrogen, and
    when a heat treatment in a device fabrication process is performed, a p/n type conversion region due to occurrence of thermal donors is generated at a depth so as not to be brought into contact with either any device active region or any depletion layer region formed in contact therewith, or the p/n type conversion region is not generated.

18. The high resistivity silicon wafer according to claim 17, wherein the p/n type conversion region is generated in a depth range of 10 μm to 70 μm from a wafer surface.

19. The high resistivity silicon wafer according to claim 17, wherein the p/n type conversion region includes oxygen precipitates.

20. The high resistivity silicon wafer according to claim 17, wherein an oxygen concentration in the wafer is $1.0 \times 10^{13}$ to $10 \times 10^{13}$ atoms/cm$^3$ (ASTM F-121, 1979).

* * * * *